(12) United States Patent
Yoshihara et al.

(10) Patent No.: US 9,568,829 B2
(45) Date of Patent: Feb. 14, 2017

(54) DEVELOPING METHOD, DEVELOPING APPARATUS AND STORAGE MEDIUM

(71) Applicant: TOKYO ELECTRON LIMITED, Tokyo (JP)

(72) Inventors: Kousuke Yoshihara, Koshi (JP); Hideharu Kyouda, Koshi (JP); Koshi Muta, Koshi (JP); Taro Yamamoto, Koshi (JP); Yasushi Takiguchi, Koshi (JP); Masahiro Fukuda, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 189 days.

(21) Appl. No.: 14/449,419

(22) Filed: Aug. 1, 2014

(65) Prior Publication Data

US 2015/0036109 A1    Feb. 5, 2015

(30) Foreign Application Priority Data

Aug. 5, 2013   (JP) .................................. 2013-162596
Jun. 13, 2014  (JP) .................................. 2014-122683

(51) Int. Cl.
*B05D 3/12*     (2006.01)
*G03F 7/30*     (2006.01)
(Continued)

(52) U.S. Cl.
CPC .............. *G03F 7/30* (2013.01); *G03F 7/3021* (2013.01); *B05C 5/02* (2013.01); *B05C 11/08* (2013.01);
(Continued)

(58) Field of Classification Search
CPC ......... B05D 1/005; B05D 1/26; G03F 7/3021; G03F 7/30; H01L 21/6715; B05C 5/02; B05C 11/08
(Continued)

(56) References Cited

U.S. PATENT DOCUMENTS 6,265,323 B1 *  7/2001  Nakamura .......... H01L 21/6715
                                                438/745
6,602,382 B1    8/2003  Matsuyama et al.
(Continued)

FOREIGN PATENT DOCUMENTS

JP       3614769 B2    1/2005
JP       4893799 B2    3/2012
JP    2012-074589 A1    4/2012

*Primary Examiner* — Kirsten Jolley
(74) *Attorney, Agent, or Firm* — Burr & Brown, PLLC

(57) ABSTRACT

A developing method includes: horizontally holding an exposed substrate by a substrate holder; forming a liquid puddle on a part of the substrate, by supplying a developer from a developer nozzle; rotating the substrate; spreading the liquid puddle on a whole surface of the substrate, by moving the developer nozzle such that a supply position of the developer on the rotating substrate is moved in a radial direction of the substrate; bringing, simultaneously with the spreading of the liquid puddle on the whole surface of the substrate, a contact part into contact with the liquid puddle, the contact part being configured to be moved together with the developer nozzle and having a surface opposed to the substrate which is smaller than the surface of the substrate. According to this method, an amount of liquid falling down to the outside of the substrate can be inhibited. In addition, since the rotating speed of the substrate can be decreased, spattering of the developer can be inhibited. Further, a throughput can be improved by stirring the developer.

14 Claims, 45 Drawing Sheets

(51) Int. Cl.
  *B05C 5/02*     (2006.01)
  *B05D 1/00*     (2006.01)
  *B05C 11/08*    (2006.01)
  *B05D 1/26*     (2006.01)
  *H01L 21/67*    (2006.01)

(52) U.S. Cl.
  CPC ............... *B05D 1/005* (2013.01); *B05D 1/26* (2013.01); *H01L 21/6715* (2013.01)

(58) Field of Classification Search
  USPC ............ 427/240, 425; 430/434; 118/52, 320
  See application file for complete search history.

(56) References Cited

U.S. PATENT DOCUMENTS

| | | | | |
|---|---|---|---|---|
| 6,869,234 | B2* | 3/2005 | Sanada | G03D 5/00 118/52 |
| 7,367,710 | B2* | 5/2008 | Shizukuishi | G03F 7/3021 118/323 |
| 7,470,638 | B2* | 12/2008 | Shirley | H01L 21/6715 118/52 |
| 2003/0118341 | A1* | 6/2003 | Sanada | H01L 21/6715 396/564 |
| 2008/0176172 | A1* | 7/2008 | Funakoshi | G03F 7/3021 430/313 |
| 2011/0096304 | A1 | 4/2011 | Takeguchi et al. | |
| 2012/0073609 | A1 | 3/2012 | Hashimoto et al. | |
| 2015/0151311 | A1* | 6/2015 | Jung | B05D 1/005 427/240 |

\* cited by examiner

DEVELOPING METHOD, DEVELOPING APPARATUS AND STORAGE MEDIUM

CROSS REFERENCE TO RELATED APPLICATIONS

This application is based upon and claims the benefit of priority from the prior Japanese Patent Application No. 2013-162596 filed on Aug. 5, 2013, and Japanese Patent Application No. 2014-122683 filed on Jun. 13, 2014 the entire contents of which are incorporated herein by reference.

FIELD OF THE INVENTION

The present invention relates to a developing method of an exposed substrate, a developing apparatus and a storage medium for use in the developing apparatus.

BACKGROUND ART

In a photolithographic step during manufacture of a semiconductor device, a developer is supplied to a substrate, on which a resist film has been formed and which has been exposed along a predetermined pattern, so as to form a resist pattern. The developing process is sometimes performed by a method in which a puddle of a developer is formed on the whole substrate by moving a nozzle having an elongate discharge opening from one end of the substrate to the other end thereof while discharging the developer from the discharge opening. Since the puddle is formed while the substrate is under a stationary state, this developing method is described as "stationary developing method" as a matter of convenience. Patent Document 1 describes an example of the stationary developing method. In addition, there is another developing method in which a nozzle is moved while a substrate is rotated so as to move a position at which a developer is supplied along a radius of the rotating substrate. A liquid film of the developer is formed on the substrate by the movement of the supply position of the developer and a centrifugal action, and the developer forming the liquid film flows. This developing method is described as "rotary developing method" as a matter of convenience. Patent Document 2 describes an example of the rotary developing method.

A circular semiconductor wafer (hereinafter described as "wafer") is used as a substrate, for example. A wafer size is tending to be larger and the use of a wafer of 450 mm in diameter is under review recently. When the stationary developing method is employed, a discharge opening of a nozzle should be configured to cover the diameter of a wafer, whereby the nozzle and thus a developing apparatus including the nozzle becomes larger. In addition, in this developing apparatus, among the developer which is discharged from the discharge opening, the developer discharged to the outside of a wafer is wasted. When a wafer is larger, an amount of the liquid to be wasted increases. Namely, a great amount of developer is used for processing one wafer. Further, when the developer is reacted with a resist, a concentration of the developer decreases so that a reactivity thereof lowers. Since a puddle is under a stationary state, the reacted developer remains on the same position in the puddle. Namely, it possibly takes relatively a long time for the stationary developing method to develop a wafer.

On the other hand, in the rotary developing method, a wafer is rotated while a developer is discharged. Due to the rotation of the wafer, the developer discharged onto the wafer may spatter, and the liquid spatters as particles may contaminate the wafer. When the diameter of a wafer is large, since an amount of liquid to be supplied to the wafer increases, the risk of liquid spattering rises. Patent Document 3 describes a technique in which a lower end of a nozzle is brought into contact with a process liquid supplied from the nozzle, and a liquid film is formed on the substrate by rotating the substrate. However, the technique of Patent Document 3 cannot solve the above problems.

PRIOR ART DOCUMENTS

Patent Documents

[Patent Document 1] JP3614769B
[Patent Document 2] JP4893799B
[Patent Document 3] JP2012-74589A

SUMMARY OF THE INVENTION

The present invention has been made in view of the above circumstances. The object of the present invention is to provide a technique that can inhibit, when an exposed substrate is developed, an amount of developer to be used and spattering of the developer from the substrate, and can also improve a throughput.

The developing method of the present invention is a developing method comprising:

horizontally holding an exposed substrate by a substrate holder;

forming a liquid puddle on a part of the substrate, by supplying a developer from a developer nozzle;

rotating the substrate;

spreading the liquid puddle on a whole surface of the substrate, by moving the developer nozzle such that a supply position of the developer on the rotating substrate is moved in a radial direction of the substrate;

bringing, simultaneously with the spreading of the liquid puddle on the whole surface of the substrate, a contact part into contact with the liquid puddle, the contact part being configured to be moved together with the developer nozzle and having a surface opposed to the substrate which is smaller than the surface of the substrate.

According to the present invention, the liquid puddle is formed on the substrate, and the liquid puddle is speared out on the whole surface of the substrate, by moving the developer nozzle in the radial direction of the rotating substrate. Simultaneously with the spreading of the liquid puddle, the contact part in contact with the liquid puddle is moved together with the developer nozzle. Thus, an excessive developer is supplied to the outside of the substrate can be inhibited, and an amount of the developer to be used can be inhibited. Since it is not necessary to increase the rotating speed of the substrate during the supply of the developer, spattering of the developer can be inhibited. In addition, since the developer on the rotating substrate is stirred by the surface tension of the contact part, non-uniformity of the concentration of the developer in an area in contact with the contact part can be inhibited. Thus, a reaction between the developer and a resist on the substrate can be prevented from being weakened, whereby lowering of a throughput can be inhibited.

DETAILED DESCRIPTION OF THE INVENTION

First Embodiment

Figure 1:
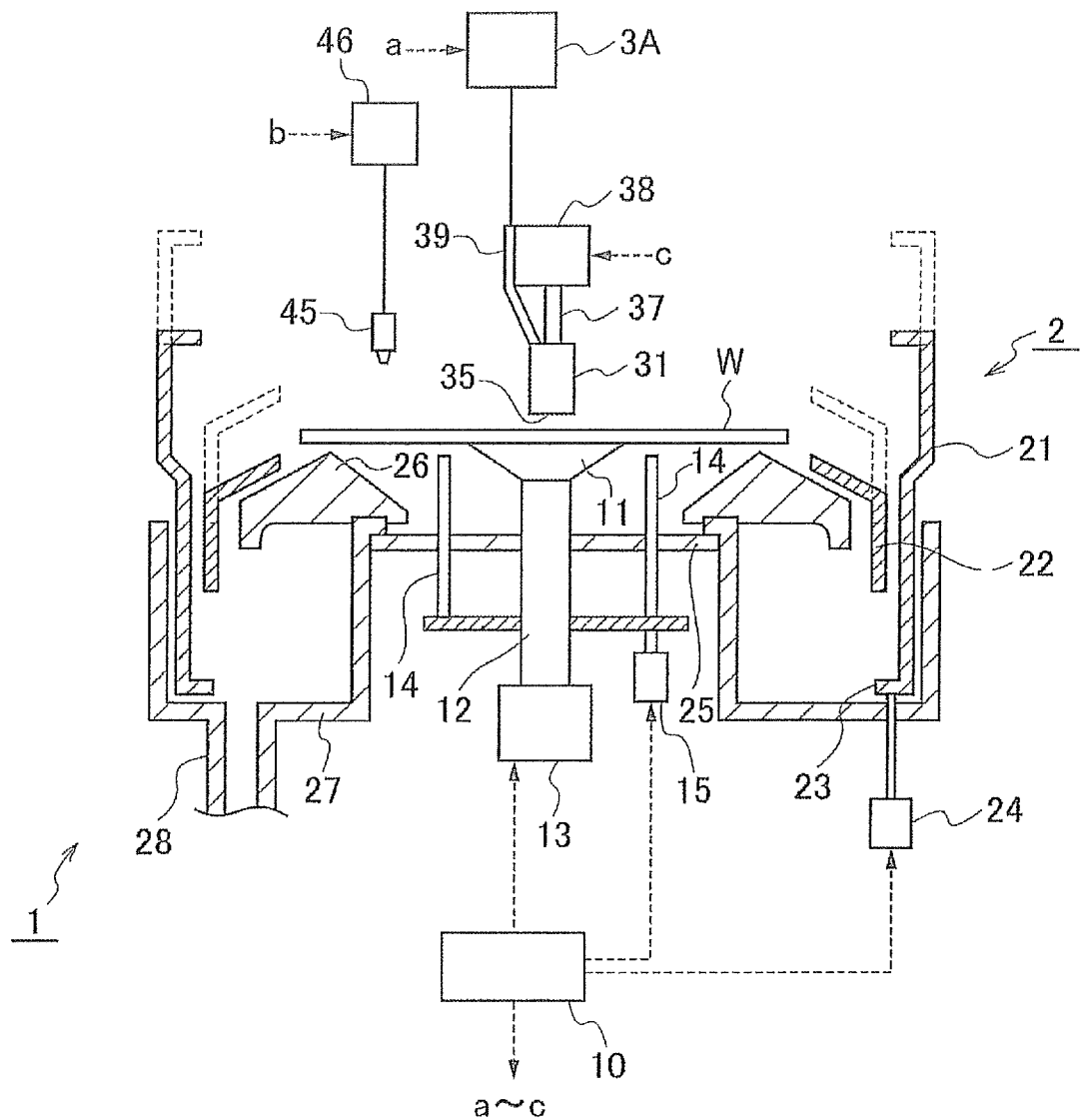
FIG. 1 is a longitudinal sectional view of a developing apparatus according to an embodiment of the present invention.
Figure 2:
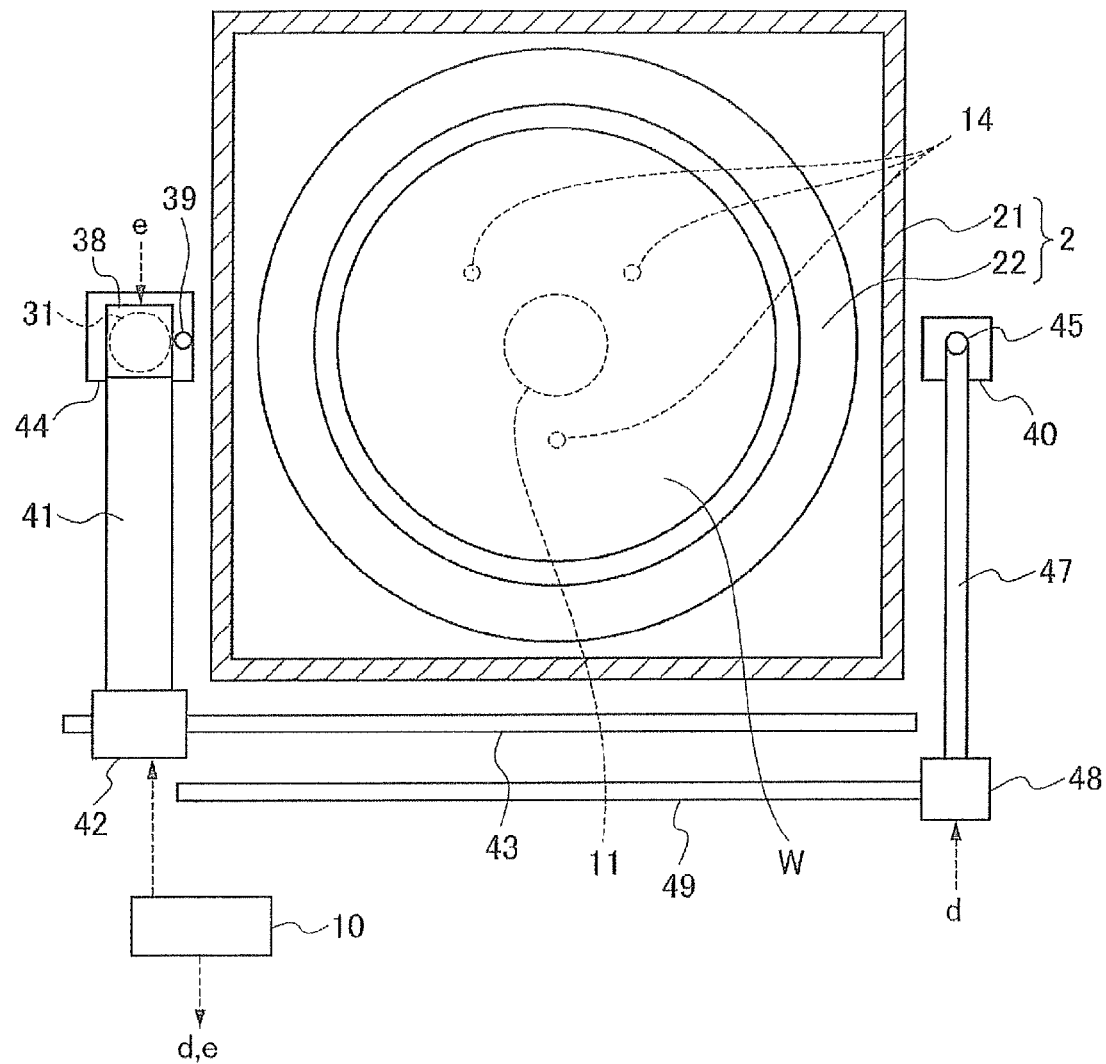
FIG. 2 is a plan view of the developing apparatus.

FIGS. 1 and 2 show a developing apparatus 1 according to a first embodiment of the present invention. A wafer W having a resist film formed on a surface thereof is transferred to the developing apparatus 1 and is processed therein. The resist film has been exposed along a predetermined pattern. The developing apparatus 1 includes a spin chuck 11 serving as a substrate holding unit. The spin chuck 11 is configured to absorb (suck) a central portion of a rear surface of the wafer W such that the wafer W is horizontally held. The spin chuck 11 is connected to a rotating and driving unit 13 disposed below through a rotating shaft 12.

The developing apparatus 1 is provided with a cup body 2 which surrounds the wafer W held by the spin chuck 11. The cup body 2 is composed of an outer cup 21 and an inner cup 22. An upper side of the cup body 2 is opened. An upper part of the outer cup body 21 has a rectangular shape, while a lower part thereof has a cylindrical shape. The reference number 23 depicts a stepped part formed on a lower part of the outer cup 21, and 24 depicts an elevation unit connected to the stepped part 23. The inner cup 21 has a cylindrical shape, and an upper part thereof inclines inward. When the stepped part 23 is brought into contact with a lower end surface of the inner cup 22 during elevation of the outer cup 21, the inner cup 22 is moved upward. When a developer is removed from the wafer W, the cup body 2 is elevated as shown by the dotted lines, so as to receive the liquid scattering from the wafer W.

A circular plate 25 is disposed below the wafer W held by the spin chuck 11. A guide member 26 having a chevron longitudinal sectional shape is disposed like a ring outside the circular plate 25. The guide member 26 is configured to guide a developer and a cleaning liquid coming down from the wafer W to a liquid receiving part 27 disposed outside the circular plate 25. The liquid receiving part 27 is an annular recessed part. The reference number 28 depicts a drain pipe, which is connected to the liquid receiving part 27. The drain pipe 28 is connected to a drain tank (not shown). A vapor-liquid separator (not shown) is disposed on the drain pipe 28, so that vapor to be exhausted and liquid to be drained are separated from each other. The reference number 15 depicts an elevation mechanism for moving a pin 14 upward or downward. By the upward and downward movement of the pin 14, the wafer W can be transferred between a substrate transfer mechanism, not shown, and the spin chuck 11.

Figure 3:
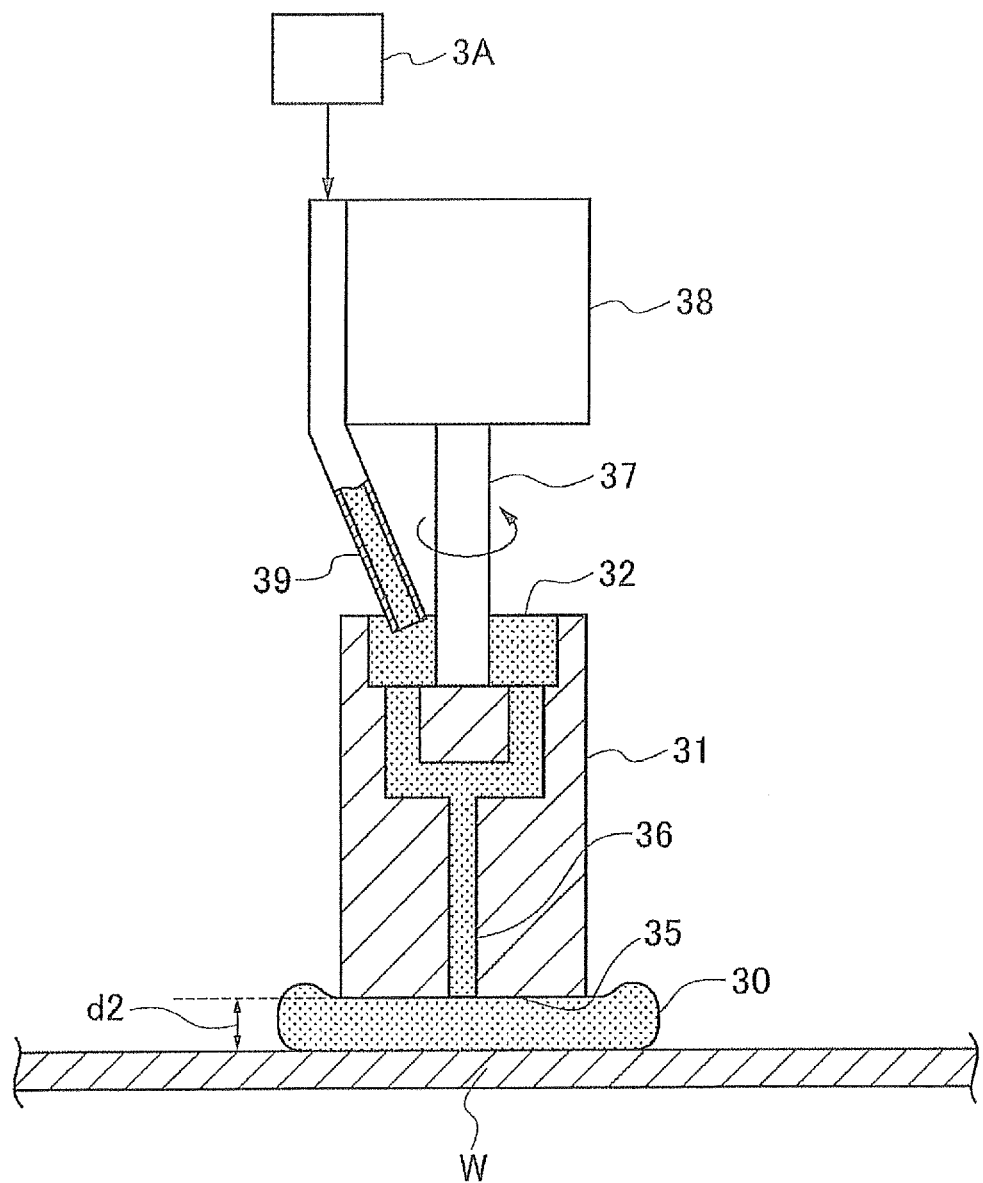
FIG. 3 is a longitudinal side view of a developer nozzle disposed on the developing apparatus.
Figure 4:
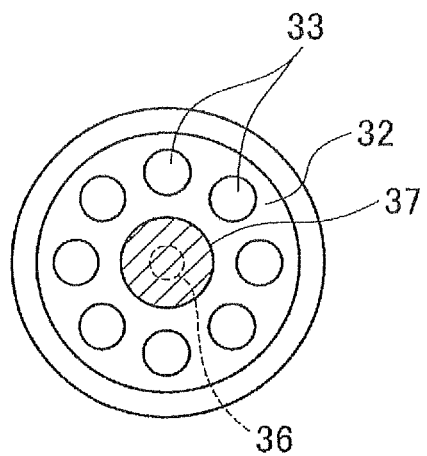
FIG. 4 is a top view of the nozzle.
Figure 5:
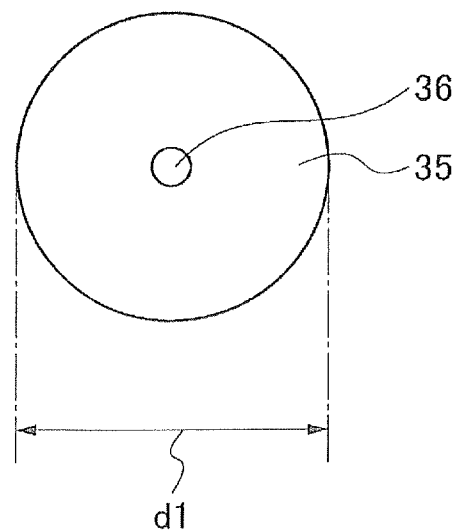
FIG. 5 is a bottom view of the nozzle.

The developing apparatus 1 includes a developer nozzle 31. The developer nozzle 31 has a function for supplying a developer to the wafer W so as to form a liquid puddle thereon, and a function for generating a turning flow in the liquid puddle. Namely, the developer nozzle 31 has not only a function as a nozzle but also has a function as a turning-flow generating mechanism. FIG. 3 is a longitudinal sectional view of the developer nozzle 31. FIGS. 4 and 5 are a top view and a bottom view of the developer nozzle 31, respectively. The developer nozzle 31 has a columnar shape that is elongate in an up and down direction. A recessed part 32 is formed in a top surface thereof. In a bottom surface of the recessed part 32, a plurality of apertures 33 are opened about a center axis of the developer nozzle 31. Each aperture 33 is connected to a discharge opening 36 that is opened perpendicularly to a central part of a bottom surface 35 of the developer nozzle 31.

The bottom surface 35 is circular, and is formed to be in parallel with the wafer W placed on the spin chuck 11. The discharge opening 36 is opened in a central axis of the developer nozzle 31, i.e., in a central portion of the bottom surface 35. A diameter d1 of the bottom surface 35 is smaller than a diameter of the wafer W. The diameter of the wafer W is, for example, 450 mm, but a wafer W having a smaller diameter may be used. When the diameter of the wafer W is larger, it can be expected that the aforementioned problems such as an amount of the developer to be consumed, a liquid spattering and a throughput can be greatly improved. A resin is used for a material of the developer nozzle 31, for example, in order to stir the developer by a surface tension, which will be described below. As the resin, PFA (tetrafluoroethylene perfluoroalkyl vinylether copolymer) or PTFE (polytetrafluoroethylene) is used, for example.

A shaft 37 extends vertically upward from a bottom surface of the recessed part 32 along the central axis of the developer nozzle 31. An upper end of the shaft 37 is connected to a rotating mechanism 38. The rotating mechanism 38 allows the developer nozzle 31 to rotate about the central axis. Namely, the developer nozzle 31 rotates along a circumference of the discharge opening 36. A downstream end of a developer supply pipe 39 is opened to the recessed part 32, so that a developer supplied from the developer supply pipe 39 to the recessed part 32 is discharged onto the wafer W from the discharge opening 36. The downstream end of the developer supply pipe 39 is fixed onto the rotating mechanism 38. The reference number 3A depicts a developer supply source, which is connected to an upstream end of the developer supply pipe 39. The developer supply source 3A has a pump, a valve and so on, and is configured to supply a developer to the developer nozzle 31 in accordance with a control signal from a below-described control unit 10.

As shown in FIG. 3, when the wafer W is subjected to the developing process, the bottom surface 35 of the developer nozzle 31 comes close to the wafer W and is opposed thereto. At this time, a distance d2 between the surface of the wafer W and the bottom surface 35 of the developer nozzle 31 is, for example, 0.5 mm to 2 mm. Since a developer is discharged onto the wafer W from the discharge opening 36, with the bottom surface 35 being close to the wafer W, a liquid puddle 30 is formed below the developer nozzle 31 in such a manner that the liquid puddle 30 is in contact with the bottom surface 35.

Figure 6:
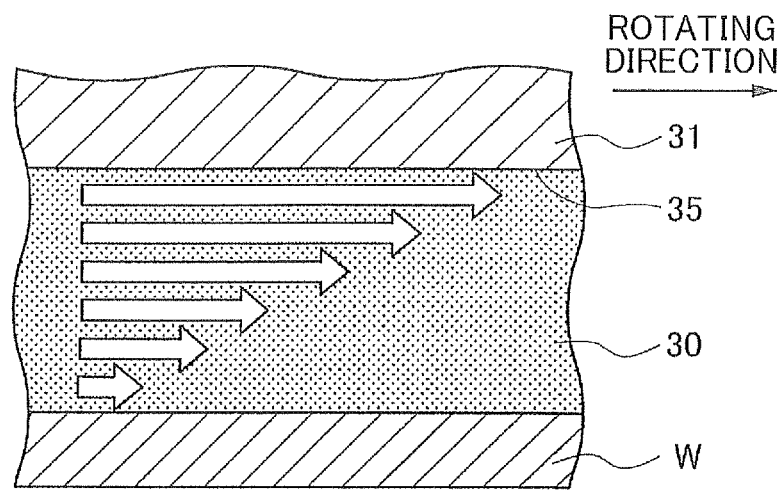
FIG. 6 is a schematic view of a liquid puddle of a lower part of the nozzle.
Figure 7:
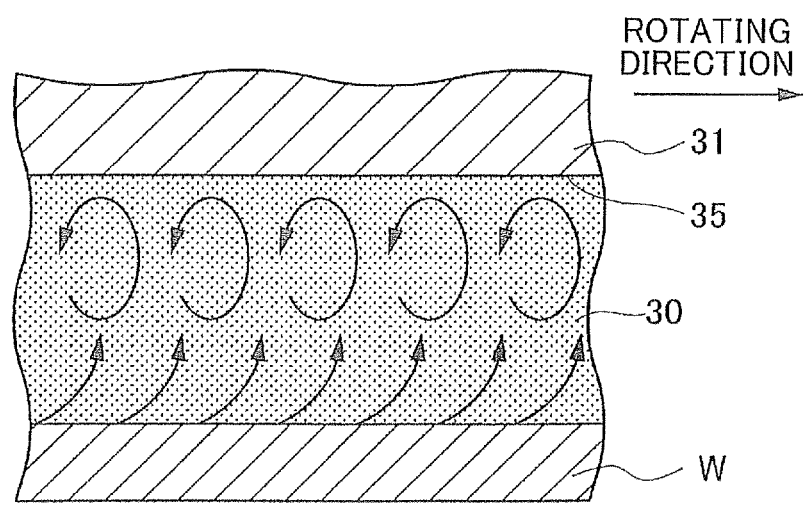
FIG. 7 is a schematic view of the liquid puddle of the lower part of the nozzle.
Figure 8:
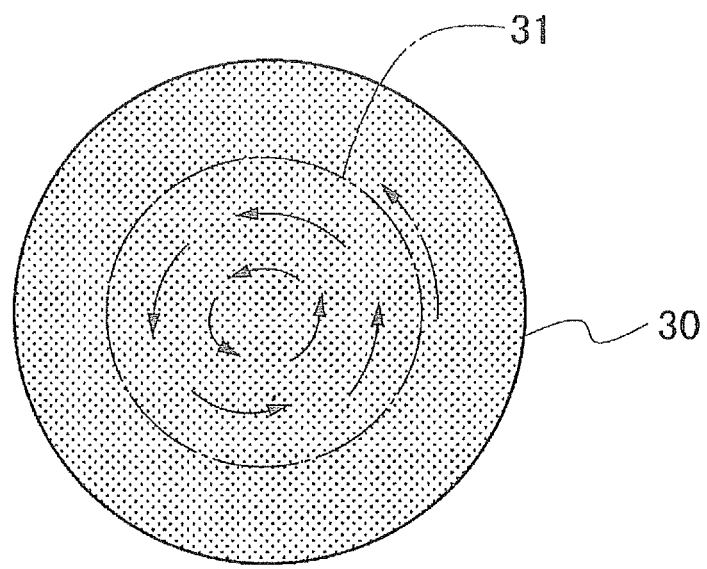
FIG. 8 is a plan view of the liquid puddle.

Under the state in which the liquid puddle 30 is formed, the developer nozzle 31 is rotated about the central axis by the rotating mechanism 38. FIGS. 6 and 7 are side views showing a condition of the liquid puddle 30 when the developer nozzle 31 is rotated. A surface tension acts between the formed liquid puddle 30 and the bottom surface 35 of the developer nozzle 31, so that the liquid puddle 30 and the bottom surface 35 pull against each other. When the developer nozzle 31 is rotated, an action for rotating the liquid puddle 30 is applied to the liquid puddle 30 by the surface tension. Thus, as shown by the arrow in FIG. 6, a liquid flow along the rotating direction of the developer nozzle 31, i.e., a turning flow is generated. FIG. 8 shows the turning flow seen from above. In FIG. 8, the rotating direction of the developer nozzle 31 is shown by the dotted line arrow, and the direction in which the developer flows in the liquid puddle 30 is shown by the solid line arrows.

As shown by the arrows in FIG. 7, since the turning flow is generated so that the developer is stirred below the developer nozzle 31, uniformity in concentration of the developer becomes higher. Namely, even though the resist and the developer react each other on the surface of the wafer W so that the concentration of the developer on the surface of the wafer W lowers, the developer of a lower concentration draws apart from the surface of the wafer W because the developer is stirred. Thus, a developer of a higher concentration, which does not react with the resist, is supplied to the surface of the wafer W. As a result, the reaction between the developer and the resist is promoted. In addition, on an area in the plane of the wafer W, which is located below the bottom surface 35 of the developer nozzle 31, since the concentration uniformity of the developer is high, the reaction between the resist and the developer proceeds uniformly. That is to say, CD uniformity in the resist pattern is improved.

In the developing apparatus 1, the developer nozzle 31 is horizontally moved as described below, in order that the liquid puddle 30 is spread out from the central portion of the wafer W to the peripheral portion thereof. Simultaneously with the horizontal movement, the wafer W is rotated. Thus, the bottom surface 35 of the developer nozzle 31 is caused to pass through the whole surface of the wafer W, so as to stir the developer on the whole surface of the wafer W. The diameter d1 of the bottom surface 35 of the developer nozzle 31, a rotating speed of the wafer W, a horizontal movement speed of the developer nozzle 31 are set such that the bottom surface 35 of the developer nozzle 31 can pass through the surface of the wafer W as a whole. The horizontal movement speed of the developer nozzle 31 is 10 mm/second to 100 mm/second, for example. The diameter d1 of the bottom surface 35 is 50 mm to 200 mm, for example. The rotating speed of the wafer W is preferably not more than 100 rpm and more preferably 10 rpm to 50 rpm, in order to prevent liquid spattering upon discharge of the developer onto the wafer W. In addition, in order to sufficiently stir the developer, the rotating speed of the developer nozzle 31 is 50 rpm to 1000 rpm, for example.

Returning to FIG. 2, the developing apparatus 1 is explained. The rotating mechanism 38 is fixed on a distal end of an arm 41, and a proximal end of the arm 41 is connected to a moving mechanism 42. The arm 41 is moved upward and downward by the moving mechanism 42. In addition, the moving mechanism 42 is moved along a horizontally extending guide rail 43, so as to be capable of moving the developer nozzle 31 along the radius of the wafer W held by the spin chuck 11. The reference number 44 depicts a waiting area of the developer nozzle 31, which is located outside the cup body 2.

In FIGS. 1 and 2, the reference number 45 depicts a cleaning liquid nozzle, which is configured to supply a cleaning liquid (deionized water) to the wafer W so as to clean the wafer W. In FIG. 1, the reference number 46 depicts a cleaning-liquid supply source, which has a pump, a valve and so on, and is configured to supply the cleaning liquid in accordance with a control signal from the control unit 10. In FIG. 2, the reference number 47 depicts an arm for supporting the cleaning liquid nozzle 45. The reference number 48 depicts a moving mechanism, which moves the arm 47 upward and downward, and is laterally moved along a guide rail 49. The reference number 40 depicts a waiting area of the cleaning liquid nozzle 45, which is located outside the cup body 2.

The developing apparatus 1 is provided with the control unit 10 formed of a computer. The control unit 10 includes a program storing unit, not shown. The program storing unit stores a program as a software, for example, including instructions for carrying out a developing process which is described below. When the program is read out by the control unit 10, the control unit 10 outputs a control signal to each unit of the developing apparatus 1. Thus, the respective operations, such as the movement of the developer nozzle 31 by the moving mechanism 42, the movement of the cleaning liquid nozzle 45 by the moving mechanism 48, the rotation of the developer nozzle 31 by the rotating mechanism 38, the supply of the developer to the developer nozzle 31 by the developer supply source 3A, the supply of the cleaning liquid to the cleaning liquid nozzle 45 by the cleaning-liquid supply source 46, the rotation of the wafer W by the spin chuck 11, the upward and downward movement of the pin 14, are controlled, whereby the wafer W can be subjected to the developing process and the cleaning process, as described below. The program is stored in the program storing unit, under a state in which the program is stored in a storage medium such as a hard disc, a compact disc, a magnet optical disc, or a memory card.

Figure 14:
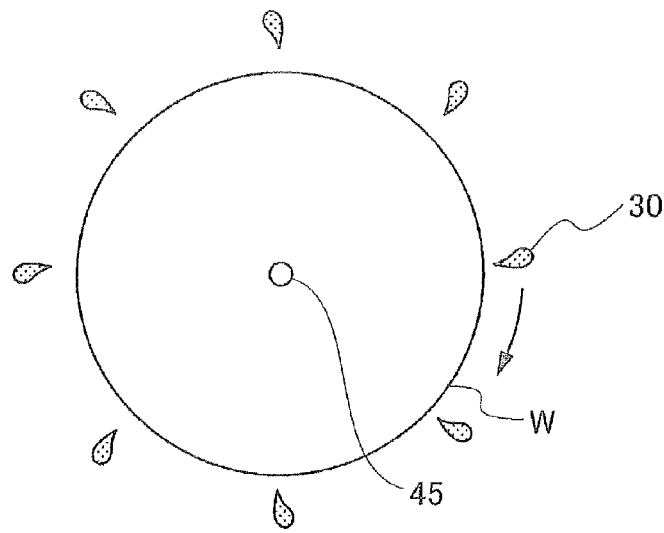
FIG. 14 is a step view of the first embodiment according to the developing apparatus.
Figure 15:
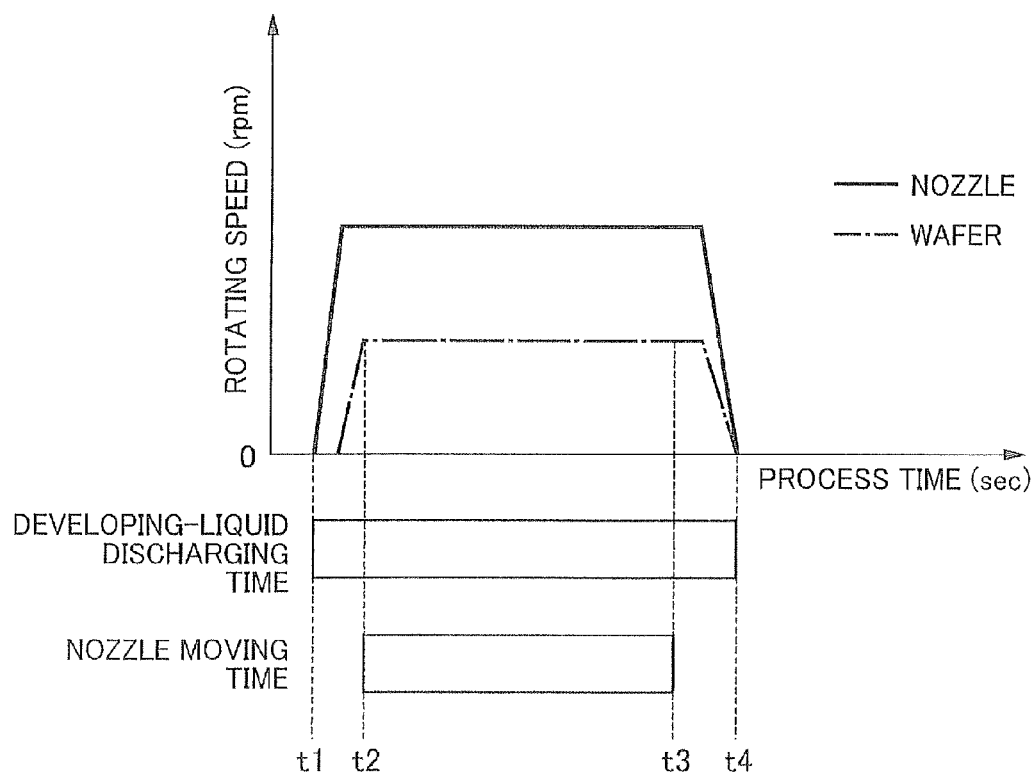
FIG. 15 is a time chart of the steps.

The procedure of the developing process and the procedure of the cleaning process performed by using the developing apparatus 1 are explained with reference to operational views of the developing apparatus 1 shown in FIGS. 9 to 14. In addition, a time chart in FIG. 15 is suitably referred to. This time chart shows a relationship between a time (process time) elapsed from the start of the developing process, and a rotating speed of the developer nozzle 31 and a rotating speed of the wafer W. The solid line graph shows the rotating speed of the developer nozzle 31 and the one-dot chain line graph shows the rotating speed of the wafer W, respectively. In this time chart, a period in which the developer is discharged from the developer nozzle 31, and a period in which the developer nozzle 31 is moved during the discharge of the developer are shown by bars, respectively.

Figure 9:
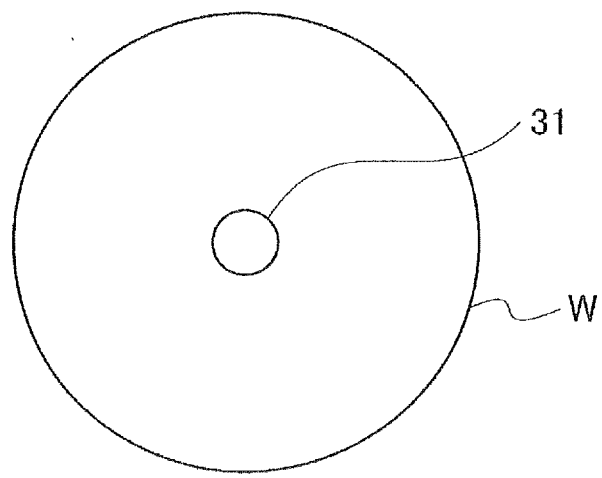
FIG. 9 is a step view of a first embodiment according to the developing apparatus.
Figure 10:
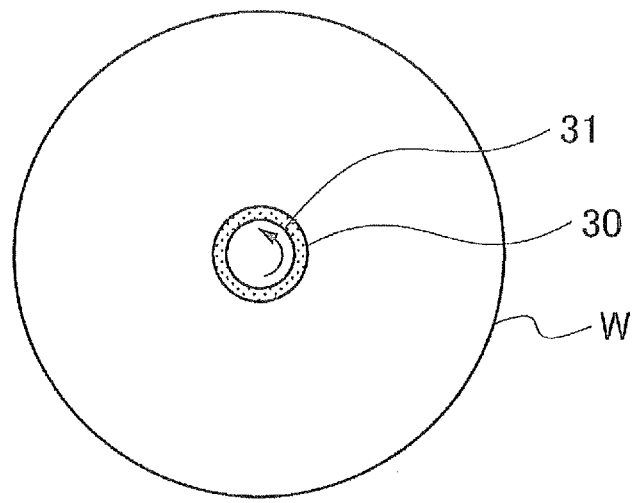
FIG. 10 is a step view of the first embodiment according to the developing apparatus.

Firstly, a wafer W is transferred to the developing apparatus 1 by the substrate transfer mechanism, not shown, and is held by the spin chuck 11. Then, the developer nozzle 31 is moved from the waiting area 44 to a position above the central portion of the wafer W, and is moved downward such that the bottom surface 35 comes close to the wafer W, which is described with reference to FIG. 3 (FIG. 9). Following thereto, a developer is supplied from the developer nozzle 31 to the wafer W, and the developer nozzle 31 is rotated counterclockwise in plan view (time instant t1 in the chart of FIG. 15). Thus, the liquid puddle 30 larger than the bottom surface 35 is formed between the bottom surface 35 of the developer nozzle 31 and the wafer W so as to be in contact with the bottom surface 35. Then, a turning flow is generated in the liquid puddle 30, which is described with reference to FIGS. 6 to 8, whereby the developer below the bottom surface 35 is stirred (FIG. 10).

Figure 11:
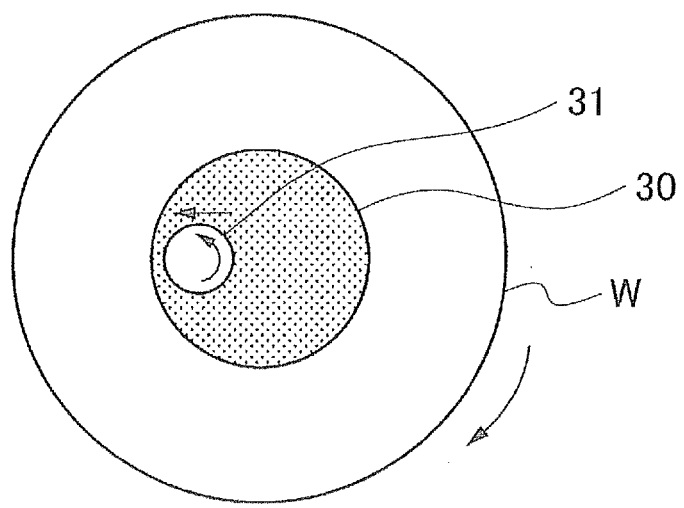
FIG. 11 is a step view of the first embodiment according to the developing apparatus.

When the rotating speed of the developer nozzle 31 increases to reach a predetermined one, the developer nozzle 31 is continuously rotated at the predetermined rotating speed. After that, the wafer W is rotated clockwise in plan view, while a rotating speed thereof increases. When the rotating speed of the wafer W reaches 10 rpm, for example, the wafer W is continuously rotated at the rotating speed of 10 rpm, and the developer nozzle 31 starts to move at 10 mm/second, for example, toward the peripheral portion of the wafer W along the surface of the wafer W on the radius thereof (time instance t2). Thus, the liquid puddle 30 is spread out toward the peripheral portion of the wafer W, while the liquid puddle 30 is in contact with the bottom surface 35 of the developer nozzle 31 (FIG. 11). The developer nozzle 31 may be rotated clockwise in plan view. Note that, however, in the example shown in FIGS. 10 and 11, since the wafer W and the developer nozzle 31 are rotated in the opposite directions, the force acting on the developer increases below the developer nozzle 31, whereby the developer can be more reliably stirred, resulting in improved concentration uniformity of the developer.

The developer nozzle 31 is rotated and moved above the wafer W, such that the developer nozzle 31 does not pass by the spreading liquid puddle 30. The reason why the developer nozzle 31 does not pass by the liquid puddle 30 is, if the developer nozzle 31 passes by the liquid puddle 30, a plurality of liquid puddles 30 are formed on the surface of the wafer W. Namely, the developer puddle is divided into the plurality of liquid puddles 30 on the surface of the wafer W. Then, the respective liquid puddles 30 are independently spread out on the surface of the wafer W, and interfaces of these liquid puddles 30 merge together. This may exert an influence on a CD of the resist pattern at this location, whereby the CD of the resist pattern may differ from a CD of another resist pattern. That is to say, CDU (Critical Dimension Uniformity) of the resist pattern in the plane of the wafer may be degraded. For this reason, the moving speed of the developer nozzle 31 is set such that the developer nozzle 31 does not pass by the liquid puddle 30.

Figure 12:
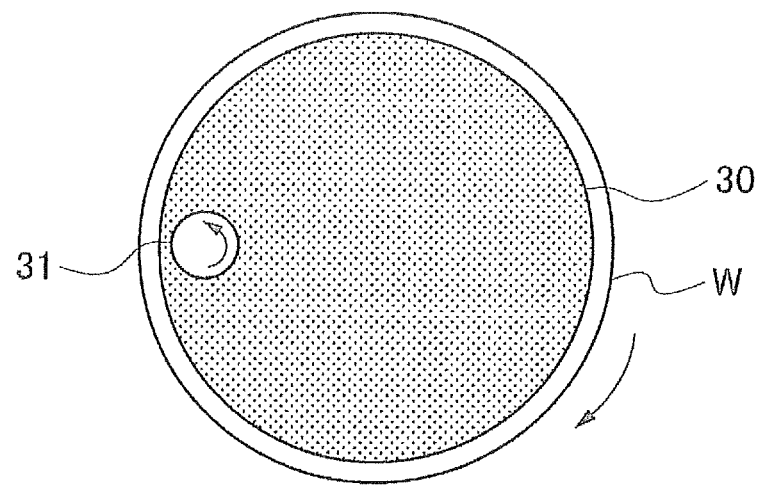
FIG. 12 is a step view of the first embodiment according to the developing apparatus.
Figure 13:
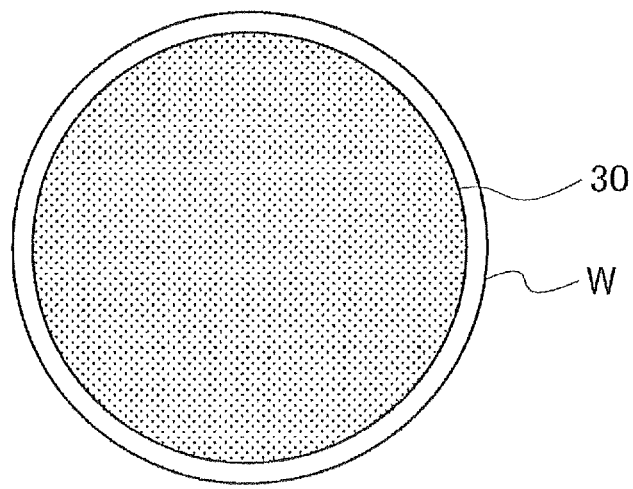
FIG. 13 is a step view of the first embodiment according to the developing apparatus.

Below the liquid puddle 30 that is spread out toward the peripheral portion of the wafer W, the reaction between the resist film on the surface of the wafer W and the developer forming the liquid puddle 30 proceeds. As described above, the developer of the liquid puddle 30 below the developer nozzle 31 is stirred by the turning flow, the concentration of the developer is made uniform. When the developer nozzle 31 is moved to a position above the peripheral portion of the wafer W so that the whole surface of the wafer W is covered by the developer, the movement of the developer nozzle 31 is stopped (time instance t3, FIG. 12). The whole surface of the wafer W means a whole area in which the resist pattern is formed. For example, when a wafer W does not have the resist-pattern formation area at a peripheral portion of the wafer W, it is not necessary to form a liquid puddle of the developer at the peripheral portion of the wafer W. Although FIG. 12 shows an example in which the liquid puddle 30 is formed slightly inside the peripheral end of the wafer W, the wafer W may be coated with the liquid puddle 30 up to the peripheral end thereof.

Figure 16:
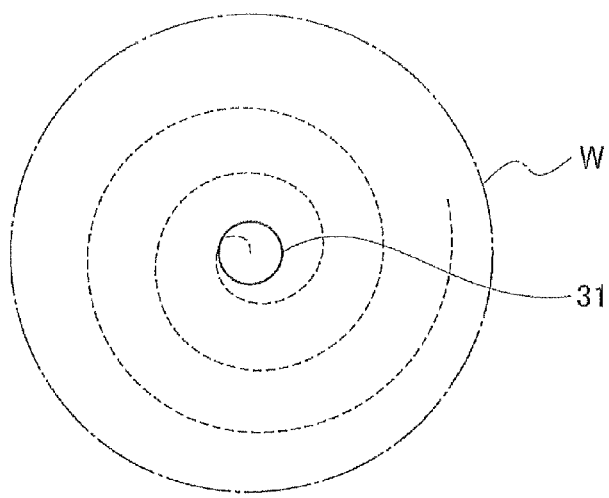
FIG. 16 is a view for explaining a moving route of the developer nozzle on a wafer.

No later than formation of the liquid puddle 30 on the whole surface of the wafer W, the developer nozzle 31 passes through the whole surface of the wafer W so as to stir the developer. FIG. 16 shows a route of the developer nozzle 31 seen from the surface of the wafer W. The dotted lines in FIG. 16 show a trajectory of the discharge opening 36 of the developer nozzle 31. After the movement of the developer nozzle 31 stops, the rotating speed of the developer nozzle 31 and the rotating speed of the wafer W decrease, and then their rotation stops (time instant t4). For example, simultaneously with the stop of rotation of the developer nozzle 31, the supply of the developer from the developer nozzle 31 stops, and the developer nozzle 31 returns to the waiting area 44.

After the reaction between the resist film and the developer further proceeds on the whole surface of the wafer W because of the stationary liquid puddle 30 on the wafer W (FIG. 13), the cleaning liquid nozzle 45 is positioned above the central portion of the wafer W and the wafer W is rotated at a predetermined rotating speed. A cleaning liquid is discharged onto the central portion of the wafer W. Then, the cleaning liquid is spread out toward the peripheral portion of the wafer W by the centrifugal force, so that the liquid puddle 30 of the developer is removed from the wafer W (FIG. 14). After the discharge of the cleaning liquid stops, the wafer W is continuously rotated so that the cleaning liquid is spun off from the wafer W, and the wafer W is dried. Thereafter, the wafer W is unloaded from the developing apparatus 1 by the substrate transfer mechanism, not shown.

According to the developing apparatus 1, the developer is discharged from the developer nozzle 31 toward the central portion of the wafer W such that the liquid paddle 30 of the developer is formed to be in contact with the developer nozzle 31, and a turning flow is generated in the liquid puddle 30 by rotating the developer nozzle 31. Then, while the rotation of the developer nozzle 31 and the discharge of the developer are continued, the liquid puddle 30 of the developer is spread out on the whole surface of the wafer W by moving the developer nozzle 31 toward the peripheral portion of the wafer W and by rotating the wafer W. After the developer nozzle 31 is moved to a position above the peripheral portion of the wafer W, the supply of the developer is stopped, whereby an amount of the developer falling down to the outside of the wafer W can be inhibited. Thus, an amount of the developer to be consumed can be inhibited. In addition, since it is not necessary to spread the developer on the surface of the wafer W by the centrifugal force of the wafer W, the rotating speed of the wafer W can be low. Thus, the discharged developer can be prevented from spattering by the rotation of the wafer W, which makes it possible to prevent that the liquid spatters as particles contaminate the wafer W. In addition, since the developer below the developer nozzle 31 is stirred by the rotation of the developer nozzle 31, the unreacted resist and the unreacted developer come easily into contact with each other to promote reaction of the resist, which improves a throughput.

In the stationary developing method which has been described in the "Background Art" column, after the formation of the puddle of the developer on the wafer W, there is a possibility that each portion of the puddle might fluctuate because of an environmental parameter. In this case, the CD varies in the plane of the wafer W. In the rotary developing method, since the developer is stirred on the surface of the wafer W by the rotation of the wafer W, the CD variation caused by the fluctuation can be inhibited. However, in the rotary developing method, the developer is supplied along the radial direction of the wafer W, the developer flows along a position distant from the position at which the developer has been supplied to the wafer W, and the flowing developer comes into contact with the resist so that the concentration of the developer varies. Namely, there is a possibility that a CD distribution might differ in the liquid flow direction of the developer. However, according to the developing apparatus 1, a turning flow is locally generated below the developer nozzle 31 so as to stir the developer, and the rotation of the wafer W and the movement of the developer nozzle 31 are carried out such that the developer nozzle 31 passes through the whole surface of the wafer W. Thus, unlike the rotary developing method, the reaction between the resist and the developer can occur highly uniformly in the plane of the wafer W, without any variation in concentration of the developer in the plane of the wafer W, which might be caused by the flow of the developer. That is to say, according to the developing method of the developing apparatus 1, the CD uniformity (CDU) in the plane of the wafer W can be more enhanced as compared with the stationary developing method and the rotary developing method.

In addition, suppose that a resist film whose contact angle against water is relatively high is formed on a wafer W, and the resist is exposed by immersion exposure. Namely, an unexposed portion, which has still the high contact angle, is subjected to the developing process. When this wafer W is developed by the stationary developing method, the developing process proceeds while the contact angle of the unexposed portion remains high. Thus, when the cleaning liquid (deionized water) is supplied after the developing process, there is a possibility that the cleaning liquid might be repelled and divided because of the water repellency of the unexposed portion. However, according to the developing apparatus 1, during the spreading of the liquid puddle 30 toward the peripheral portion of the wafer W, the developer is stirred, whereby a product dissolved in the resist is spread out over the unexposed portion. When the unexposed portion comes into contact with the dissolved product, the unexposed portion is made hydrophilic. Thus, since division of the cleaning liquid on the unexposed portion can be inhibited, a defective development can be inhibited. In addition, since the developer is stirred, the dissolved product is fused in the developer. Thus, it can be inhibited that the dissolved product remains as a residue on the resist pattern to invite a defective development as a pattern opening failure.

In addition, according to the aforementioned developing method by the developing apparatus 1, by adjusting the rotating speed of the developer nozzle 31 and/or the moving speed of the developer nozzle 31 at respective positions of the developer nozzle 31 above the wafer W, the CD distribution in the plane of the wafer W can be adjusted. Since the CD distribution can be adjusted by a few parameters, only a short time is required for the adjustment of the developing apparatus 1 in order to improve the CD uniformity in the plane of the wafer W.

Figure 17:
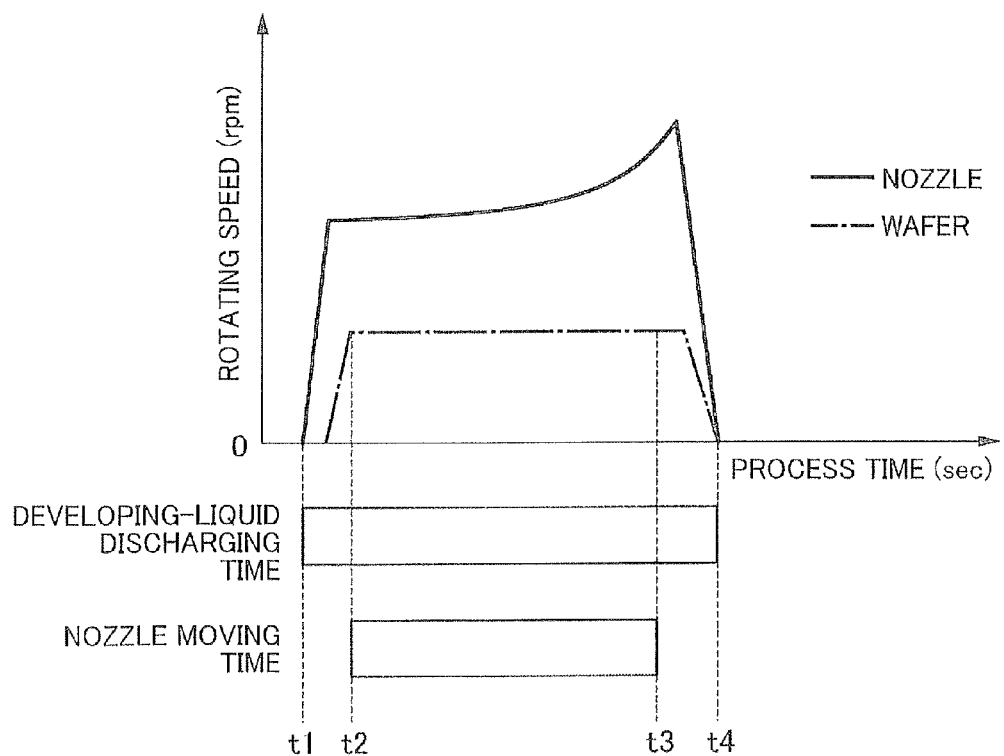
FIG. 17 is a time chart of a modification example of the steps.

The developing process as a modification example of the first embodiment is explained. FIG. 17 shows a time chart of this modification example, which differs from the time chart explained with reference to FIG. 15 in control of the rotating speed of the developer nozzle 31. In this modification example, as the developer nozzle 31 moves from the central portion of the wafer W toward the peripheral portion thereof, the rotating speed of the developer nozzle 31 gradually increases. After the developer nozzle 31 reaches a position above the peripheral portion, the rotating speed continues to increase for a predetermined period of time. After that, the rotating speed decreases so that the rotation of the developer nozzle 31 stops. Other than this difference, the operations of the respective units are controlled similarly to the first embodiment.

Since the liquid puddle 30 is spread out from the central portion toward the peripheral portion, the time in which a portion of the wafer W is in contact with the developer becomes shorter as the portion comes near to the peripheral end of the wafer W. Thus, in this modification example, the developer nozzle 31 is controlled such that the rotating speed thereof increases as it approaches the peripheral portion. Thus, the stirring of the developer is promoted so that the reaction between the developer and the resist is promoted. Namely, by adjusting the rotating speed as described above, the CD uniformity in the plane of the wafer W can be more enhanced.

Although the wafer W is rotated in the first embodiment, in order to spread the liquid puddle 30 from the central portion of the wafer W toward the peripheral portion thereof, such a rotation may not be performed. For example, the bottom surface 35 of the developer nozzle 31 is formed to be the same or larger than the wafer W, and the bottom surface 35 is brought close to the wafer W. The discharge opening 36 of the bottom surface 35 is located above the central portion of the wafer W. Then, the developer is supplied from the developer nozzle 31 and the developer nozzle 31 is rotated. The developer nozzle 31 is not moved laterally. Thus, while a turning flow is formed, the liquid puddle 30 is spread out from the central portion of the wafer W toward the peripheral portion thereof, so that the developer is stirred over the whole surface of the wafer W. When the developer nozzle 31 is rotated, a liquid flow is generated along a liquid flow below the bottom surface 35 in an area slightly outside the bottom surface 35 so that a turning flow is generated. Thus, when a turning flow is formed without rotating the wafer W and laterally moving the developer nozzle 31, the size of the bottom surface 35 of the developer nozzle 31 may be formed to be slightly smaller than the size of the surface of the wafer W.

Not limited to a circular substrate, a square substrate may be processed by the developing apparatus 1. In the above example, the liquid puddle of the developer is formed on the wafer W. However, not limited to the developer as a process liquid to be supplied to the wafer W, the cleaning liquid may be supplied to form a liquid puddle on the wafer W, similar to the developer, so as to clean the wafer W.

In the first embodiment, in place of moving the developer nozzle 31 from a position above the central portion of the wafer W to a position above the peripheral portion thereof, the developer nozzle 31 may be moved from a position above the peripheral portion to a position above the central portion. During this movement, the rotation of the developer nozzle 31, the discharge of the developer and the rotation of the wafer W are performed similarly to the first embodiment. Namely, the liquid puddle 30 is spread out from the peripheral portion of the wafer W toward the central portion thereof, and a turning flow is formed in the liquid puddle 30. However, note that, when the liquid puddle 30 is spread out in this manner, interfaces of the developer spreading over the surface of the wafer W merge on the central portion of the wafer W. As described above, there is a possibility that the CDU in the plane of the wafer W might be degraded because of the developer merge. Thus, the liquid puddle 30 is preferably spread out from the central portion of the wafer W toward the peripheral portion thereof.

In addition, in the above example, the liquid puddle 30 is formed on the whole surface of the wafer W by simultaneously performing the movement of the developer nozzle 31 along the radial direction of the wafer W and the rotation of the wafer W. However, the formation of the liquid puddle 30 is not limited thereto. For example, the developer is supplied to form a puddle along the radial direction of the wafer W, by moving the developer nozzle 31 from the central portion of the wafer W toward the peripheral portion thereof, as described above, while the wafer W is under a stationary state. After that, the wafer W is rotated so that the developer flows on the surface of the wafer W by the centrifugal force, whereby the whole wafer W is coated with the developer. Such a process can also achieve reduction in amount of the developer to be used, inhibition of spattering of the developer and promotion of the reaction by the flow of the developer. However, in order to improve the CDU in the plane of the wafer W, it is effective that the rotation of the wafer W and the movement of the developer nozzle 31 are simultaneously performed.

Second Embodiment

Figure 18:
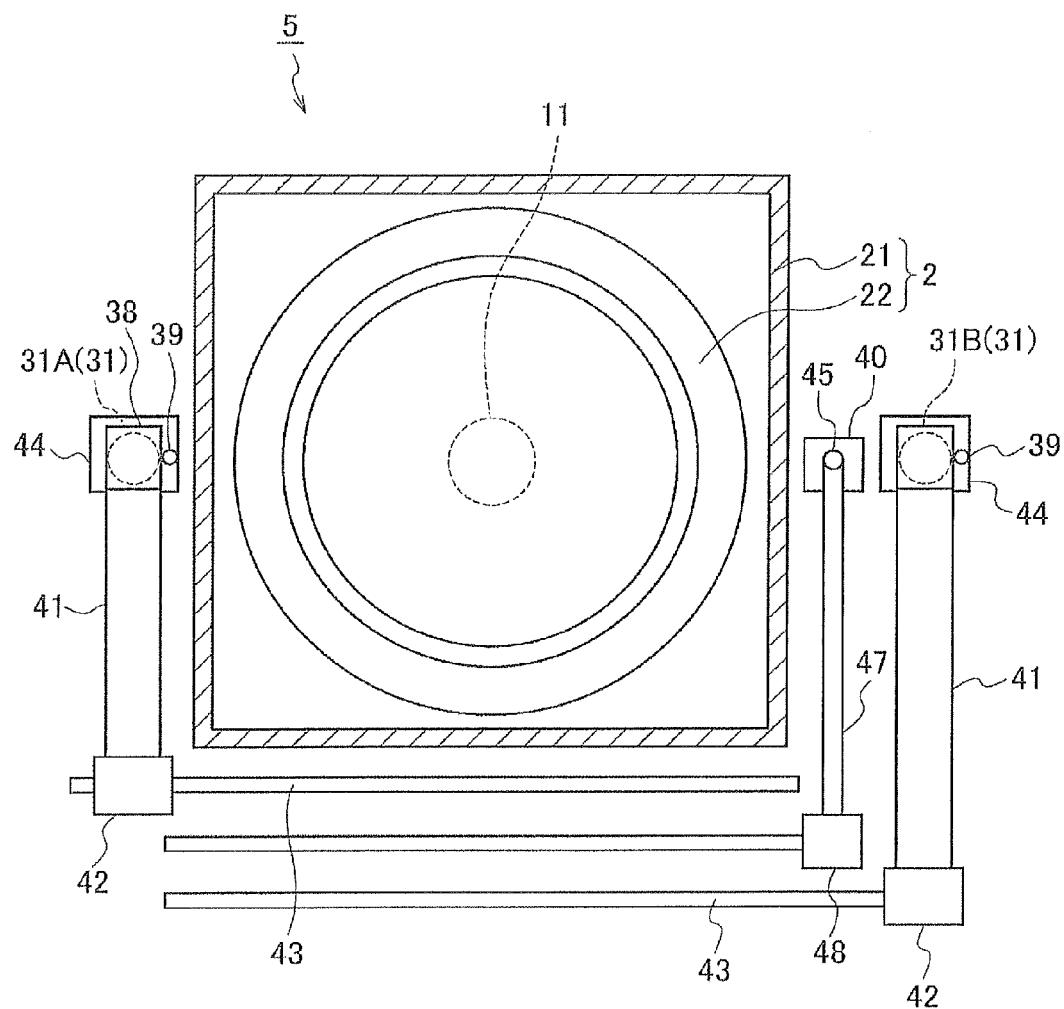
FIG. 18 is a plan view of another developing apparatus.

Next, a second embodiment is explained, focusing on a difference from the first embodiment. FIG. 18 is a plan view showing a developing apparatus 5 used in the second embodiment. The developing apparatus 5 differs from the developing apparatus 1 in that the two developer nozzles 31 are provided. The developer supply pipe 39, the arm 41, the moving mechanism 42, the guide rail 43 and the waiting area 44 are provided for each of the developer nozzles 31. Thus, the rotation, the discharge of the developer and the movement in the radial direction of the wafer W can be independently performed by each developer nozzle 31. For the convenience of explanation, these developer nozzles 31 are shown by the first developer nozzle 31A and the second developer nozzle 31B.

A developing process in the second embodiment is explained with reference to the operational views of the developing apparatus 5 shown in FIGS. 19 to 22 and the time chart shown in FIG. 23. Similarly to FIG. 15, the time chart of FIG. 23 shows the rotating speed of the wafer W, the rotating speed of the developer nozzle, the time period at which the developer is discharged and the time period at which the developer nozzle is moved. The variation of the rotating speed of the first developer nozzle 31A is shown by the solid line, and the variation of the rotating speed of the second developer nozzle 31B is shown by the two-dot chain line.

Figure 19:
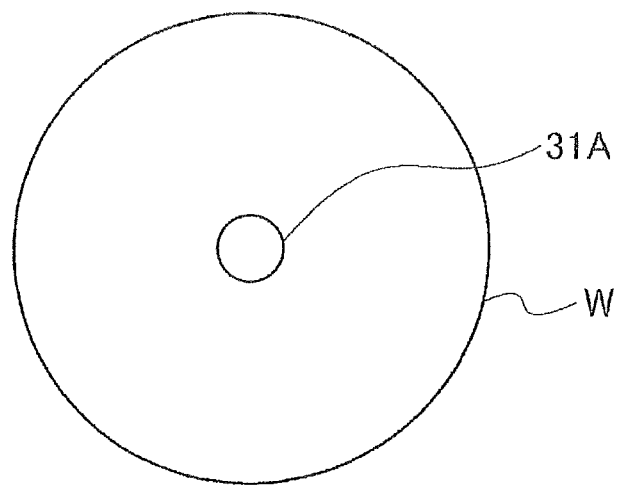
FIG. 19 is a step view of a second embodiment according to the developing apparatus.
Figure 20:
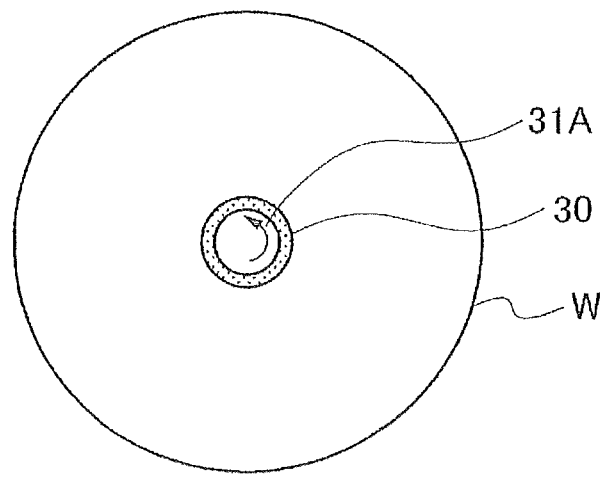
FIG. 20 is a step view of the second embodiment according to the developing apparatus.

Firstly, the first developer nozzle 31A is positioned above the central portion of the stationary wafer W, and is brought close to the wafer W similarly to the first embodiment (FIG. 19). Although not shown for the sake of convenience, the second developer nozzle 31B waits above a predetermined position (an intermediate portion, for the sake of convenience) on the diameter of the wafer W between the central portion of the wafer W and the peripheral portion thereof. The first developer nozzle 31A is rotated counterclockwise in plan view, and a developer is discharged from the first developer nozzle 31A (time instant s1 in the time chart of FIG. 23). Thus, the liquid puddle 30 is formed below the first developer nozzle 31A, and a turning flow is generated in the liquid puddle 30 (FIG. 20).

Figure 21:
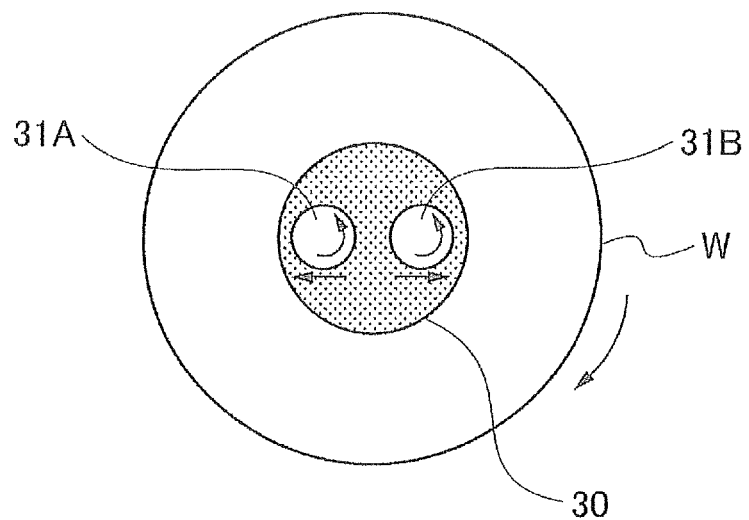
FIG. 21 is a step view of the second embodiment according to the developing apparatus.

When the wafer W is started to rotate clockwise in plan view to reach a predetermined rotating speed, the first developer nozzle 31A moves toward a position above the peripheral portion of the wafer W (time instance s2), so that the liquid puddle 30 is spread out to the peripheral portion of the wafer W. Thereafter, the second developer nozzle 31B is lowered to come close to the intermediate portion of the wafer W, so as to be located above the liquid puddle 30 formed by the first developer nozzle 31A. The second developer nozzle 31B is rotated counterclockwise in plan view, and the developer is discharged from the second developer nozzle 31B (FIG. 21, time instance s3). Thus, a turning flow is also generated in the liquid puddle 30 below the developer nozzle 31B. The second developer nozzle 31B is moved toward the peripheral portion of the wafer W on the radius of the wafer W, in the direction opposed to the moving direction of the first developer nozzle 31A, while the second developer nozzle 31B simultaneously performs the rotation and the discharge of the developer.

Figure 22:
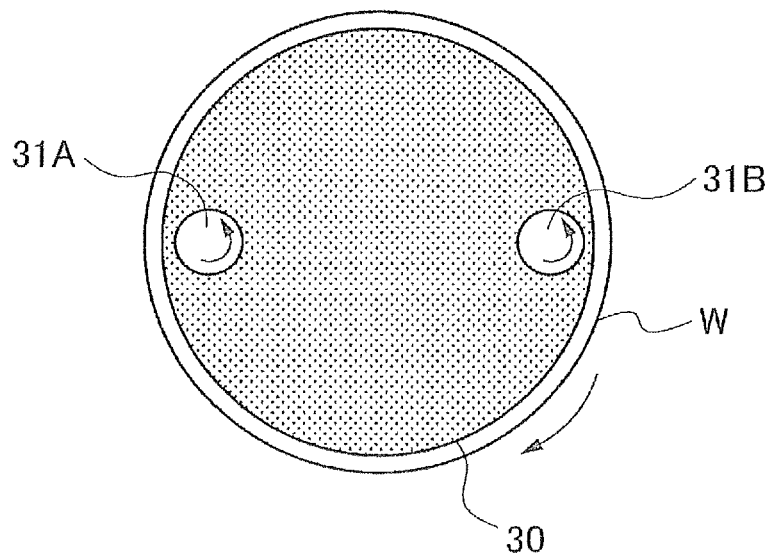
FIG. 22 is a step view of the second embodiment according to the developing apparatus.
Figure 23:
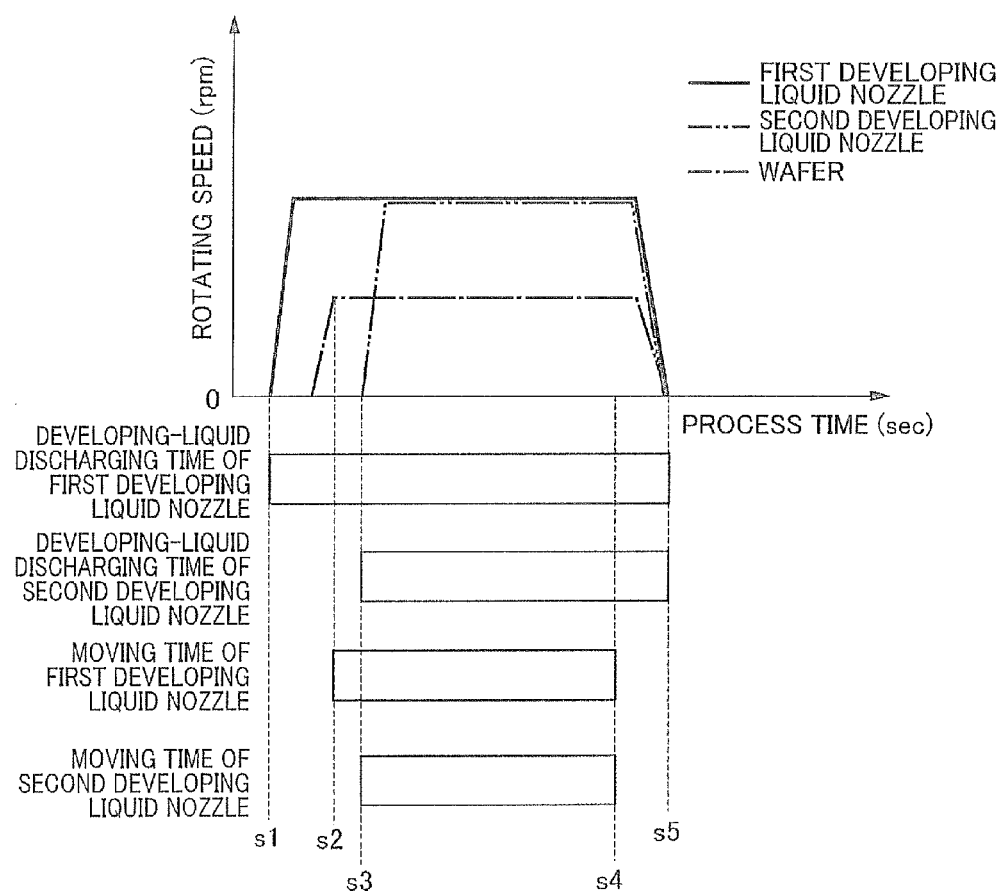
FIG. 23 is a time chart of the steps.

When the first and second developer nozzles 31A and 31B are continuously moved toward the peripheral portion of the wafer W to reach positions above the peripheral portion so that the liquid puddle 30 is formed on the whole surface of the wafer W, the movement of the developer nozzles 31A and 31B is stopped (FIG. 22, time instant s4). Thereafter, the rotating speeds of the developer nozzles 31A and 31*b* decrease to stop the rotation, and the discharge of the developer from the developer nozzles 31A and 31B is stopped (time instant s5). In this manner, no later than the discharge of the developer is stopped, the first developer nozzle 31A passes through the whole surface of the wafer W, similarly to the developer nozzle of the first embodiment. After the discharge of the developer from the respective developer nozzles 31A and 31B is stopped, the reaction of a resist proceeds by the liquid puddle 30 of the developer, similarly to the first embodiment. After a predetermined period of time has elapsed from the time instance s5, the wafer W is rotated and a cleaning liquid is supplied thereto, so that the developer is removed from the wafer W.

In the second embodiment, as described above, the developer on the central portion of the wafer W is stirred by the developer nozzle 31A, and the developer between the intermediate portion thereof and the peripheral portion thereof is stirred by the developer nozzles 31A and 31B. Namely, the second developer nozzle 31B is disposed for assisting the operation for stirring the liquid puddle 30 by the first developer nozzle 31A. Due to this process performed in this manner, stirring of the developer is promoted in an area from the intermediate portion to the peripheral portion, so as to improve uniformity of the developer concentration. Thus, the CD uniformity of the resist pattern in the plane of the wafer W can be more reliably enhanced. In particular, when the wafer W is large in size, an amount of the dissolved product flowing in accordance with the flow of the liquid puddle 30 toward the peripheral portion to the wafer W may increase, as described in the first embodiment, whereby there is a possibility that the concentration uniformity of the developer might be impaired. Thus, the stirring of the developer by using the respective developer nozzles 31A and 42B is effective.

Figure 24:
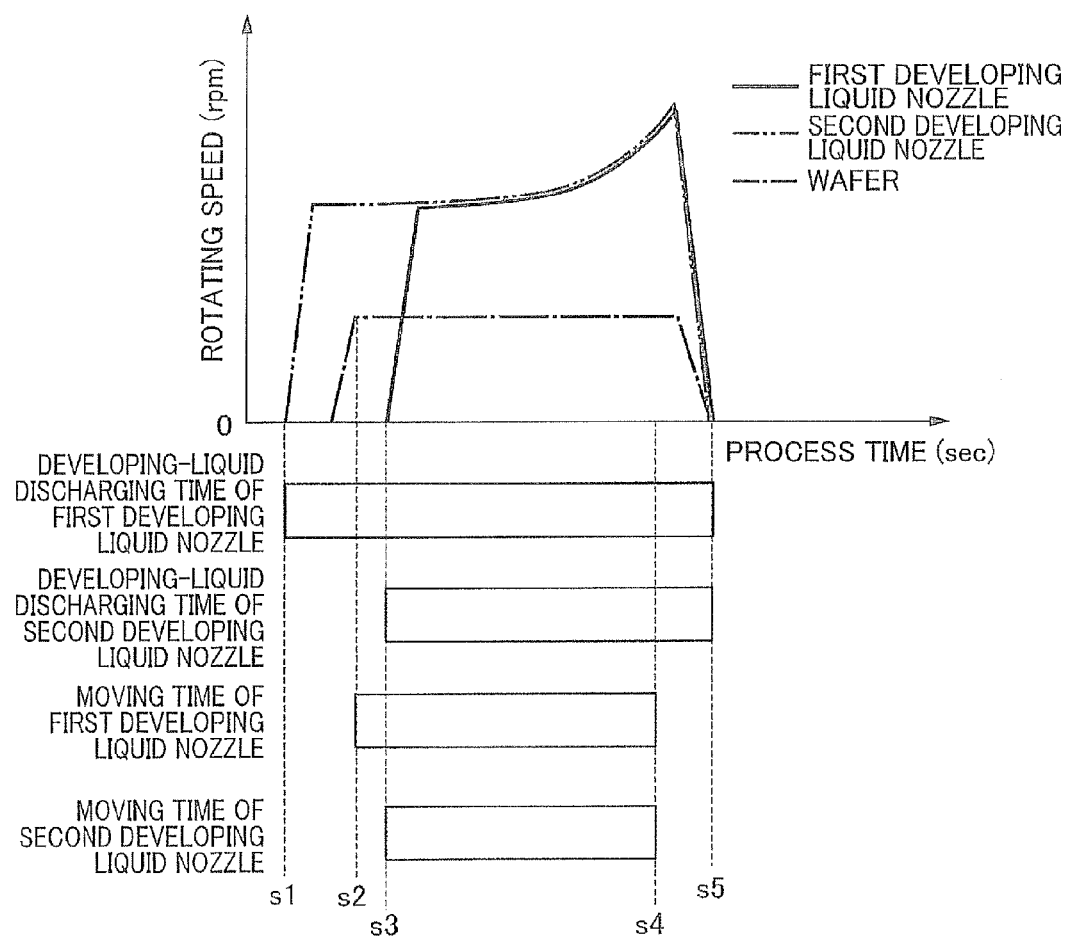
FIG. 24 is a time chart of a modification example of the steps.

FIG. 24 shows a time chart of a modification example of the second embodiment. The time chart of FIG. 24 differs from the time chart of FIG. 23 in that the rotating speed of the developer nozzle 31 is increased as the developer nozzle 31 moves toward the peripheral portion of the wafer W, similarly to the modification example of the first embodiment. In this example, although the rotating speeds of the first and second developer nozzles 31A and 31B are both increased, only one of them may be increased.

In the above example, although the first developer nozzle 31A and the second developer nozzle 31B are rotated in the same direction, the first and second developer nozzles 31A and 31B may be rotated in opposite directions. The rotating speeds of the developer nozzles 31A and 31B are 50 rpm to 1000 rpm, for example. The rotating speeds may be the same with each other or different from each other. The bottom surface 35 of the second developer nozzle 31B and the bottom surface 35 of the first developer nozzle 31A may be the same with each other in size or different from each other in size. When the bottom surfaces 35 are different from each other in size, the second developer nozzle 31B is formed such that, for example, the bottom surface 35 of the second developer nozzle 31B is smaller than the bottom surface 35 of the first developer nozzle 31A, with a view to assisting the stirring operation of the first developer nozzle 31A. In addition, the second developer nozzle 31B may not discharge the developer but may be only rotated to stir the developer.

Third Embodiment

Figure 29:
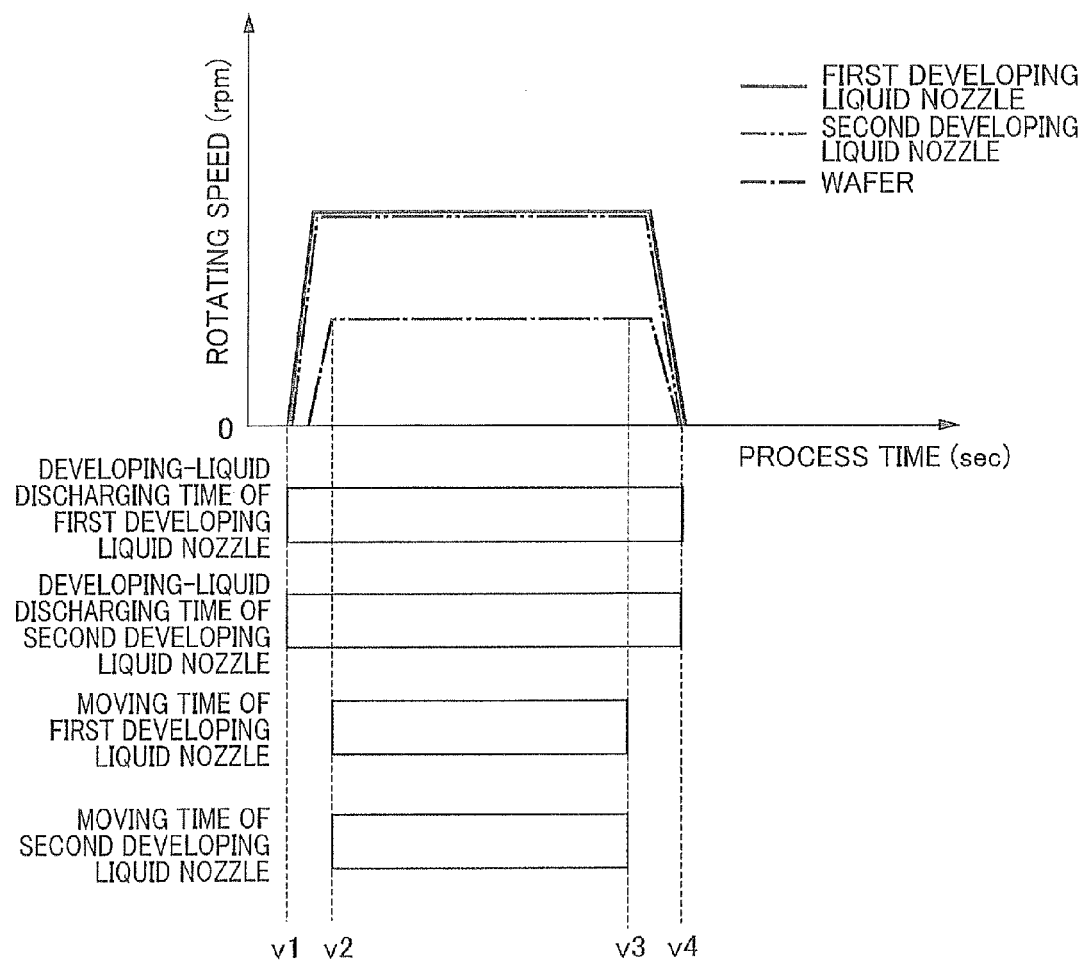
FIG. 29 is a time chart of the steps.

Next, a third embodiment is explained. In the third embodiment, the developing apparatus 5 explained in the second embodiment is used. A developing process in the third embodiment is explained with reference to operational views of the developing apparatus 5 shown in FIGS. 25 to 28. Similarly to the second embodiment, a time chart of FIG. 29 shows the rotating speed of the wafer W in the developing process in the third embodiment, the rotating speeds of the respective developer nozzles, the discharge time periods of the developer and the moving time periods of the respective developer nozzles.

Figure 25:
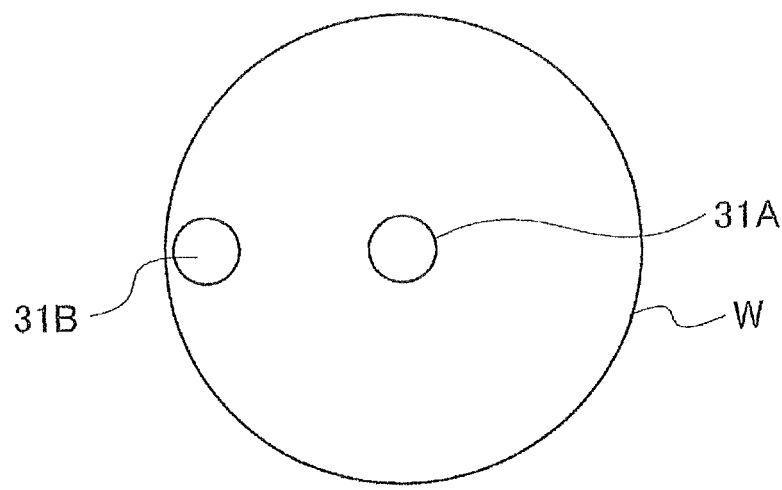
FIG. 25 is a step view of a third embodiment according to the developing apparatus.
Figure 26:
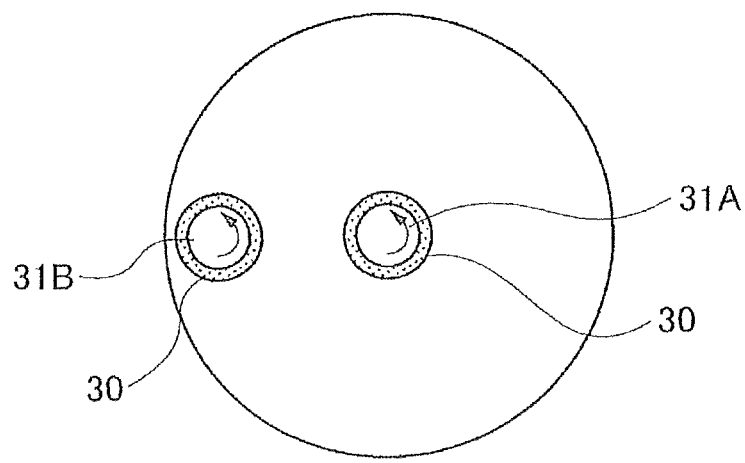
FIG. 26 is a step view of the third embodiment according to the developing apparatus.

The first developer nozzle 31A is located above the central portion of the wafer W, and the second developer nozzle 31B is located above the peripheral portion of the wafer W, respectively, and they are lowered to come close to the wafer W (FIG. 25). The developer is discharged respectively from the first developer nozzle 31A and the second developer nozzle 31B, and the developer nozzles 31A and 31B are rotated counterclockwise in plan view. Thus, the liquid puddles 30 are formed below the respective developer nozzles 31A and 31B, and a turning flow is formed in each liquid puddle 30 (FIG. 26, time instant v1 in chart of FIG. 29). When the wafer W is started to rotate clockwise in plan view to reach a predetermined rotating speed, the first developer nozzle 31A is moved toward the peripheral portion side of the wafer W and the second developer nozzle 31B is moved toward the central portion side of the wafer W, in the same direction (time instance v2).

Figure 27:
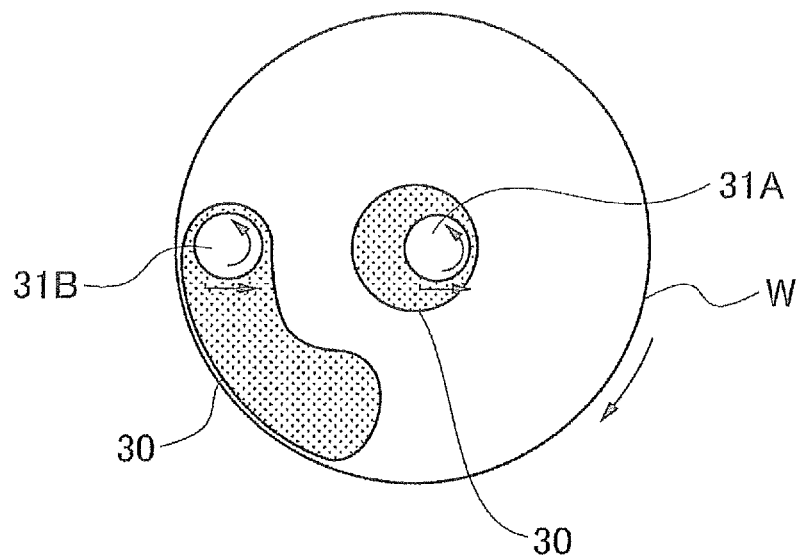
FIG. 27 is a step view of the third embodiment according to the developing apparatus.
Figure 28:
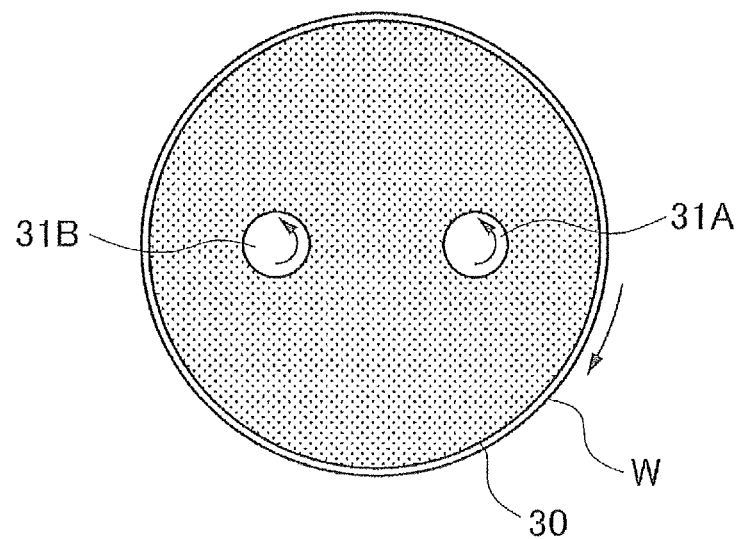
FIG. 28 is a step view of the third embodiment according to the developing apparatus.

The liquid puddles 30, which have been formed by the first developer nozzle 31A and the second developer nozzle 31B, are spread out on the surface of the wafer W by the movement of the respective developer nozzles 31A and 31B (FIG. 27). Their interfaces merge with each other, so that the whole wafer W is coated with the liquid puddle 30. During this, similarly to the other embodiments, the developer is stirred by the turning flows below the developer nozzles 31A and 31B. When the first developer nozzle 31A and the second developer nozzle 31B are located above the intermediate portions of the wafer W, the movement of these developer nozzles 31A and 31B is stopped (time instance v3, FIG. 28). After that, the rotation of the developer nozzles 31A and 31B is stopped, and the discharge of the developer from the respective developer nozzles 31A and 31B is stopped (time instance v4). Between a time from when the rotation of the developer nozzles 31A and 31B is started to when the rotation thereof is stopped, the whole surface of the wafer W passes through at least below the first developer nozzle 31A or below the second developer nozzle 31B. Thus, the developer is stirred on the whole surface of the wafer W.

According to the third embodiment, the first developer nozzle 31A and the second developer nozzle 31B form the liquid puddles 30 simultaneously in the different areas in the plane of the wafer W. Then, the first and second developer nozzles 31A and 31B spread the liquid puddles 30 and generate turning flows in the respective liquid puddles 30. Thus, the liquid puddle 30 can be promptly formed on the whole surface of the wafer W, and the developer can be stirred on the whole surface of the wafer W. As a result, a time required for the developing process can be more reduced. However, as described above, when the interfaces of the developer merge with each other on the wafer W, there is a possibility that the CDU might be degraded. Thus, the developing process is performed similarly to the first embodiment and the second embodiment, in order to improve the CDU.

Figure 30:
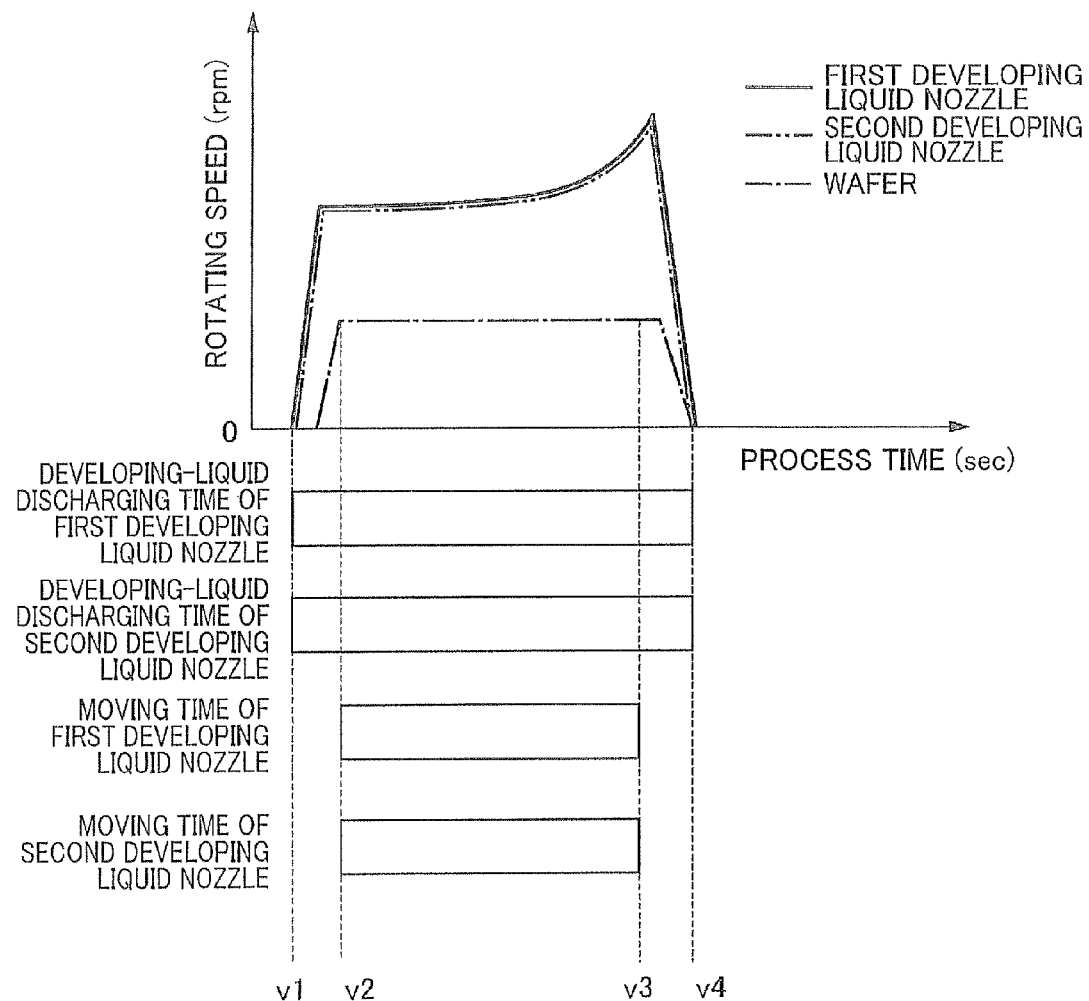
FIG. 30 is a time chart of a modification example of the steps

FIG. 30 shows a time chart of a modification example of the third embodiment. The time chart of FIG. 30 differs from the time chart of FIG. 29 in that the rotating speed of the first developer nozzle 31A is increased as the first developer nozzle 31A is moved from a position above the central portion of the wafer W to a position above the intermediate portion thereof, and that the rotating speed of the second developer nozzle 31B is increased as the second developer nozzle 31B is moved from a position above the peripheral portion of the wafer W to a position above the intermediate portion thereof. In the third embodiment, since the liquid paddle 30 is spread out toward the intermediate portion, a contact time between the developer and the resist is shorter, when a certain point approaches the intermediate portion. Thus, as shown in the time chart of FIG. 30, the rotating speeds of the developer nozzles 31A and 31B are controlled so as to improve the CDU in the plane of the wafer W. Also in this third embodiment, the rotating directions and the rotating speeds of the developer nozzles 31A and 31B may be the same with each other or different from each other. The bottom surfaces 35 of the respective developer nozzles 31A and 31B may be different from each other.

Fourth Embodiment

Figure 35:
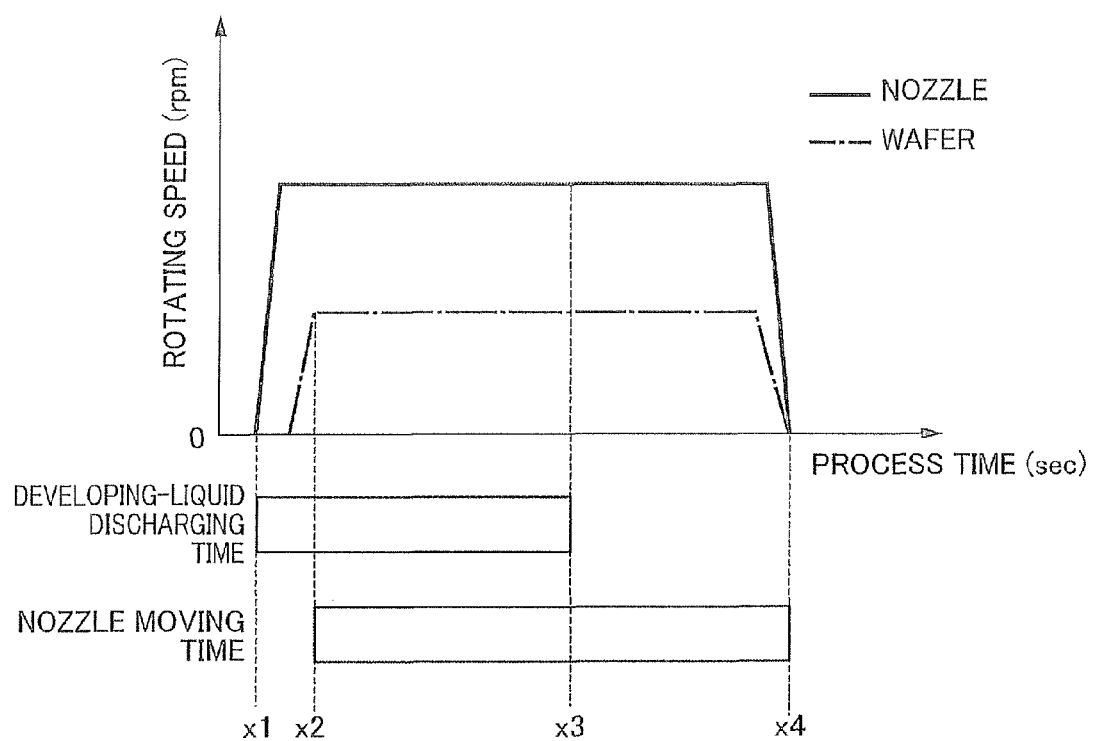
FIG. 35 is a time chart of the steps.

Next, a fourth embodiment is explained. In the fourth embodiment, the developing apparatus 1 explained in the first embodiment is used. A developing process of the fourth embodiment is explained with reference to step views shown in FIGS. 31 to 34, focusing on a difference from the first embodiment. A time chart of the fourth embodiment shown in FIG. 35 is suitably referred to.

Figure 31:
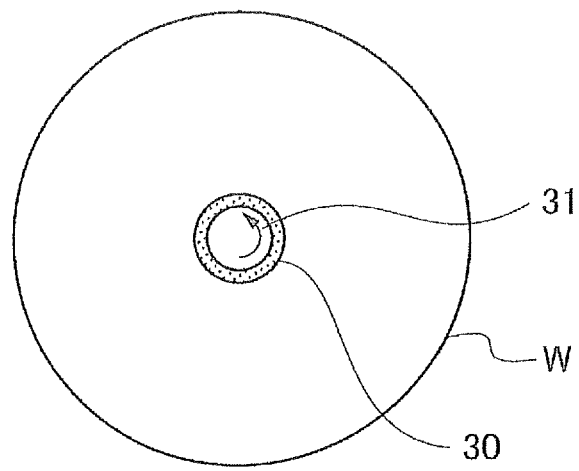
FIG. 31 is a step view of a fourth embodiment.
Figure 32:
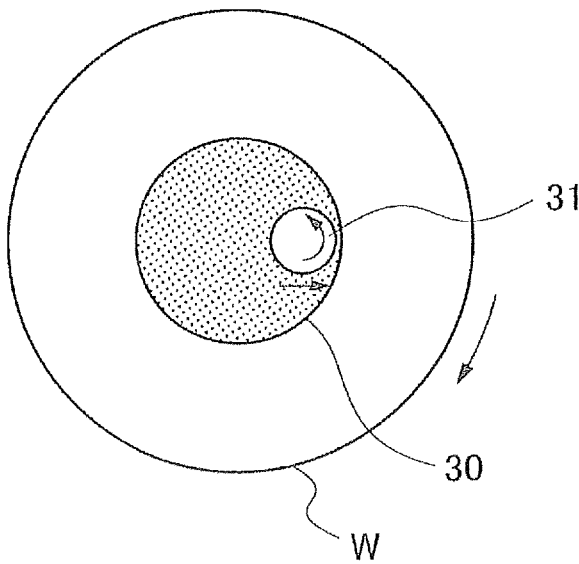
FIG. 32 is a step view of the fourth embodiment.
Figure 33:
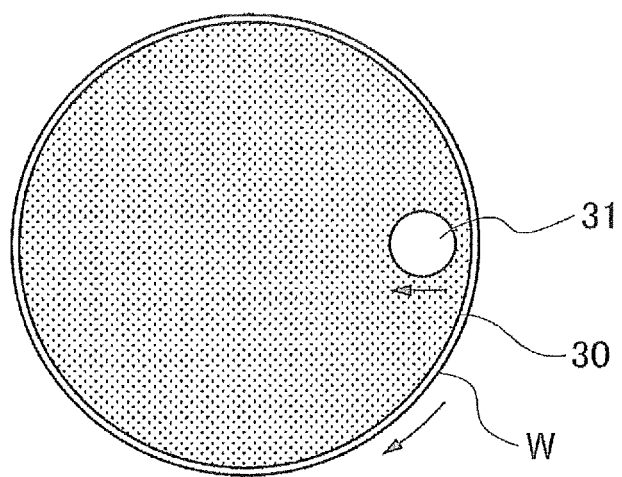
FIG. 33 is a step view of the fourth embodiment.
Figure 34:
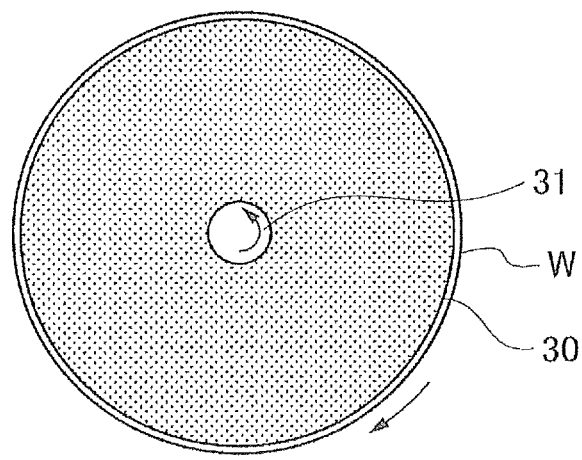
FIG. 34 is a step view of the fourth embodiment.

Similarly to the first embodiment, the developer nozzle 31 is brought close to a position above the central portion of the wafer W, and a developer is discharged so that the liquid puddle 31 is formed. In addition, a turning flow is formed in the liquid puddle 30 by the rotation of the developer nozzle 31 (FIG. 31, time instance x1 in chart of FIG. 35). The wafer W is rotated and the developer nozzle 31 is moved toward a position above the peripheral portion of the wafer W (time instance x2), so that the liquid puddle 30 is spread out toward the peripheral portion of the wafer W (FIG. 32). When the developer nozzle 31 is located above the peripheral portion of the wafer W so that the liquid puddle 30 is spread out on the whole surface of the wafer W, the discharge of the developer from the developer nozzle 31 is stopped (time instance x3), and the developer nozzle 31, which is continuously rotated, is moved toward a position above the central portion of the wafer W (FIG. 33). Thus, a turning flow is continuously formed in the liquid puddle 30. When the developer nozzle 31 is located on a position above the central portion of the wafer W (FIG. 34), the rotation of the developer nozzle 31 and the rotation of the wafer W are stopped (time instance x4). Almost simultaneously with the stop of the rotation of the wafer W, a cleaning liquid is supplied from the cleaning liquid nozzle 45 to clean the wafer W.

As described above, since the developer nozzle 31 is reciprocated between a position above the central portion of the wafer W and a position above the peripheral portion thereof, each point of the whole surface of the wafer W passes twice through below the developer nozzle 31 and the developer on each point is stirred. Thus, according to the fourth embodiment, the reaction between the developer and the resist can be more promoted than the first embodiment. As a result, a time from when the rotation of the developer nozzle 31 is stopped to when the cleaning liquid is discharged by the cleaning liquid nozzle 45 can be set shorter than the first embodiment. According to the fourth embodiment, a throughput can be more enhanced than that of the first embodiment.

Figure 36:
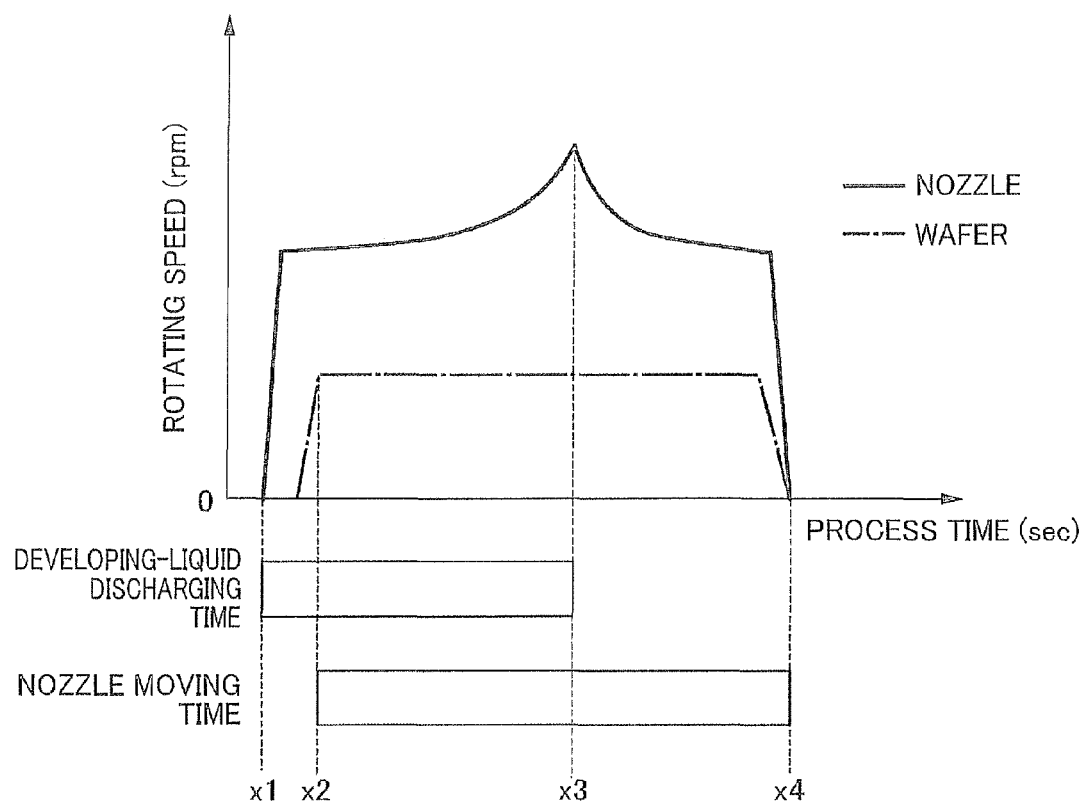
FIG. 36 is a time chart of a modification example of the steps.

FIG. 36 shows a time chart of a modification example of the fourth embodiment. The time chart of FIG. 36 differs from the time chart of FIG. 35 in that the rotating speed of the developer nozzle 31 is increased as the developer nozzle 31 is moved from a position above the central portion of the wafer W to a position above the peripheral portion thereof, and that the rotating speed of the developer nozzle 31 is decreased as the developer nozzle 31 is moved from a position above the peripheral portion to a position above the central portion. The purpose of this operation is to promote the reaction between the developer and the resist on the peripheral portion, because a contact time between the developer and the resist shortens as approaching the peripheral portion of the wafer W, which is as described in the first embodiment.

In the above respective examples, after the developer nozzle 31 has been located above the peripheral portion of the wafer W, the discharge of the developer is stopped in order to inhibit an amount of the developer to be consumed. However, the developer may be discharged when the developer nozzle is moved to a position above the central portion. In addition, the number of movements of the rotating developer nozzle 31 between a position above the central portion of the wafer W and a position above the peripheral portion thereof is not limited to the above example, and the number of movements may be larger than that of the above example. Namely, in the above example, after the developer nozzle 31 is returned to a position above the central portion of the wafer W, the developer nozzle 31 may be again moved to a position above the peripheral portion of the wafer W.

In addition, the developer nozzle 31 may be reciprocated above the wafer W such that, after the discharge of the developer is started on a position above the peripheral portion of the wafer W, the developer nozzle 31 is moved to a position above the central portion of the wafer W, and that the developer nozzle 31 is returned to a position above the peripheral portion of the wafer W. However, as described in the first embodiment, it is preferable that the discharge of the developer is started at a position above the central portion of the wafer W similarly to the above example, in order to improve the CDU.

Fifth Embodiment

Figure 37:
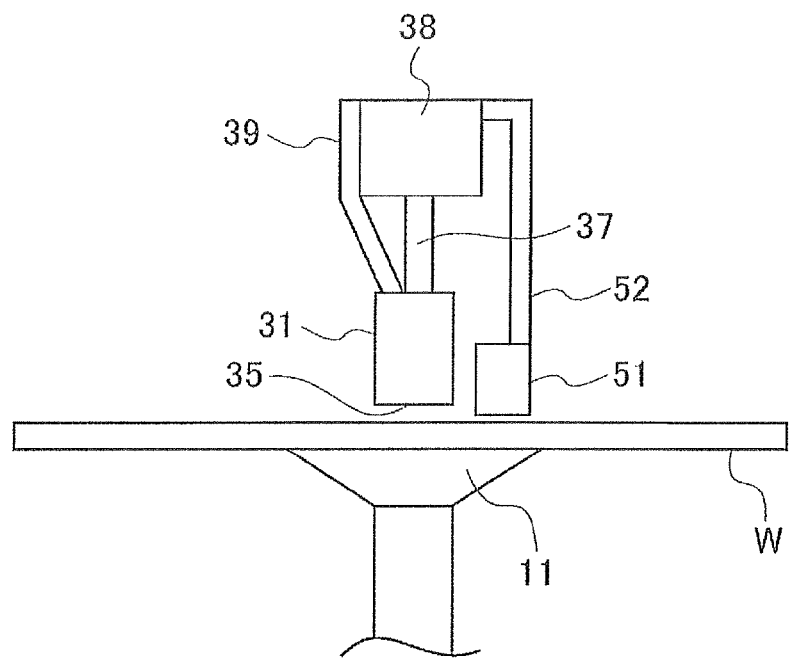
FIG. 37 is a side view of a developer nozzle in another developing apparatus.
Figure 38:
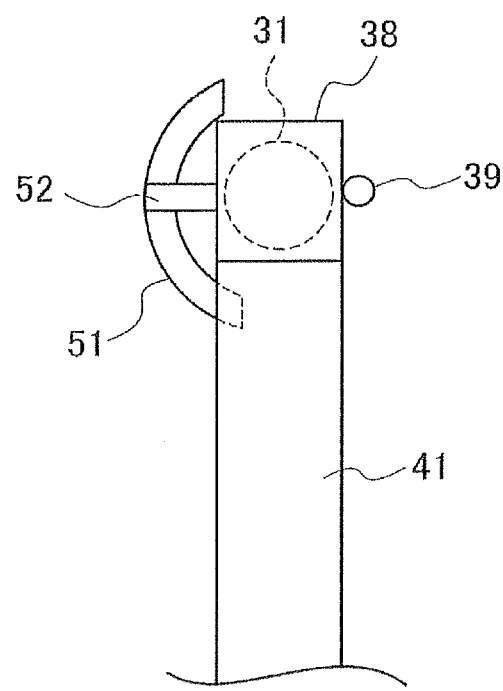
FIG. 38 is a plan view of the other developing apparatus.

Next, a fifth embodiment is explained. A developing apparatus used in the firth embodiment has substantially the same structure as that of the developing apparatus 1 explained in the first embodiment, excluding that the developing apparatus in the fifth embodiment is provided with a restricting member 51 for restricting spreading of the developer on the wafer W. FIGS. 37 and 38 show the restricting member 51. The restricting member 51 is disposed apart from the developer nozzle 31 in a traveling direction of the developer nozzle 31 in which the developer nozzle 31 is moved for spreading the liquid puddle 30. During the movement of the developer nozzle 31, even when the developer forming the liquid puddle 30 flows in the traveling direction under the influence of the moving developer nozzle 31, the restricting member 51, which is located in the traveling direction, restricts the flow of the developer.

The restricting member 51 has an arcuate shape in plan view, in this example. A surface of the restricting member 51 is formed of a material such as PFA (tetrafluoroethylene perfluoroalkyl vinylether copolymer) or PTFE (polytetrafluoroethylene). The reference number 52 depicts a support part, which supports the restricting member 51 onto the rotating mechanism 38. Thus, the restricting member 51 is moved together with the developer nozzle 31 by the movement of the arm 41.

The restricting member 51 is located to be slightly apart from above the surface of the wafer W, when the liquid puddle 30 is formed by the developer nozzle 31. Thus, even when the liquid puddle 30 is spread out over the surface of the wafer W to flow to a position below the restricting member 51, the liquid puddle 30 in contact with the restricting member 51 is pulled by the restricting member 51 by the surface tension, whereby the liquid puddle 30 can be prevented from flowing outside the restricting member 51.

Figure 39:
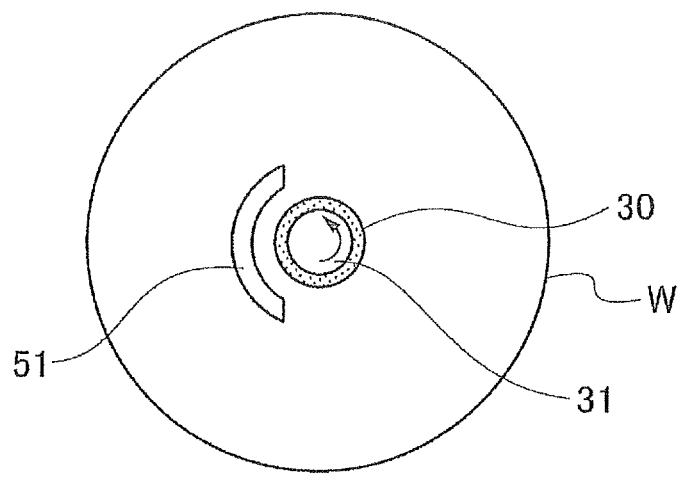
FIG. 39 is a step view of a fifth embodiment according to the developing apparatus.
Figure 40:
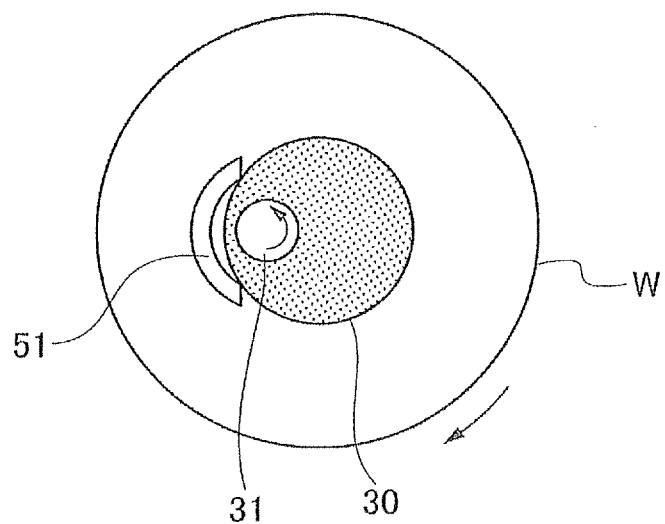
FIG. 40 is a step view of the fifth embodiment according to the developing apparatus.
Figure 41:
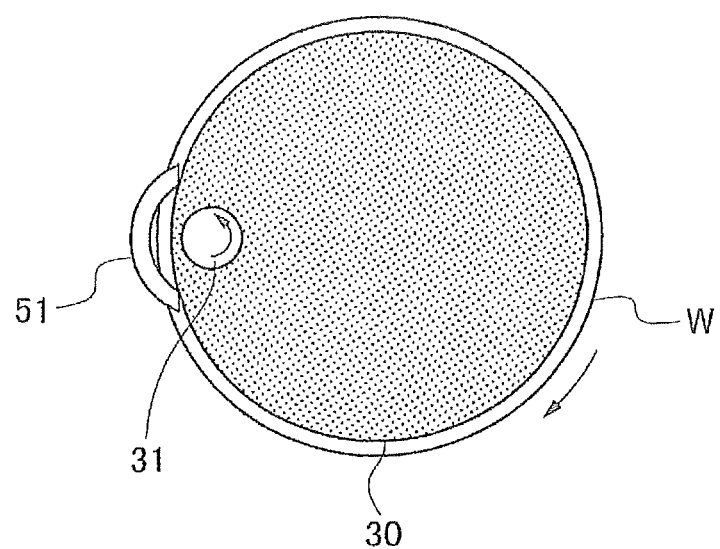
FIG. 41 is a step view of the fifth embodiment according to the developing apparatus.

A developing method of the fifth embodiment is explained with reference to the operational views of the developing apparatus shown in FIGS. 39 to 41. In the fifth embodiment, as described in the time chart of Hg. 15 in the first embodiment, for example, the operations of the respective units of the developing apparatus are controlled. Namely, similarly to the first embodiment, the developer nozzle 31 is brought close to a position above the central portion of the wafer W, the developer is discharged to form the liquid puddle 30, and the developer nozzle 31 is rotated. Thus, a turning flow is formed in the liquid puddle 30 (FIG. 39).

Excessive spreading of the liquid puddle 30 in the plane of the wafer W in the traveling direction of the developer nozzle 31 is inhibited by means of the restricting member 51. Under this state, the liquid puddle 30 is spread out toward the peripheral portion of the wafer W by the movement of the developer nozzle 31 (FIG. 40). When the developer nozzle 31 is moved to a position above the peripheral portion of the wafer W so that the liquid puddle 30 is spread out on the whole surface of the wafer W, the rotation of the developer nozzle 31 and the rotation of the wafer W are stopped (FIG. 41).

Due to the provision of the restricting member 51, the developer forming the liquid puddle 30 can be prevented from falling down to the outside of the wafer W. Thus, an amount of the developer to be used can be more reliably inhibited. In the fifth embodiment, similarly to the modification example of the first embodiment shown in FIG. 17, the rotating speed of the developer nozzle 31 may be increased as the developer nozzle 31 is moved toward the peripheral portion of the wafer W. The shape of the restricting member 51 is not limited to the arcuate shape, as long as the restricting member 51 can restrict the flow of the developer to the outside of the wafer W. For example, the restricting member 51 may have a linear shape in plan view.

In addition, the restricting member 51 may not be moved together with the developer nozzle 31. For example, the restricting member 51 is connected to a moving mechanism that is separated from the moving mechanism 42 of the developer nozzle 31. The apparatus may be constituted such that, when the wafer W is processed, the restricting member 51 is moved from the outside of the wafer W to a position above the peripheral portion of the wafer W, and comes to rest above the peripheral portion.

(Other Nozzle Structural Examples)

Figure 42:
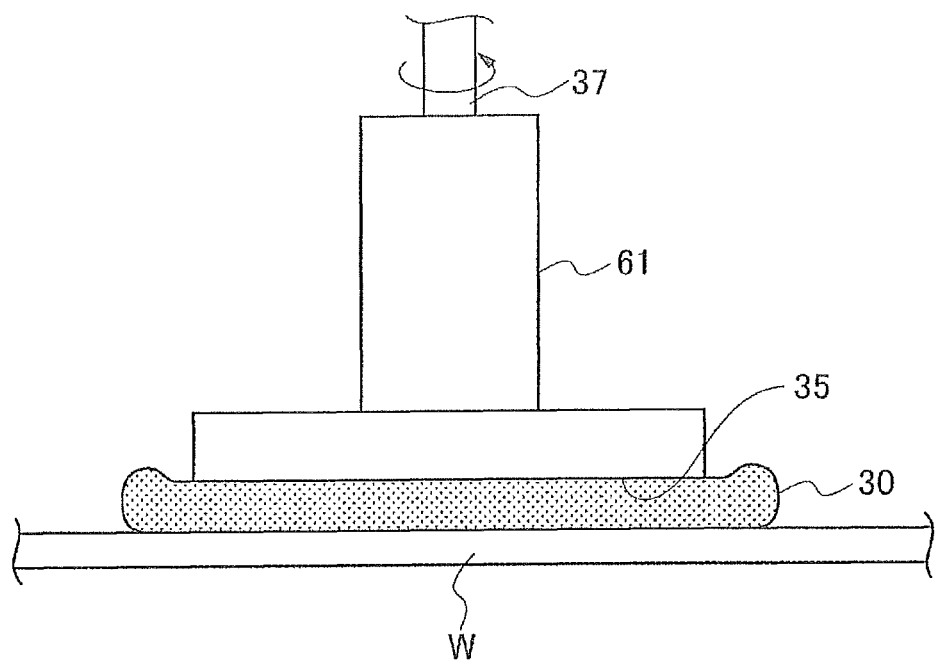
FIG. 42 is a side view of another developer nozzle.
Figure 43:
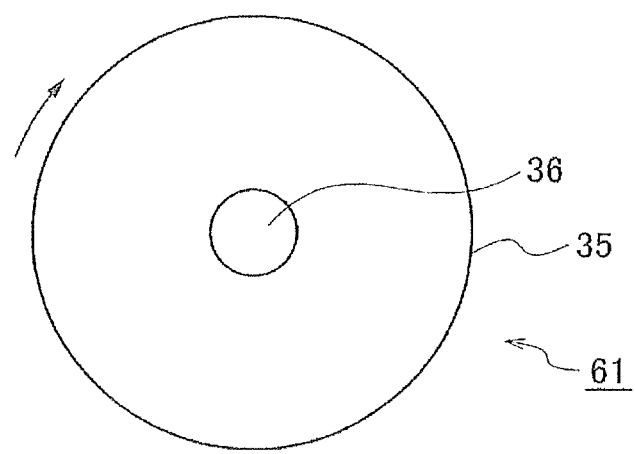
FIG. 43 is a bottom view of the other developer nozzle.

A developer nozzle used in the respective embodiments is not limited to the aforementioned developer nozzle 31. Other nozzle structural examples are described. FIG. 42 shows a side surface of a developer nozzle 61 and FIG. 43 shows a bottom surface 35 of the developer nozzle 61, respectively. The developer nozzle 61 differs from the developer nozzle 31 in that a lower end part of the developer nozzle 61 has a larger diameter so as to form a turning flow in a wider range than the developer nozzle 31.

Figure 44:
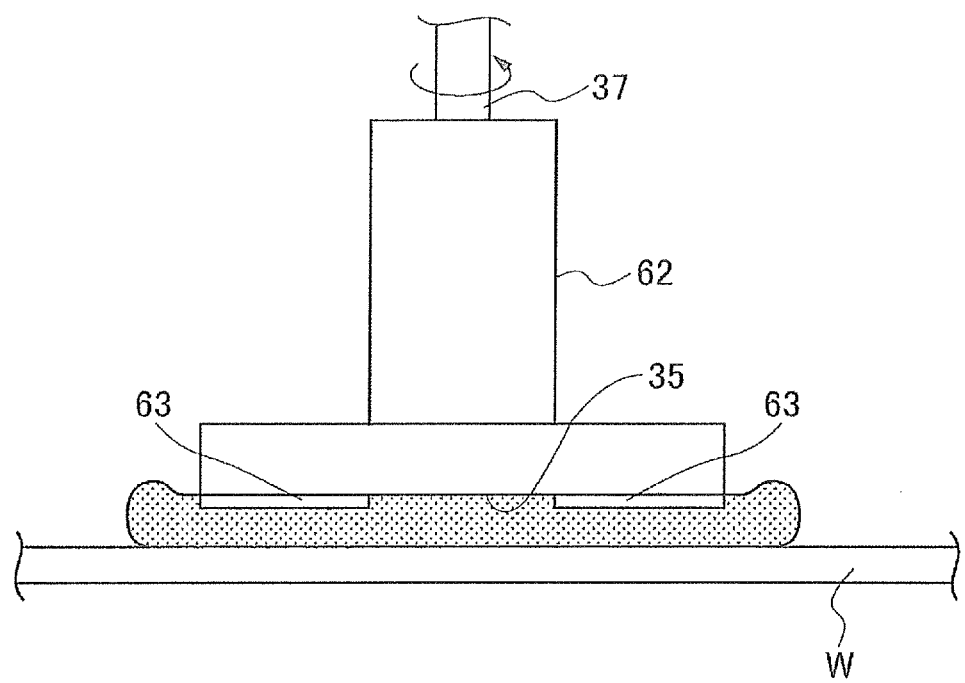
FIG. 44 is a side view of another developer nozzle.
Figure 45:
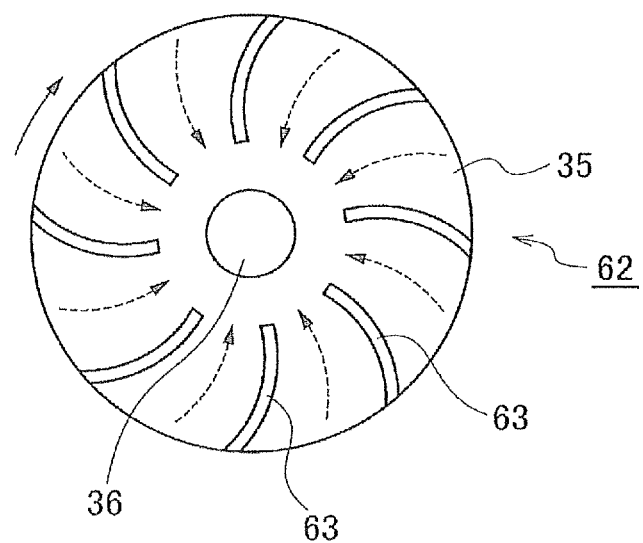
FIG. 45 is a bottom view of the other developer nozzle.

Although the bottom surface 35 of the developer nozzle 61 is flat, the structure is not limited thereto. FIGS. 44 and 45 are a side view and a bottom view of a developer nozzle 62. The developer nozzle 62 has substantially the same structure as that of the developer nozzle 61, excluding that the developer nozzle 62 is provided with a projection 63 on the bottom surface 35. A plurality of the projections 63 are arranged with intervals therebetween in a circumferential direction of the bottom surface 35. Each projection 63 has an arcuate shape in plan view extending from a peripheral portion of the bottom surface 35 to a central portion thereof. When the developer nozzle 62 is rotated, the developer is made to flow toward the central portion of the bottom surface 35 by the projections 63, whereby the stirring is promoted. In FIG. 45, the flow of the developer is shown by the dotted arrows. Since the developer flows toward the central portion, the developer is prevented from moving to flow to the outside of the developer nozzle 62 during the rotation of the developer nozzle 62. Namely, the developer having been discharged from the discharge opening 36 is held below the developer nozzle 62 for relatively a longer period of time. Thus, below the developer nozzle 62, the developer may be more reliably stirred so as to improve a concentration uniformity thereof.

Figure 46:
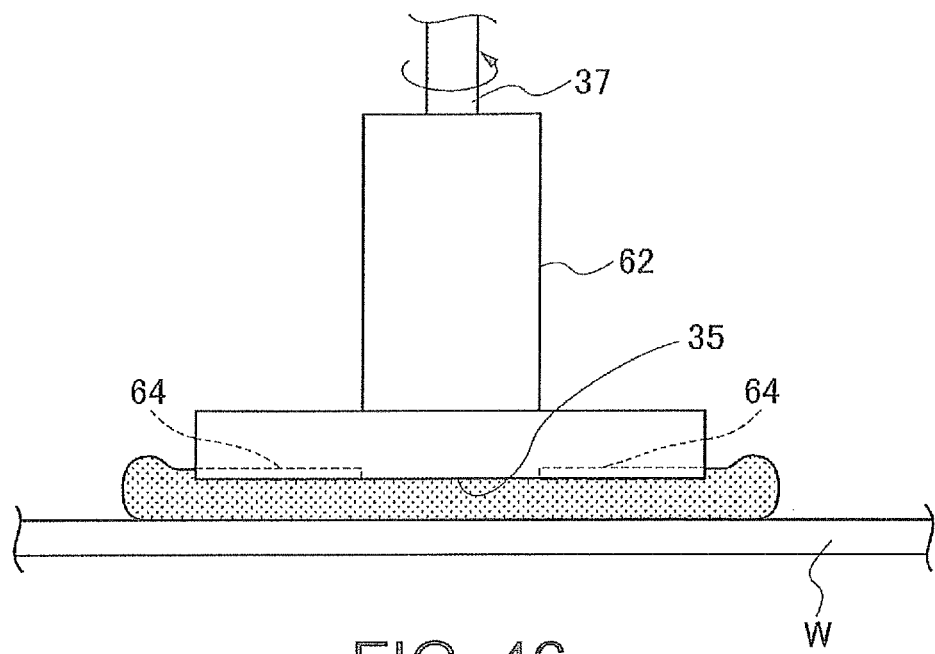
FIG. 46 is a side view of another developer nozzle.
Figure 47:
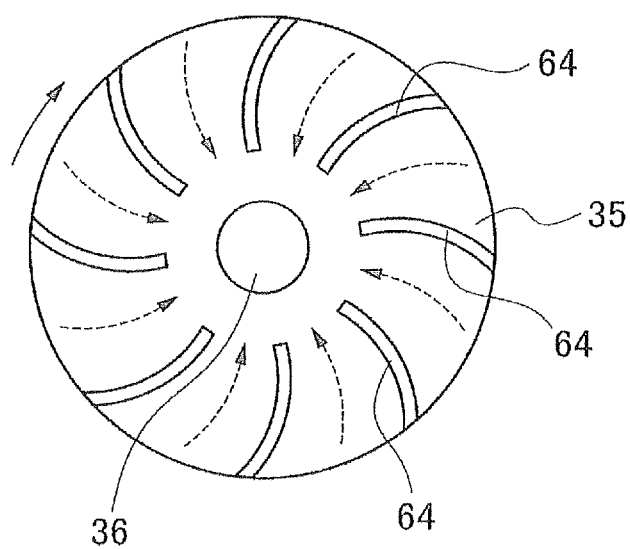
FIG. 47 is a bottom view of the other developer nozzle.

In order to form the flow of the developer toward the central portion of the bottom surface 35, a groove may be provided instead of the projection 63. FIGS. 46 and 47 show a side view and a bottom view of the developer nozzle 62 provided with a plurality of grooves 64. Similarly to the projection 63, each groove 64 has an arcuate shape extending from the peripheral portion of the bottom surface 35 toward the central portion thereof.

Figure 48:
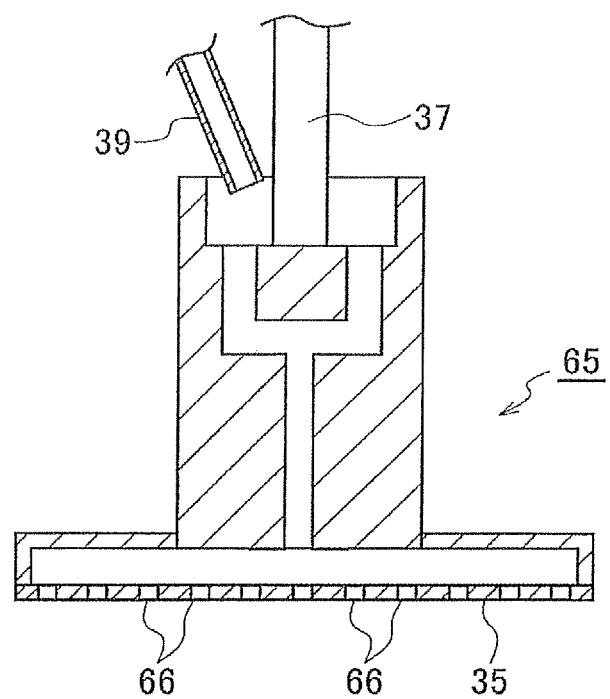
FIG. 48 is a longitudinal side view of another developer nozzle.
Figure 49:
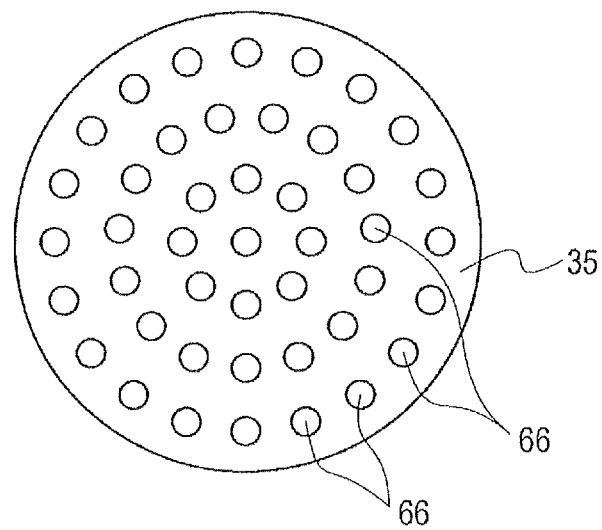
FIG. 49 is a bottom view of the other developer nozzle.

FIGS. 48 and 49 are longitudinal side view and a bottom view of a developer nozzle 65. The developer nozzle 65 has substantially the same structure as that of the developer nozzle 61, excluding that a number of discharge openings 66 with spaces therebetween are formed in a bottom surface 35, whereby the developer is supplied to the wafer W like a shower. Since the developer supplied to the developer nozzle 65 is dispersed from the respective discharge openings 66 so as to be discharged onto the wafer W, a discharge pressure of the developer against the wafer W is inhibited, whereby the spattering of the developer from the wafer W can be more reliably inhibited. In addition, the bottom surface 35 of the developer nozzle 65 may be formed of a porous material so as to inhibit the spattering of the developer.

Figure 50:
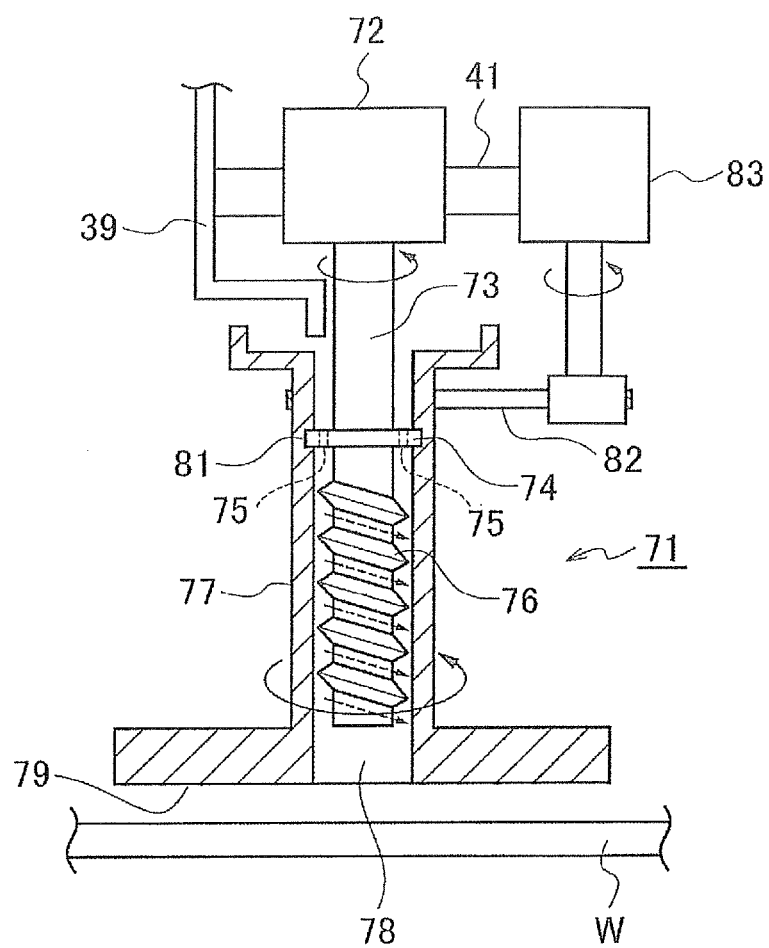
FIG. 50 is a longitudinal side view of another developer nozzle.
Figure 51:
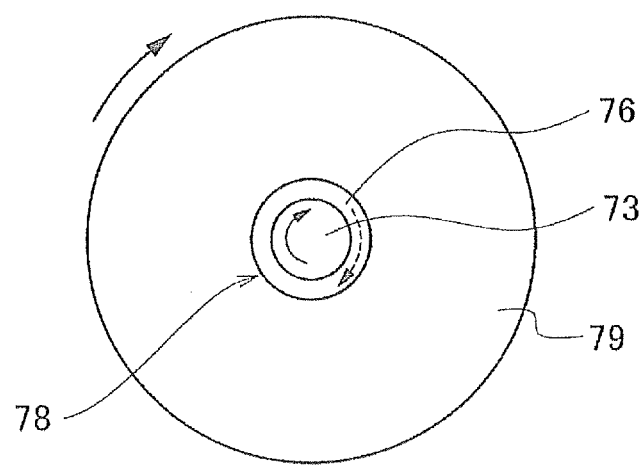
FIG. 51 is a bottom view of the other developer nozzle.

Another structural example of the developer nozzle is described. FIGS. 50 and 51 are a longitudinal sectional view and a bottom view of a developer nozzle 71. The reference number 72 depicts a flow-path-member rotating mechanism, which is disposed on the arm 41 similarly to the rotating mechanism 38 of the developer nozzle 31. The flow-path-member rotating mechanism 72 is configured to be rotated a rotating rod 73, which extends vertically downward, about a central axis thereof. The reference number 74 depicts a flange disposed on the rotating rod 73. A hole 75 defining a flow path of the developer is drilled in a circumferential direction of the flange 74. A spiral projection 76 defining a flow-path member is formed on a lower side surface of the rotating rod 73 below the flange 74. Namely, the rotating rod 73 has a screw-like shape.

A sleeve 77 is disposed near to the projection 76 to surround a side periphery of the rotating rod 73. A lower opening of the sleeve 77 defines a discharge opening 78 of the developer. A lower end part of the sleeve 77 has a larger diameter in order that the developer can be stirred in a wider rage by its rotation, similarly to the developer nozzle 61. A bottom surface of the sleeve 77 is indicated by the reference number 79. The flange 74 is inserted in a groove 81 inside the sleeve 77 so as to support the sleeve 77. A belt 82 is wound around the sleeve 77, so that the sleeve 77 is driven by a rotating mechanism 83 disposed on the arm 41. Due to the driving of the belt 82, the sleeve 77 can be rotated about a vertical axis. The developer supply pipe 39 is disposed on the arm 41 such that the developer is supplied from a downstream end of the developer supply pipe 39 to an upper opening of the sleeve 77.

Similarly to the above-described respective developer nozzles, the developer nozzle 71 can form the liquid puddle 30 of the developer on the surface of the wafer W, and can generate a turning flow in the liquid puddle 30. As shown by the solid arrow in FIG. 51, the sleeve 77 and the rotating rod 73 are rotated clockwise when seen from below, with a bottom surface 79 of the sleeve 77 being close to the wafer W. While the sleeve 77 and the rotating rod 73 are rotated in this manner, the developer is supplied to the upper part of the sleeve 77. As shown by the dotted arrow, the supplied developer turns and flows downward along the projection 76 so as to form a spiral liquid flow. Owing to the action of the rotating rod 73 which is rotated in the circumferential direction of the discharge opening 78, the liquid flow is accelerated and is discharged from the discharge opening 78 onto the wafer W. Thus, the liquid puddle 30 in contact with the bottom surface 79 of the sleeve 77 is formed, and a turning flow is formed in the liquid puddle 30. The turning flow is accelerated by the rotation of the bottom surface 79, so that the developer is widely stirred below the bottom surface 79.

In the above example, although the sleeve 77 is rotated in order to improve the stirring operation of the developer, the sleeve 77 may not be rotated. In addition, the rotating rod 73 may not be rotated. Namely, a turning flow may be formed in the liquid puddle 30 only by the projection 76 of the rotating rod 73 which guides the developer.

A heater, for example, may be embedded in the bottom surfaces of the respective developer nozzles. In this case, when the developer is stirred, the bottom surface can be heated by the heater to a higher temperature, so that the reaction between the developer and the resist can be further promoted.

Sixth Embodiment

Next, a sixth embodiment is explained, focusing on a difference from the first embodiment. In the sixth embodiment, the developing apparatus 1 explained in the first embodiment is used. Process steps of the sixth embodiment is described herebelow with reference to the drawings. Similarly to the developer nozzle 65 shown in FIG. 48, the bottom surface of the developer nozzle 31 shown in the drawings has a number of holes 66 so as to supply the developer like a shower. The developer nozzle 31 shown in the drawings of the sixth embodiment has the projections 63, similarly to the example explained with reference to FIGS. 44 and 45. However, differently from the projection 63 of the example shown in FIG. 45, the projection 63 linearly extends from the central portion side of the bottom surface 35 of the developer nozzle 31 toward the peripheral portion side thereof.

Figure 52:
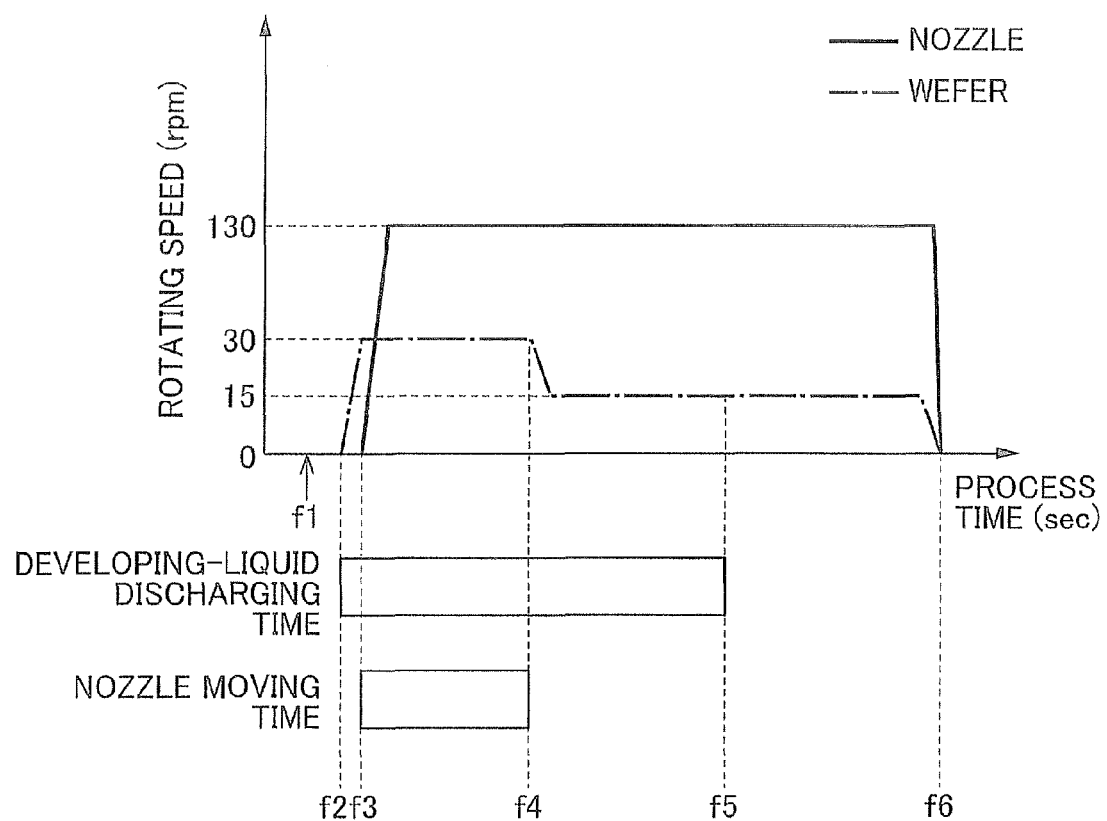
FIG. 52 is a time chart of steps of a sixth embodiment.

In the sixth embodiment, the resist on the surface of the wafer W is exposed by a KrF excimer laser, for example. Similarly to FIG. 15, FIG. 52 is a chart showing the rotating speed of the developer nozzle 31, the rotating number of the wafer W, a time period in which the developer is discharged and a time period in which the developer nozzle 31 is moved.

Figure 53:
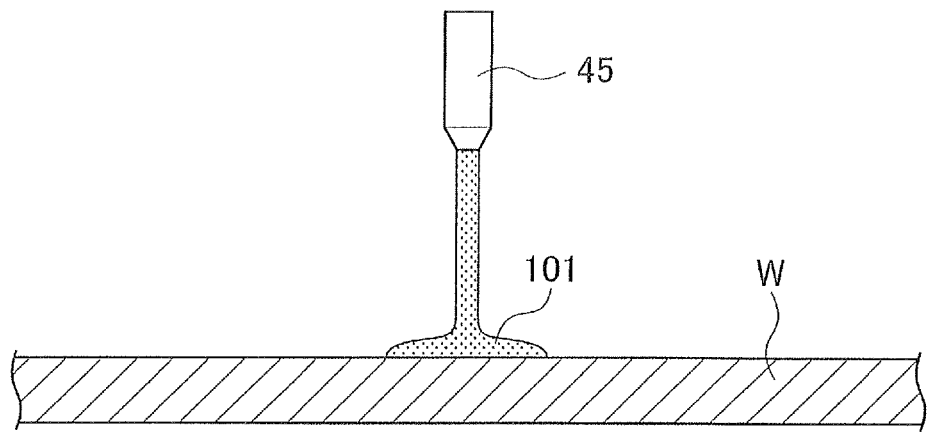
FIG. 53 is a side view showing a state of a wafer in the sixth embodiment.
Figure 54:
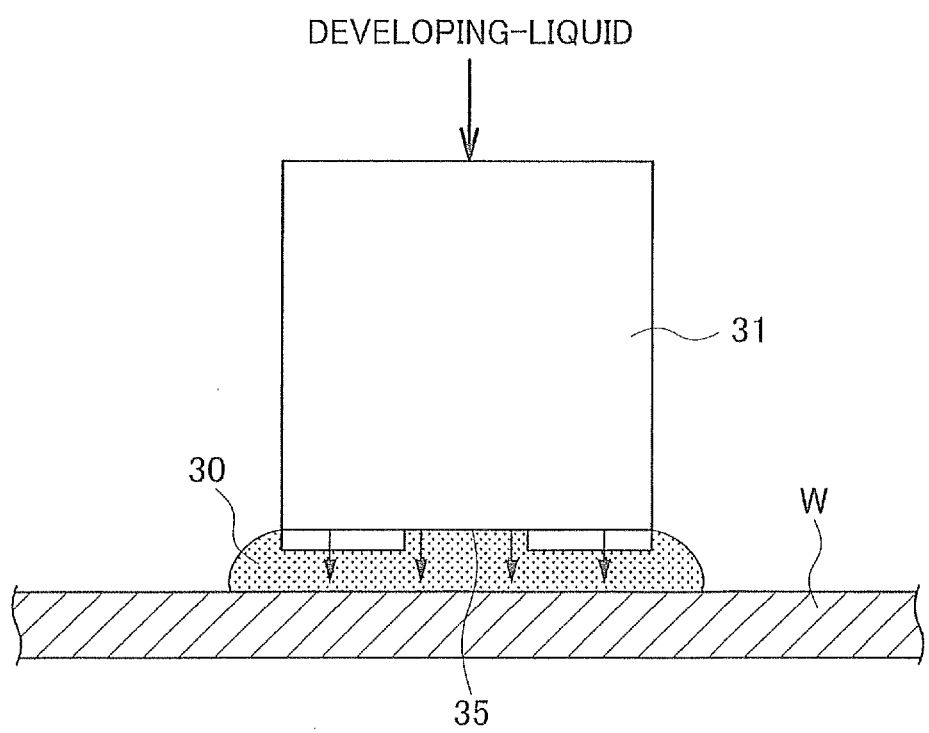
FIG. 54 is a side view showing a state of the wafer in the sixth embodiment.

Firstly, the cleaning liquid nozzle 4, which has been moved to a position above the central portion of the wafer W held by the spin chuck 11, supplies a deionized water to the central portion of the wafer W, so that a local liquid puddle 101 is formed on the central portion (FIG. 53, time instance f1 in chart). After the supply of the cleaning liquid is stopped, the cleaning liquid 45 is retracted from the position above the central portion of the wafer W. Thereafter, similarly to the first embodiment, the developer nozzle 31 comes close to the central portion of the wafer W, and discharges the developer (time instance f2). The discharged developer is diluted by the cleaning liquid to fill a space between the surface of the wafer W and the bottom surface 35 of the developer nozzle 31, so that a liquid puddle 30 is formed (FIG. 54).

While the wafer W is continuously rotated at, e.g., 30 rpm, the developer nozzle 31 is rotated and moved toward the peripheral portion of the wafer W at 30 mm/second (time instance f3). As described in the first embodiment, while the liquid puddle 30 is spread out by the movement of the developer nozzle 31, the developer nozzle 31 is continuously rotated at, e.g., 130 rpm. Due to the rotation of the wafer W and the rotation of the developer nozzle 31, the developer is stirred below the developer nozzle 31 (FIG. 54). When the developer nozzle 31 is moved to a position above the peripheral portion of the wafer W, the movement is stopped and the rotating speed of the wafer W decreases (time instance f4) to 15 rpm, for example. The discharge of the developer and the rotation of the developer nozzle 31 are continued, so that the whole surface of the wafer W is coated with the developer. Then, the supply of the developer is stopped (time instance f5). The wafer W and the developer nozzle 31 are continuously rotated after the supply of the developer has been stopped, and the stirring of the developer proceeds at the peripheral portion of the wafer W. After that, the rotation of the developer nozzle 31 and the rotation of the wafer W are stopped (time instance f6). The developer nozzle 31 is retracted from above the wafer W, and the developing process proceeds under the stationary state. After the developing process is finished, the supply of the cleaning liquid to the wafer W and the spinning off of the cleaning liquid are sequentially performed, as described in the first embodiment.

In the sixth embodiment, as described above, the developer is diluted at the central portion of the wafer W. The reason is as follows. A supply amount of the developer per unit area is larger at the central portion of the wafer W than at the peripheral portion of the wafer W. Further, the contact time with the developer is longer at the central portion of the wafer W than at the peripheral portion thereof. Thus, at the central portion of the wafer W, the reaction between the developer and the resist easily proceeds, as compared with the peripheral portion of the wafer W. Thus, in the sixth embodiment, the developer supplied to the central portion of the wafer W is diluted with a deionized water as a dilution liquid, so as to inhibit the proceeding of the reaction at the central portion. Thus, in the sixth embodiment, the effect of improving the CD uniformity in the plane of the wafer W can be more reliably obtained, in addition to the effect obtained in the first embodiment. Further, in the sixth embodiment, after the developer nozzle 31 is moved to a position above the peripheral portion of the wafer W and the developer is stirred on the whole surface of the wafer W, the developer nozzle 31 remains above the peripheral portion of the wafer W to continuously stir the developer. Thus, the reaction between the developer and the resist is promoted at the peripheral portion of the wafer W. Namely, from this point, the non-uniform reaction between the central portion of the wafer W and the peripheral portion thereof can be inhibited, whereby the CD uniformity in the plane of the wafer W can be more reliably enhanced.

In the above process, after the developer nozzle 31 is located above the peripheral portion of the wafer W, the rotating speed of the wafer W is decreased to adjust the stirring degree of the developer. Namely, a line width of the resist pattern at the peripheral portion is adjusted by adjusting the reaction between the resist and the developer at the peripheral portion of the wafer W. However, the stirring degree may be adjusted by decreasing the rotating speed of the developer nozzle 31 in place of the rotating speed of the wafer W.

The sixth embodiment may be combined with the respective embodiments. For example, in the second embodiment in which the developer nozzles 31A and 31B are used, the cleaning liquid may be supplied before the developer is supplied to the center of the wafer W so as to dilute the developer supplied to the center of the wafer W. In addition, similarly to the other embodiments, in the sixth embodiment, the rotating speed of the wafer W and/or the rotating speed of the developer nozzle 31, when the developer nozzle 31 is located on respective positions along the radial direction of the wafer W, may be the same with each other or different from each other. The supply amount of the developer from the developer nozzle 31 may be varied depending on the position of the developer nozzle 31, or the same at the respective positions.

Figure 55:
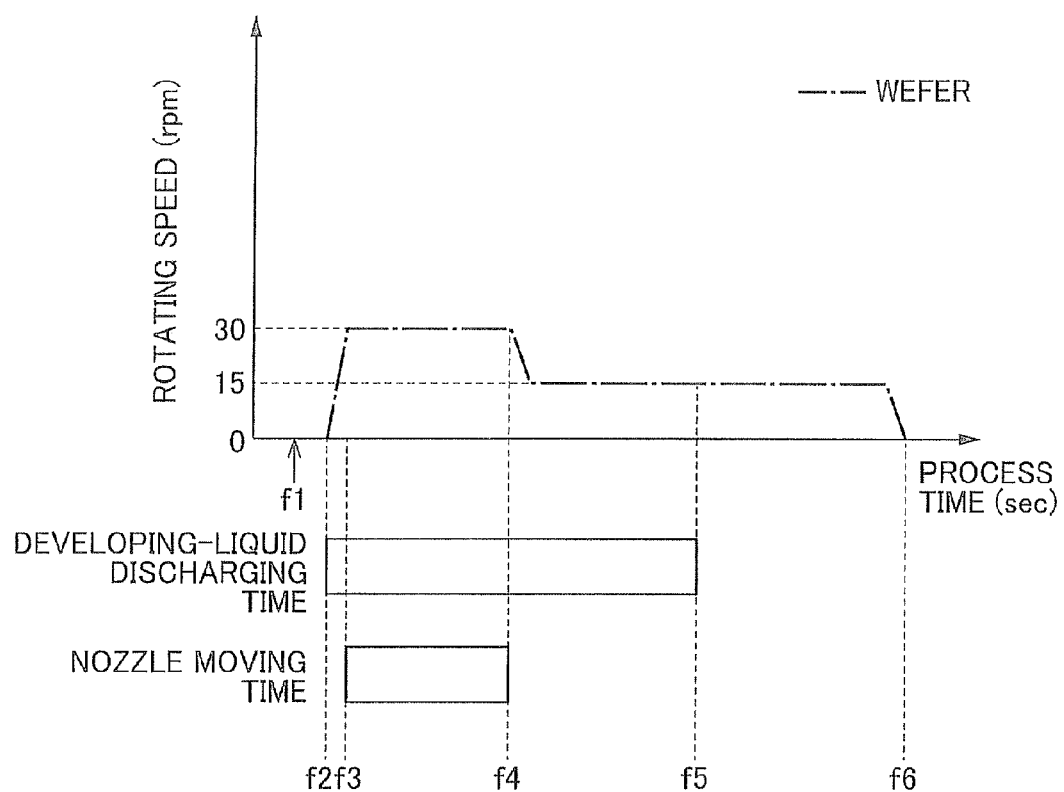
FIG. 55 is a time chart of a modification example of the steps of the sixth embodiment.

With reference to FIGS. 7 and 8, there is explained that, when the developer nozzle 3 is rotated, the developer is stirred below the developer nozzle 31 by means of the surface tension acting between the developer nozzle 31 and the developer. However, when the developer nozzle 31 is not rotated but the wafer W is rotated, the developer below the developer nozzle 31 is stirred under the action of force by the rotation of the wafer W and the action of the surface tension against the developer nozzle 31. Thus, in the sixth embodiment, the process may be performed without rotating the developer nozzle 31. FIG. 55 shows a chart of such a process. As shown in FIG. 55, the same operation as the operation of the developing apparatus 1 described with reference to FIG. 52 is performed so as to develop the wafer W, excluding that the developer nozzle 31 is not rotated. For example, the process in the chart of FIG. 55 is used for a wafer W in which a resist is exposed by an ArF excimer laser. Depending on a sensitivity of the resist to the developer, whether the rotation of the developer nozzle 31 is carried out or not may be selected. As to the other respective embodiments, the developer may be stirred only by rotating the wafer W without rotating the developer nozzles 31, 31A and 31B.

That is to say, the following effects can be obtained by the process including: horizontally holding an exposed substrate by a substrate holder; forming a liquid puddle on a part of the substrate, by supplying a developer from a developer nozzle; and spreading the liquid puddle on a whole surface of the substrate by turning a liquid flow in the liquid puddle, by applying, from above the substrate, an operation for rotating liquid puddle about an axis perpendicular to the substrate, while supplying the developer to the liquid puddle. The first effect is that the excessive developer is inhibited from being supplied to the outside of the substrate so as to inhibit an amount of the developer to be used. The second effect is that, since the developer on the substrate is stirred by the turning flow so as to inhibit the non uniformity of the concentration of the developer in the area where the turning flow is formed, it can be prevented that the reaction between the developer and the resist becomes weak, whereby the lowering of throughput can be inhibited. The third effect is that, since the substrate is not needed to be rotated or the rotating speed of the substrate is not needed to be increased during the supply of the developer, the spattering of the developer can be inhibited. However, the substrate may be rotated instead of generating the turning flow. In this case, the developer nozzle is moved in the radial direction of the rotating substrate, and is moved in contact with the developer. The bottom surface of each developer nozzle in each of the above embodiments corresponds to a contact part with the developer. Owing to such a structure, the effect of inhibiting an amount of the developer to be used can be obtained. In addition, since the developer is stirred, the effect of inhibiting the lowering of throughput can be obtained. In this method, it is not necessary to rotate the substrate at a high speed, and the rotating speed can be set such that the spattering of the developer is inhibited.

The bottom surface of each developer nozzle has a circular shape. However, the bottom surface of the developer nozzle is not limited to the circular shape, but may be a polygonal shape. In addition, the bottom surface of the developer nozzle is adapted to be opposed to the surface of the wafer W. Herein, the state in which the bottom surface is opposed to the surface of the wafer W is not limited to a state in which the bottom surface is in parallel with the surface of the wafer W, but may be inclined with respect to the surface of the wafer W. In addition, the bottom surface of the developer nozzle is not limited to a flat surface but may be a curved surface.

Seventh Embodiment

Figure 56:
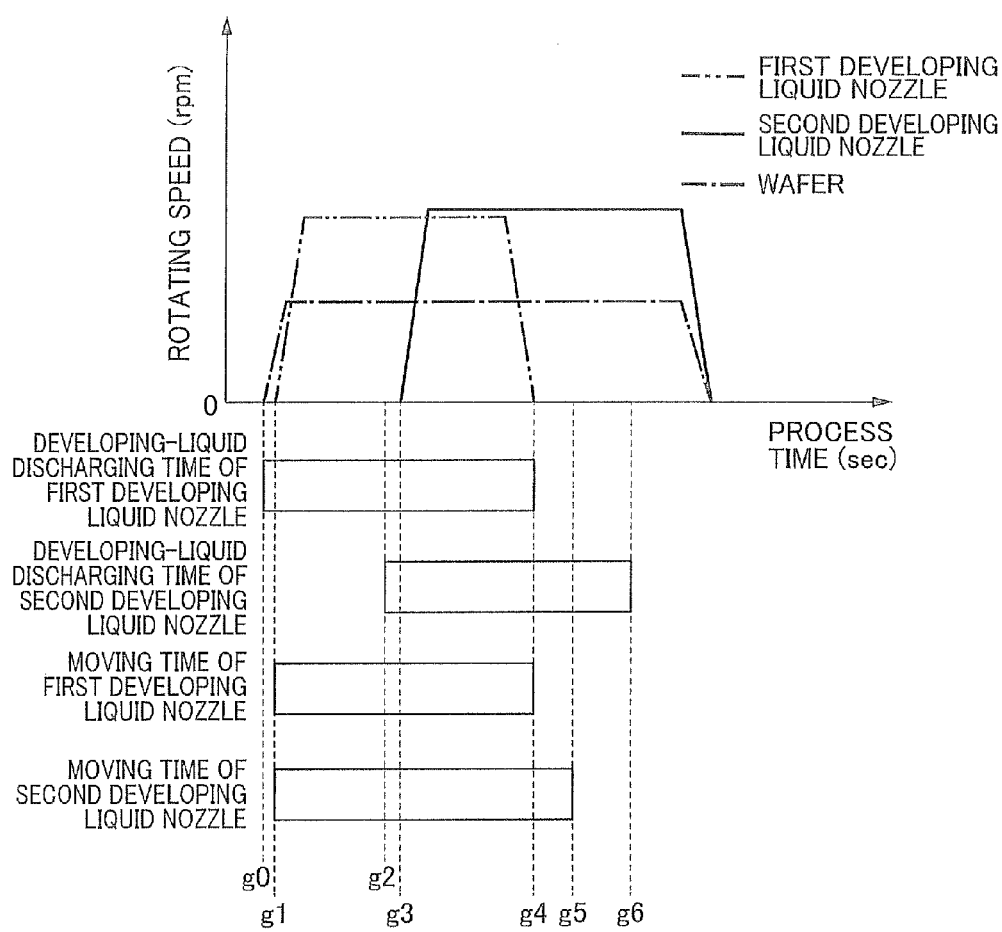
FIG. 56 is a time chart of steps in a seventh embodiment.
Figure 57:
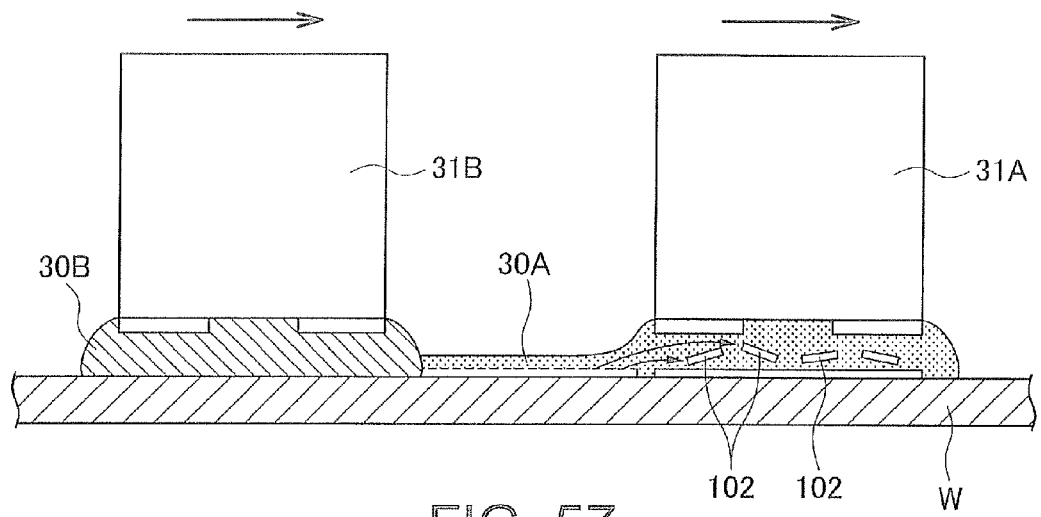
FIG. 57 is a side view showing a state of a wafer in the seventh embodiment.

Next, a seventh embodiment is explained. In the seventh embodiment, the developing apparatus 5 explained in the second embodiment is used. Herebelow, a difference from the second embodiment is mainly described. Similarly to FIG. 23 explained in the second embodiment, FIG. 56 as a chart showing the rotating speeds of the developer nozzles 31A and 31B, the rotating speed of the wafer W, the time period in which the developer is discharged and the time period in which the developer nozzle 31 is moved, and FIG. 57 showing a side surface of the wafer W are suitably referred to.

The purpose of the process in the seventh embodiment is described. When a developer comes into contact with are resist, the resist is dissolved to form a pattern. In accordance with the dissolution, a product (hereinafter described as "dissolved product") is generated on a surface of the pattern. When the dissolved product remains on the pattern surface, it is difficult for the reaction between the developer and the pattern surface to proceed, whereby a process time required for a pattern of a desired line width is elongated. Thus, in the seventh embodiment, the reaction between the developer and the pattern is promoted by removing the dissolved product is removed from the surface of the pattern, so as to reduce the process time.

Firstly, the first developer nozzle 31A is located on a position above the central portion of the wafer W, and the second developer nozzle 31B is located on a position eccentric from the central portion of the wafer W. Then, the wafer W is rotated, and a developer is supplied from the first developer nozzle 31A (time instance g0 in chart). After the supply of the developer from the first developer nozzle 31A is started, the rotation of the first developer nozzle 31A is started (time instance g1). Note that no developer is supplied from the second developer nozzle 31B. Further, the developer nozzles 31A and 31B are started to move along the radial direction of the wafer W. The respective developer nozzles 31A and 31B are moved in the same direction. The developer nozzle 31A is moved toward a position above the peripheral portion of the wafer W, while the developer nozzle 31B is moved toward a position above the central portion of the wafer W, respectively.

The moving speed of the first developer nozzle 31A is relatively high. For example, the moving speed of the first developer nozzle 31A is higher than that of the second developer nozzle 31B. Since the moving speed of the first developer nozzle 31A is relatively high, a liquid puddle 30 on the surface of the wafer W has a relatively small thickness. Namely, the first developer nozzle 31A forms a thin film on the wafer W. The thin film is indicated by 30A as a matter of convenience. The thin film 30A is spread out over the wafer W by the movement of the first developer nozzle 31A. At this time, below the first developer nozzle 31A, since the resist is in contact with the developer, the aforementioned dissolved product is generated (FIG. 57). Since the moving speed of the first developer nozzle 31A is relatively high, the developer pooled below the first developer nozzle 31A is subjected to a relatively large attracting force toward the moving direction of the first developer nozzle 31A, by the surface tension of the first developer nozzle 31A against the bottom surface 35. As a result, the developer flows, together with the dissolved product 102, toward a position below the first developer nozzle 31A that is moved to the peripheral portion side of the wafer W. Namely, the dissolved product 102 is removed from a downward area below a position at which the first developer nozzle 31A is located, and the liquid film of the developer is thinned in the downward area.

Then, when the second developer nozzle 31B is located on a position above the central portion of the wafer W, the developer is supplied from the second developer nozzle 31B, so that the liquid puddle 30 is formed below the second developer nozzle 31B (time instance g2). In addition, the second developer nozzle 31B is started to rotate (time instance g3). In FIG. 57, the liquid puddle 30 formed by the second developer nozzle 31B is shown as the shaded liquid puddle 30B, so as to be differentiated from the thin film 30A. The first developer nozzle 31A is continuously moved while supplying the developer, and the second developer nozzle 31B follows the route of the first developer nozzle 31A to move to the peripheral portion of the wafer W while supplying the developer. Namely, the developer is supplied by the second developer nozzle 31B to the surface of the wafer W where the dissolved product 102 has been removed, whereby the reaction between the developer and the resist proceeds quickly.

When the first developer nozzle 31A is located on a position above the peripheral portion of the wafer W, the supply of the developer from the first developer nozzle 31A and the rotation of the first developer nozzle 31A are stopped (time instance g4). Then, the first developer nozzle 13A is retracted to the outside of the wafer W. After that, when the second developer nozzle 31B is located on a position above the peripheral portion of the wafer W, the movement of the second developer nozzle 31B is stopped (time instance g5). When the whole surface of the wafer W is coated with the liquid puddle 30B, the supply of the developer from the second developer nozzle 31B is stopped (time instance g6). As described in the sixth embodiment, subsequently thereto, the rotation of the developer nozzle 31B and the rotation of the wafer W are continued for a predetermined period of time under the state in which the second developer nozzle 31B is located above the peripheral portion of the wafer W, and thereafter the developer is removed from the wafer W.

In the seventh embodiment, the second developer nozzle 31B is moved to follow the first developer nozzle 31A, so that the second developer nozzle 31B passes through an area above the wafer W through which the first developer nozzle 31A has passed. Thus, the dissolved product 102 is removed as described above. After that, the developer is supplied to the surface of the wafer W from which the dissolved product 102 has been removed, and the developer is stirred. Therefore, the reaction of the resist to the developer can be promoted, whereby the line width of the pattern can be promptly narrowed. That is to say, a throughput can be improved. Also in the seventh embodiment, it is not necessary to rotate the respective developer nozzles 31A and 31B, similarly to the other embodiments.

Figure 58:
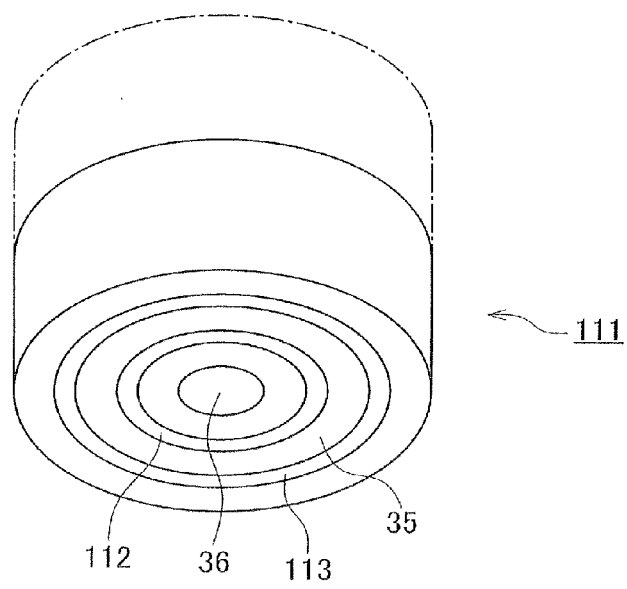
FIG. 58 is a perspective view of a bottom surface of another developer nozzle.

Next, still other structural examples of the developer nozzle are explained, focusing on differences from the developer nozzle 31. FIG. 58 is a perspective view showing a bottom surface side of a developer nozzle 111. A lower part side of the developer nozzle 111 is shown by the solid line, and an upper part side thereof is shown by the chain line. In addition to a discharge opening 36, a bottom surface 35 of the developer nozzle 111 has annular discharge openings 112 and 113. The discharge openings 112 and 113 are formed concentrically about the discharge opening 36, i.e., concentrically about the center of the bottom surface 35. A downstream side of a flow path, which is disposed on the upper part side of the developer nozzle 111, is branched, so that a developer is respectively supplied to these discharge openings 36, 112 and 113. The bottom surface of the developer nozzle 111 may be hydrophobic or hydrophilic. The bottom surfaces of the other developer nozzles may be hydrophilic or hydrophobic.

Figure 59:
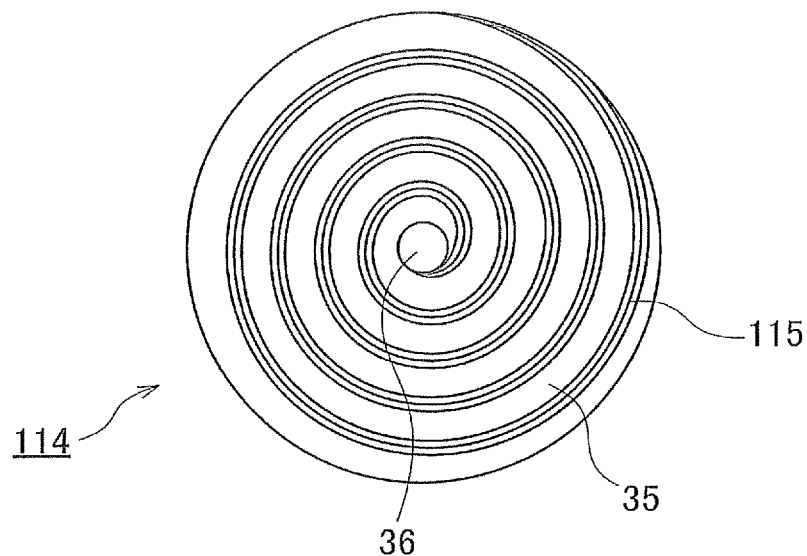
FIG. 59 is a bottom view of another developer nozzle.

FIG. 59 shows a bottom surface 35 of a developer nozzle 114. The lower surface 35 of the developer nozzle 114 is provided with a projection 115 having a triangular shape in sectional view, in order to improve a stirring operation of the developer. The projection 115 is formed in a swirl shape from the center of the lower surface 35 toward the peripheral portion thereof.

Figure 60:
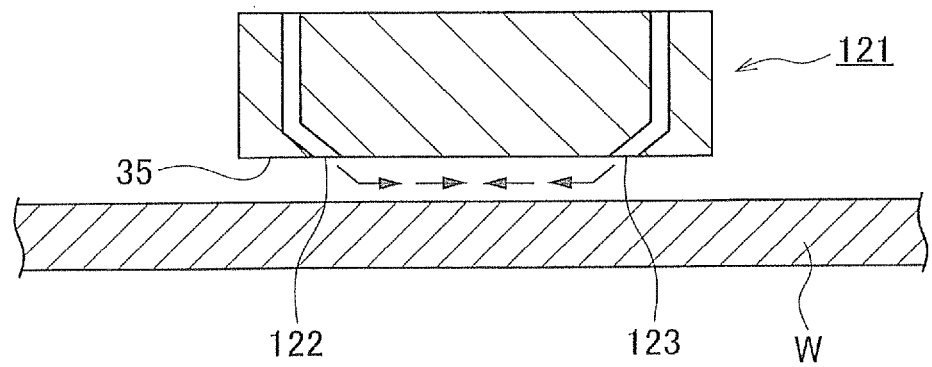
FIG. 60 is a longitudinal side view of another developer nozzle.

FIG. 60 shows a longitudinal side surface of a lower part side of a developer nozzle 121. Slit-like discharge openings 122 and 123 are opened in a lower surface of the developer nozzle 121, such that the discharge openings 122 and 123 are in parallel with each other symmetrically about a diameter of the bottom surface 35. A developer is supplied diagonally downward from the discharge openings 122 and 123 toward the diameter of the bottom surface 35. As shown by the arrows in FIG. 60, flows of the supplied developer run on the surface of the wafer W and collide with each other on the diameter of the bottom surface 35 or near thereto, and run to the outside of the bottom surface 35. Similarly to the developer nozzle 111, an upper part side of the developer nozzle 121 has a flow path shared by the respective discharge openings 122 and 123. A downstream side of the shared flow path are branched to be connected to the discharge openings 122 and 123, whereby the developer can be respectively supplied from the discharge openings 122 and 123.

Figure 61:
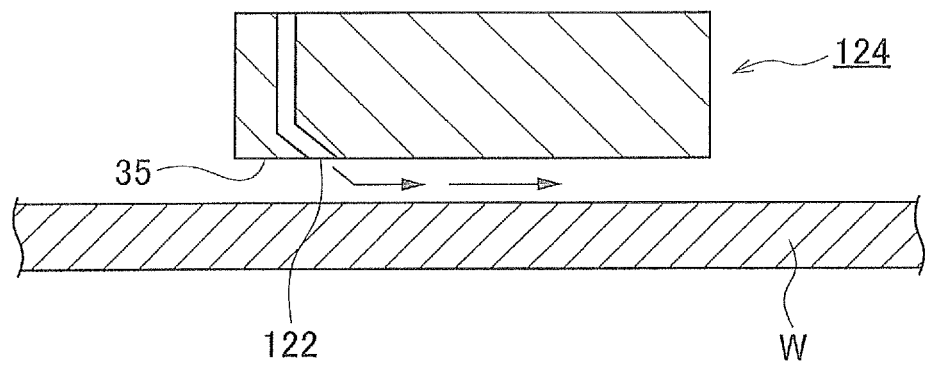
FIG. 61 a longitudinal side view of another developer nozzle.

FIG. 61 shows a longitudinal side surface of a lower part side of a developer nozzle 124. The developer nozzle 124 has the same structure as that of the developer nozzle 121 excluding that the discharge opening 123 is not provided. Since the discharge opening 123 is not provided, a developer supplied from the discharge opening 122 flows on the surface of the wafer W from one end side of a bottom surface 35 of the developer nozzle 124 to the other end side thereof, as shown by the arrows.

Figure 62:
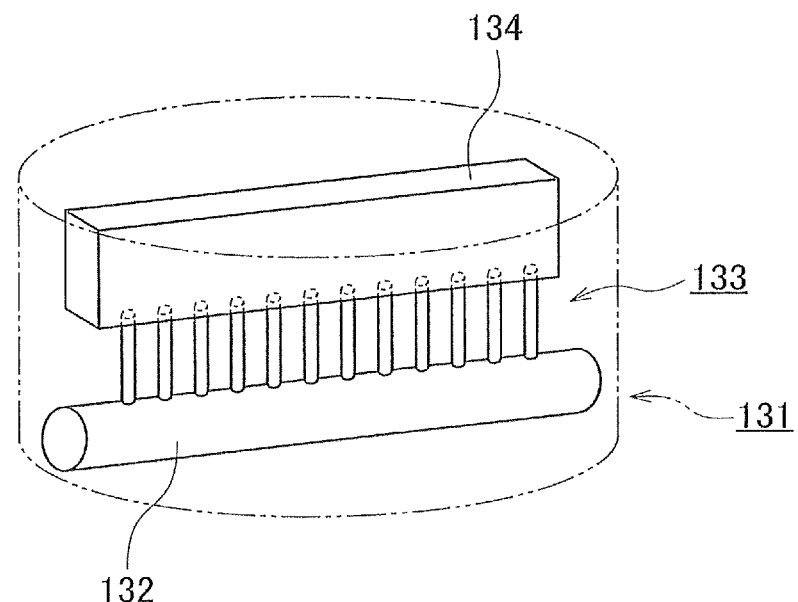
FIG. 62 is a perspective view of another developer nozzle.

FIG. 62 shows a perspective view of a developer nozzle 131. A slit-like discharge opening 132 is formed in a bottom surface 35 of the developer nozzle 131 along a diameter thereof. In FIG. 62, a flow path 133 through which a developer is supplied to the discharge opening 132 is shown by the solid line. The flow path 133 is provided with a diffusion space 134 for diffusing the developer so as to uniformly supply the developer from each point of the discharge opening 132 in a longitudinal direction thereof.

Figure 63:
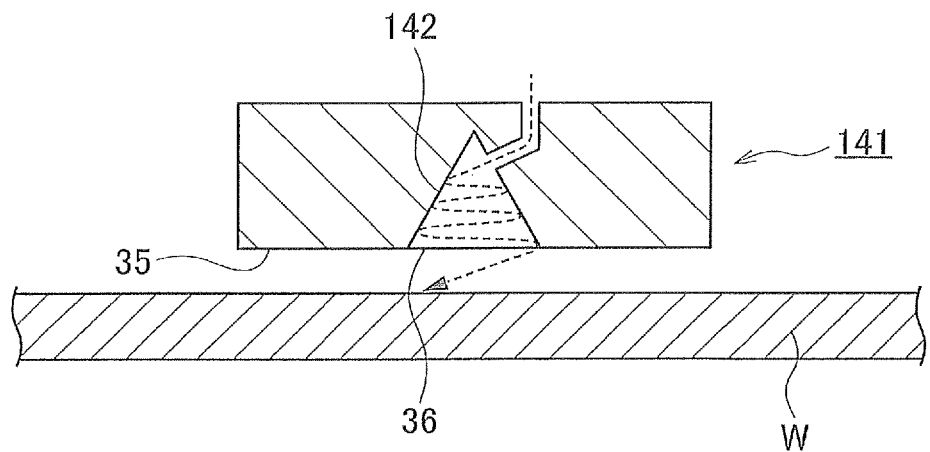
FIG. 63 is a longitudinal side view of another developer nozzle.

FIG. 63 is a longitudinal sectional view of a lower part side of a developer nozzle 141. A conical flow path 142 having a wider bottom is formed in the lower part side of the developer nozzle 141. A lower end of the flow path 142 is opened in a bottom surface 35 of the developer nozzle 14 to form a discharge opening 36. In FIG. 63, a flow of a developer is shown by the dotted arrow. As shown by the arrow, the developer is supplied to an upper part side of an inner circumferential surface diagonally from above. The developer circumferentially flows along the inner circumferential surface of the flow path 142 so as to be supplied downward. Thus, similarly to the developer nozzle 71 shown in FIG. 50, a turning flow can be formed in a liquid puddle 30 formed between the bottom surface 35 of the developer nozzle 141 and a wafer W.

Figure 64:
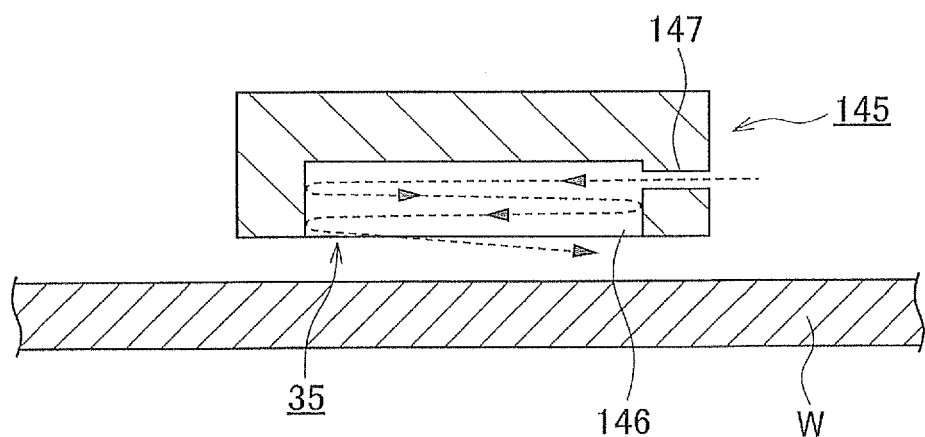
FIG. 64 is a longitudinal side view of another developer nozzle.

FIG. 64 is a longitudinal sectional view of a developer nozzle 145. Similarly to the developer nozzle 141, the developer nozzle 145 can form a turning flow in a liquid puddle 30 of a developer. The developer nozzle 145 differs from the developer nozzle 141 in that a flow path 146 having a circular shape in plan view is provided in place of the flow path 142, and that the developer is supplied from a horizontally formed flow path 147 to an upper part side of an inner circumferential surface of the flow path 146. The developer supplied to the flow path 146 circumferentially flows the inner circumferential surface of the flow path 146 to move downward, so as to form the aforementioned turning flow.

The developer nozzle 145 has the one flow path 147, but may have a plurality of the flow paths 147. The developer is simultaneously supplied from the respective flow paths 147 to the flow path 146, and the developer circumferentially flows through the flow path 146. Thus, the turning flow can be more reliably formed.

Figure 65:
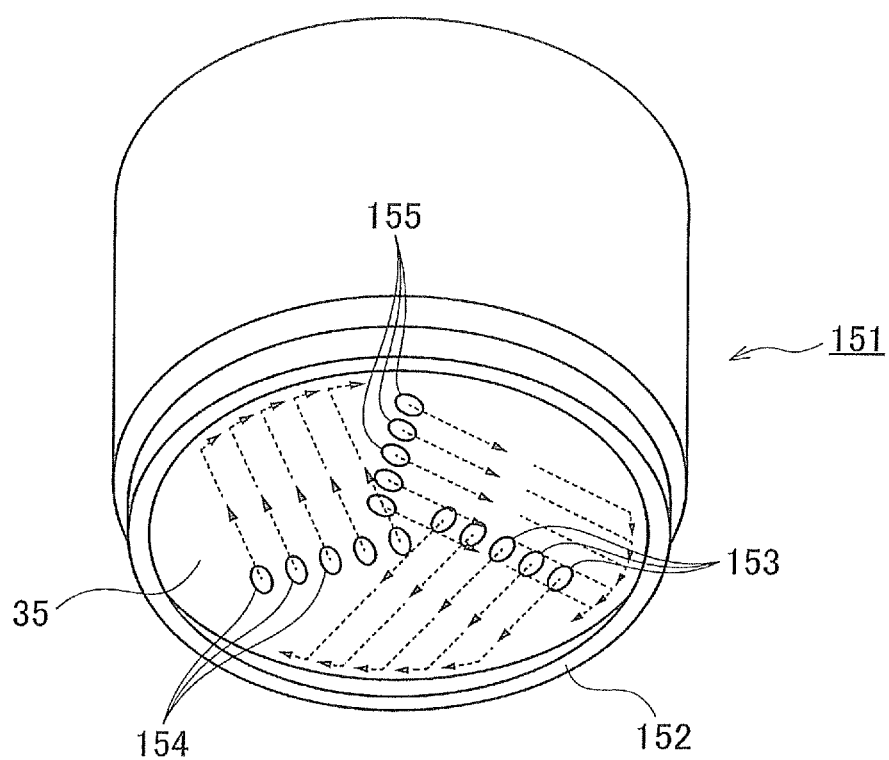
FIG. 65 is a perspective view of a bottom surface of another developer nozzle.

FIG. 65 is a perspective view of a bottom surface side of a developer nozzle 151. A bottom surface 35 of the developer nozzle 151 is provided with an annular projection 152. Discharge openings 153, discharge openings 154 and discharge openings 155 are opened inside the projection 152. The discharge openings 153 to 155 are configured to discharge a developer in directions that are different from each other in plan view. When seen from a lateral side, the discharge openings 153 to 155 discharge the developer diagonally downward. The discharged developer collides with the projection 152 to change its direction and flows in a circumferential direction of the projection 152. Thus, a turning flow can be formed in a liquid puddle 30 of the developer.

Figure 66:
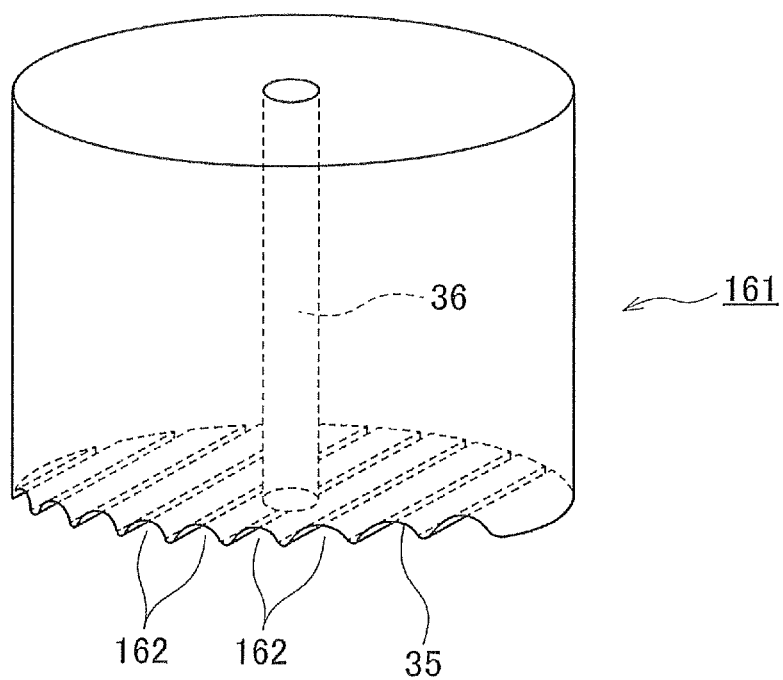
FIG. 66 is a perspective view of another developer nozzle.

FIG. 66 is a perspective view of a developer nozzle 161. A bottom surface 35 of the developer nozzle 161 is provided with a plurality of recesses 162 extending from one end of the bottom surface 35 to the other end thereof, in order to promote stirring of a developer. These recesses 162 are transversely arranged so as to be perpendicular to a direction in which the recesses 162 are extended. When seen from a lateral side, each recess 162 has a substantially semicircular shape.

(Evaluation Test)

Figure 67:
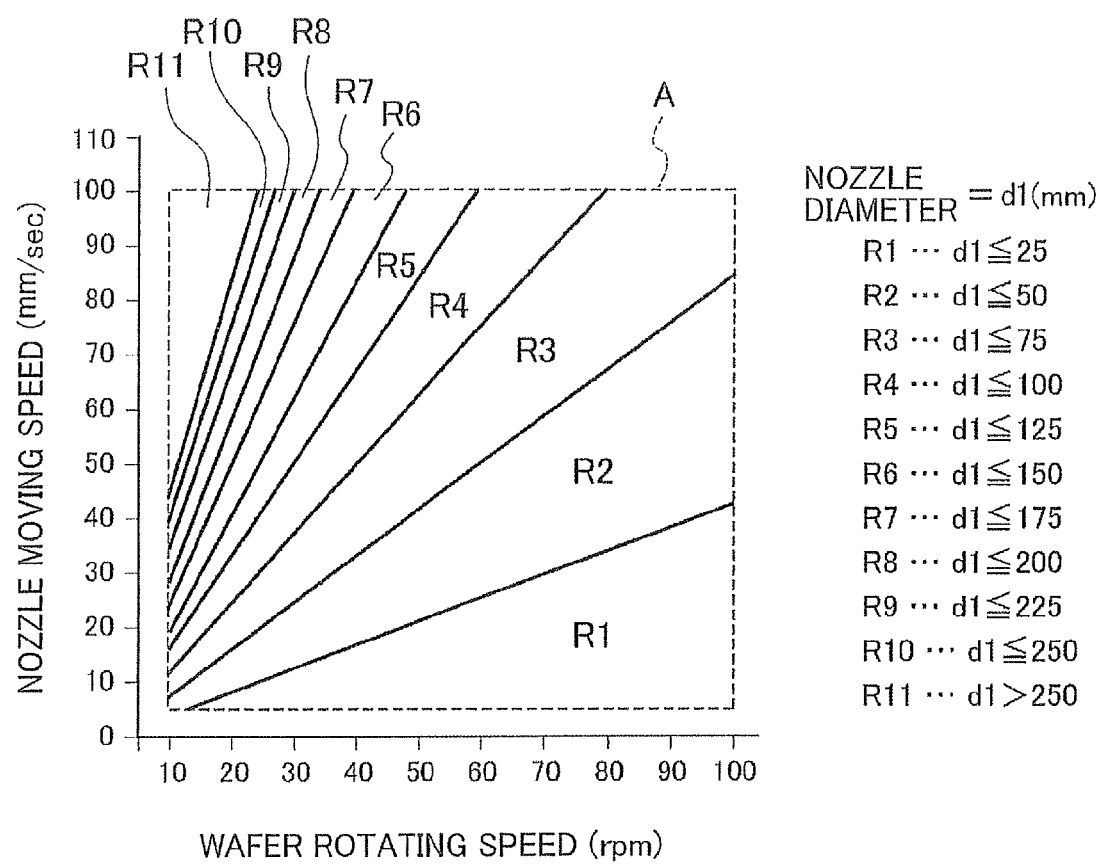
FIG. 67 is a graph showing a result of an evaluation test.

In order to form the liquid puddle 30 on the whole surface of the wafer W in accordance with the first embodiment, there was investigated a relationship among the moving speed of the developer nozzle 31, the rotating speed of the wafer W and the diameter d1 of the bottom surface 35 of the developer nozzle 31, which makes it possible that the liquid puddle 30 can be formed without any liquid division. The state without any liquid division means that the liquid film is not formed in such a manner that the liquid puddles 30 formed on a wafer W are spread out on the surface of the wafer W to merge with each other. In other words, the bottom surface 35 of the developer nozzle 31 passes through the whole surface of the wafer W. FIG. 67 shows a graph showing the result. The axis of abscissa of the graph shows the rotating speed (unit: rpm) of the wafer W, and the axis of ordinate thereof shows the moving speed (unit: mm/second) of the developer nozzle 3. An zone A in the graph surrounded by the axis of ordinate and the axis of abscissa is divided into zones R1 to R11.

As shown in the right side of the graph, the respective zones R1 to R11 correspond to ranges of the diameter d1 (unit: mm) of the bottom surface 35. When the diameter d1 of the bottom surface of the nozzle is a diameter corresponding to one zone R, the liquid puddle 30 can be formed without any liquid division, by setting the rotating speed of the wafer W and the moving speed of the developer nozzle which are shown correspondingly to the zone R in the graph.

Figure 68:
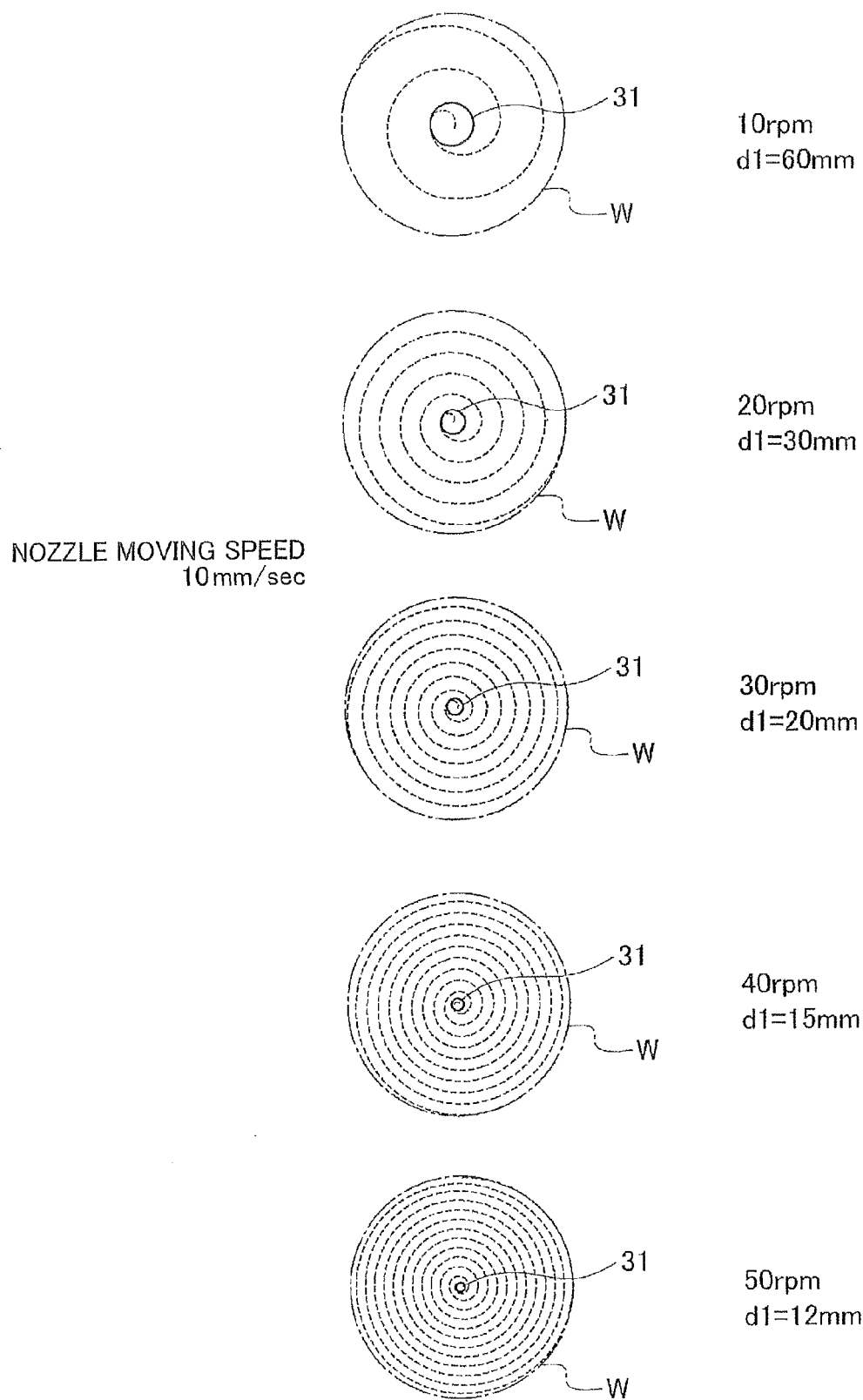
FIG. 68 is a schematic view showing a minimum nozzle diameter and a nozzle route.
Figure 69:
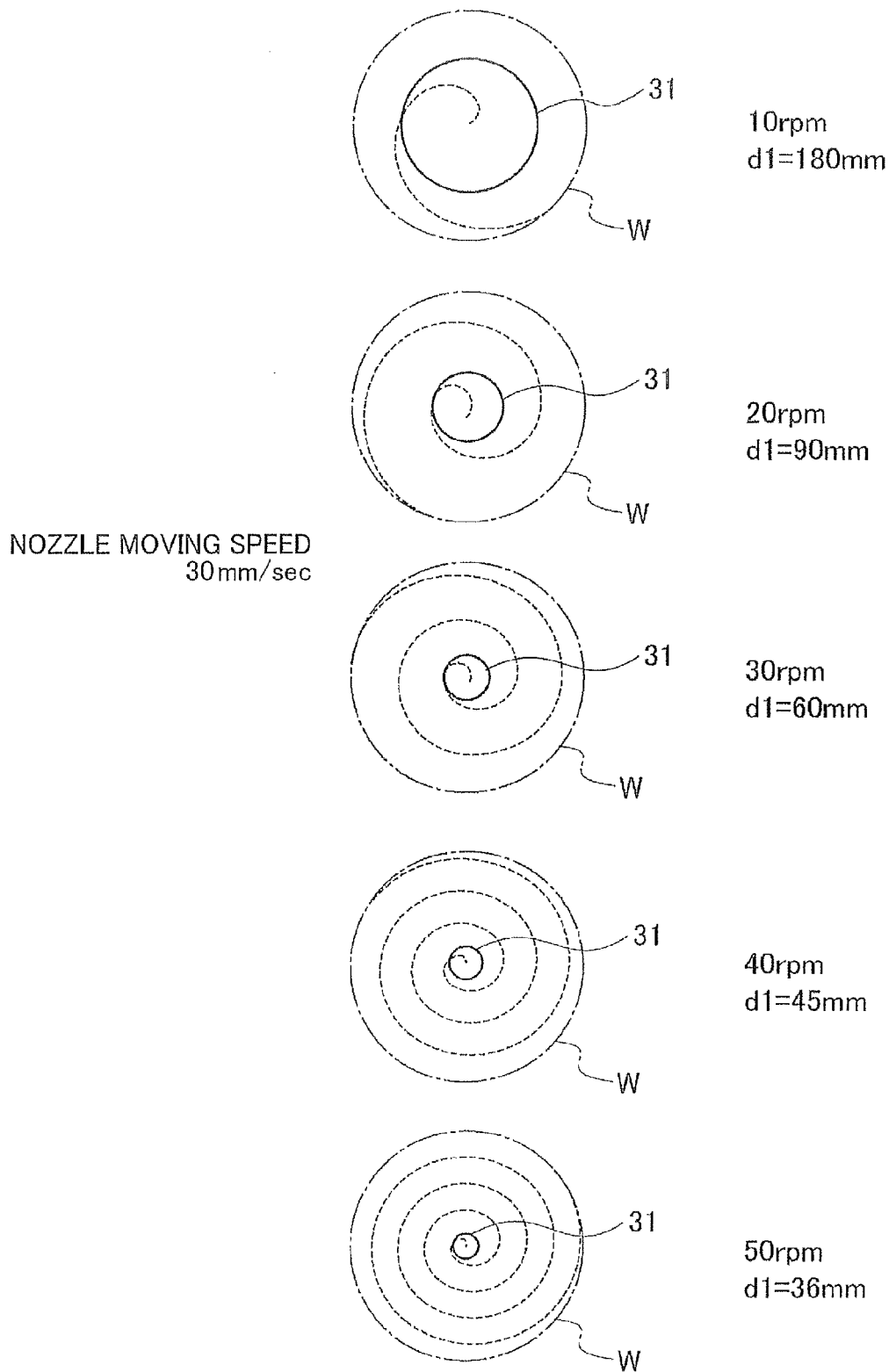
FIG. 69 is a schematic view showing a minimum nozzle diameter and a nozzle route.
Figure 70:
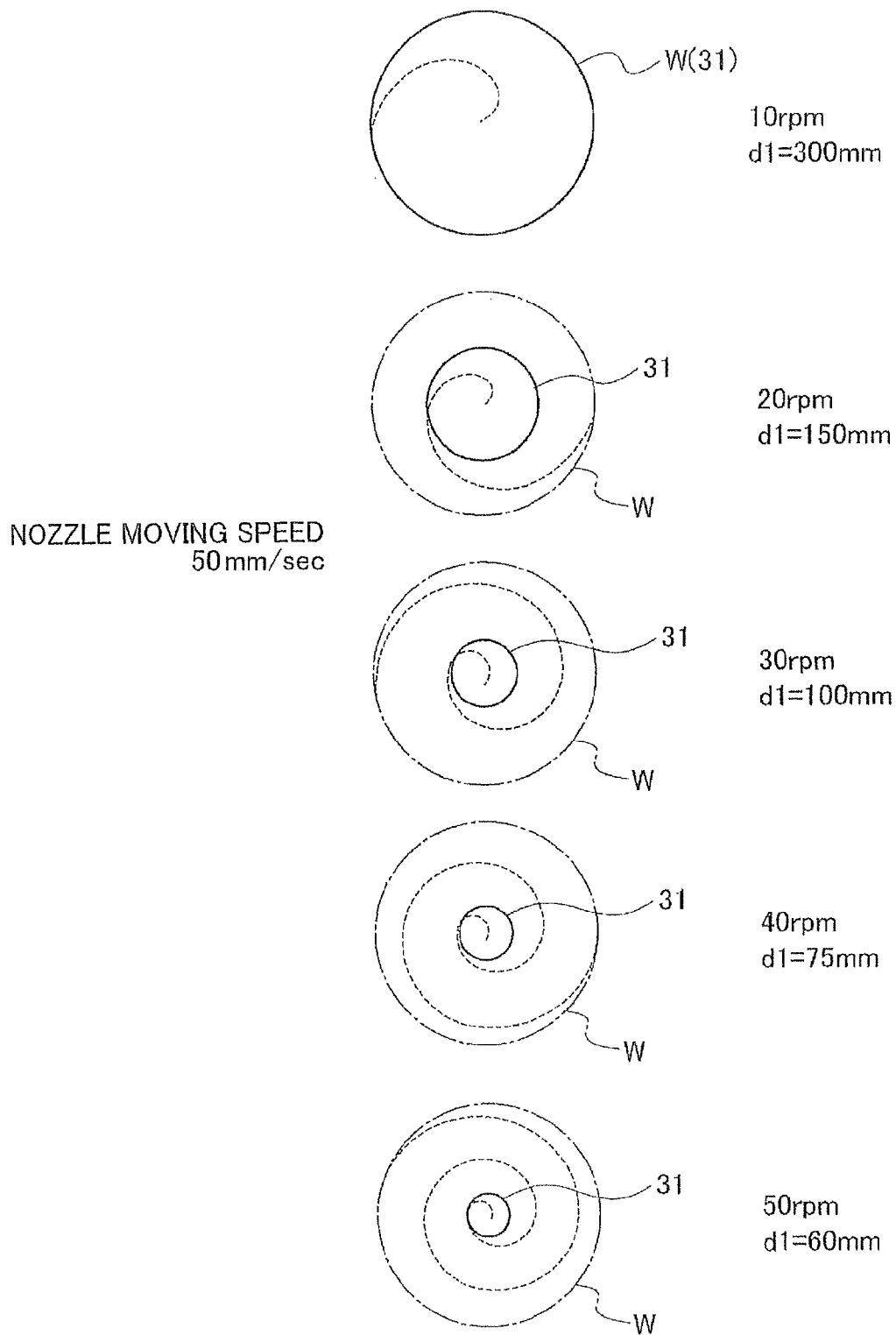
FIG. 70 is a schematic view showing a minimum nozzle diameter and a nozzle route.

When the moving speed of the nozzle and the rotating speed of the wafer W are set as the respective predetermined values, a minimum value (minimum nozzle diameter) of the diameter d1, which makes it possible that the liquid puddle 30 is formed without any liquid division, was calculated. In FIGS. 68, 69 and 70, the minimum nozzle diameters are shown by the solid line circles, when the moving speeds of the nozzle are set as 10 mm/second, 30 mm/second and 50 mm/second, respectively, and trajectories of the center of the bottom surface 35 of the developer nozzle 31 on the wafer W are shown by the dotted lines. In the respective drawings, the five wafers W are shown. The rotating speeds of the wafers W are set as 10 rpm, 20 rpm, 30 rpm, 40 rpm and 50 rpm, in this order from above to below. A diameter of the wafer W shown in FIGS. 68 to 70 is 300 mm.

The calculated minimum nozzle diameters are shown below. When the moving speed of the developer nozzle 31 is 10 mm/second and the rotating speed of the wafer W is 10 rpm, 20, rpm, 30 rpm, 40 rpm or 50 rpm, the minimum nozzle diameter is 60 mm, 30 mm 20 mm, 15 mm or 12 mm. When the moving speed of the developer nozzle 31 is 30 mm/second and the rotating speed of the wafer W is 10 rpm, 20 rpm, 30 rpm, 40 rpm or 50 rpm, the minimum nozzle diameter is 180 mm, 90 mm, 60 mm, 45 mm or 36 mm. When the moving speed of the developer nozzle 31 is 50 mm/second and the rotating speed of the wafer W is 10 rpm, 20 rpm, 30 rpm, 40 rpm or 50 rpm, the minimum nozzle diameter is 300 mm, 150 mm, 100 mm, 75 mm or 60 mm.

Although not shown, minimum nozzle diameters when the moving speed of the nozzle is 20 mm/second or 40 mm/second were also calculated. When the moving speed of the nozzle is 20 mm/second and the rotating speed of the wafer W is 10 rpm, 20 rpm, 30 rpm, 40 rpm or 50 rpm, the minimum nozzle diameter is 120 mm, 60 mm, 40 mm 30 mm or 20 mm. When the moving speed of the nozzle is 40 mm/second and the rotating speed of the wafer W is 10 rpm, 20 rpm, 30 rpm, 40 rpm or 50 rpm, the minimum nozzle diameter is 240 mm, 120 mm, 80 mm, 60 mm or 48 mm.

Returning to FIG. 67, as shown in the graph, by suitably setting the rotating speed of the wafer W, the moving speed of the developer nozzle 31, and the diameter of the bottom surface of the developer nozzle 31, the liquid puddle 30 can be formed without any liquid division. Note that, as described in the first embodiment, the rotating speed of the wafer W is preferably not more than 50 rpm, for example.

With the use of an evaluation apparatus, a test was conducted to see that the developer can be stirred by applying an action for rotating the liquid puddle. The evaluation apparatus includes a circular lower plate and a circular upper plate. The lower plate and the upper plate are opposed to each other, and the upper plate is configured to be rotated about a center axis thereof. A liquid was supplied to a space between the lower plate and the upper plate to form a liquid puddle. When the upper plate was rotated, whether the liquid flowed upside and downside of the liquid puddle was examined. In this apparatus, the space between the upper plate and the lower plate can be varied, so that a liquid thickness of the space can be adjusted. The tests were conducted plural times, while changing the liquid thickness and the rotating speed of the upper plate. A contact angle of an upper surface of the lower plate against the liquid was 77.3°, and a contact angle of a lower surface of the upper plate against the liquid was 91.3°.

Table 1 below shows the result of the evaluation test 2. The flowing condition of the liquid is shown by three degrees (o: Good Δ: Acceptable x: Unacceptable) for the upper surface and the lower surface. From Table 1, it can be understood that, when the liquid thickness is not more than 1.0 mm, the liquid flows are generated in the upper surface and the lower surface of the liquid puddle. Namely, the liquid is stirred. With the liquid thickness being not more than 1.0 mm, particularly when the rotating speed of the upper plate is set nor less than 60 rpm, the good liquid flows are generated in the upper surface and the lower surface of the liquid puddle. From the result of the evaluation test 2, by suitably setting a height of the wafer W and a height of the bottom surface of the developer nozzle 31, it can be estimated that a turning flow can be generated to stir the developer, as described above.

TABLE 1

| Liquid Thickness | | 15 rpm | 60 rpm | 240 to 300 rpm |
|---|---|---|---|---|
| 2.5 mm | Top Surface | ○ | ○ | ○ |
| | Bottom Surface | X | Δ | Δ |
| 1.75 mm | Top Surface | ○ | ○ | ○ |
| | Bottom Surface | X | Δ | ○ |
| 1.0 mm | Top Surface | ○ | ○ | ○ |
| | Bottom Surface | Δ | ○ | ○ |
| 0.75 mm | Top Surface | ○ | ○ | ○ |
| | Bottom Surface | Δ | ○ | ○ |

1 Developing apparatus
11 Spin chuck
30 Liquid puddle
31 Developer nozzle
35 Bottom surface
36 Discharge opening
38 Rotating mechanism
42 Moving mechanism

What is claimed is:

1. A developing method comprising:
    horizontally holding an exposed substrate by a substrate holder;
    forming a liquid puddle on a part of the substrate which is stationary, by supplying a developer from a developer nozzle which is positioned above the part of the substrate and rotating the developer nozzle;
    rotating the substrate;
    spreading the liquid puddle on a whole surface of the substrate, by moving the rotating developer nozzle such that a supply position of the developer on the rotating substrate is moved in a radial direction of the substrate;
    bringing, simultaneously with the spreading of the liquid puddle on the whole surface of the substrate, a contact part into contact with the liquid puddle, the contact part being configured to be moved together with the developer nozzle and having a surface opposed to the substrate which is smaller than the surface of the substrate.

2. The developing method according to claim 1, wherein the spreading of the liquid puddle on the whole surface of the substrate includes generating a turning flow in the liquid puddle, by applying, from above the substrate, an operation for rotating the liquid puddle about an axis perpendicular to the substrate, while supplying the developer to the liquid puddle.

3. The developing method according to claim 2, wherein the spreading of the liquid puddle on the whole surface of the substrate includes moving a generation position of the turning flow along the surface of the substrate.

4. The developing method according to claim 2, wherein the spreading of the liquid puddle on the whole surface of the substrate includes generating turning flows at different positions in the liquid puddle, by applying an operation for rotating the liquid puddle about axes perpendicular to the substrate.

5. The developing method according to claim 4, wherein:
the forming of the liquid puddle is forming the liquid puddle on an area including a central portion of the substrate; and
the spreading of the liquid puddle on the whole surface of the substrate includes: moving a discharge position of the developer from the central portion of the substrate to a peripheral portion thereof; and, while generating turning flows at different positions in the liquid puddle, moving the positions at which the turning flows are generated, from the central portion side of the substrate to the peripheral portion side thereof.

6. The developing method according to claim 2, wherein the position at which the operation for rotating the liquid puddle is applied is reciprocated between the central portion side of the substrate and the peripheral portion side thereof.

7. The developing method according to claim 2, wherein a turning direction of the turning flow is opposed to a rotating direction of the substrate.

8. The developing method according to claim 1, wherein:
the forming of the liquid puddle is forming the liquid puddle on an area including a central portion of the substrate; and
the spreading of the liquid puddle on the whole surface of the substrate includes spreading the liquid puddle to the peripheral portion of the peripheral portion of the substrate.

9. The developing method according to claim 1, further comprising locally supplying a dilution liquid to a central portion of the substrate for diluting the developer,
wherein the forming of the liquid puddle is performed succeedingly to the supplying of the dilution liquid.

10. The developing method according to claim 1, wherein:
the developer nozzle is composed of a first developer nozzle having the contact part and a second developer nozzle having the contact part;
the spreading of the liquid puddle on the whole surface of the substrate includes moving the first developer nozzle and the second developer nozzle above the substrate, such that the contact part of the second developer nozzle passes through an area through which the contact part of the first developer nozzle has passed.

11. The developing method according to claim 1, wherein the spreading of the liquid puddle on the whole surface of the substrate includes forming a spiral liquid flow of the developer in the developer nozzle and discharging the liquid flow.

12. The developing method according to claim 11, wherein
the spiral liquid flow of the developer is rotated in a circumferential direction of a discharge opening of the developer nozzle.

13. The developing method according to claim 1, wherein the spreading of the liquid puddle on the whole surface of the substrate includes restricting a liquid flow of the developer, which forms the liquid puddle, toward an outside of the substrate, by a restricting member disposed on the substrate.

14. A non-transitory storage medium storing a computer program for use in a developing apparatus for developing an exposed substrate, wherein
the computer program performs the developing method according to claim 1.

* * * * *